US012666628B2

(12) United States Patent
Takahashi et al.

(10) Patent No.: US 12,666,628 B2
(45) Date of Patent: Jun. 23, 2026

(54) NONVOLATILE SEMICONDUCTOR STORAGE DEVICE AND MANUFACTURING METHOD

(71) Applicant: Kioxia Corporation, Tokyo (JP)

(72) Inventors: Kensuke Takahashi, Yokkaichi Mie (JP); Daisaburo Takashima, Yokohama Kanagawa (JP); Naoki Kai, Kuwana Mie (JP); Yasumi Ishimoto, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 619 days.

(21) Appl. No.: 18/179,895

(22) Filed: Mar. 7, 2023

(65) Prior Publication Data

US 2024/0099027 A1     Mar. 21, 2024

(30) Foreign Application Priority Data

Sep. 20, 2022   (JP) ................................. 2022-149589

(51) Int. Cl.
  H10B 63/00      (2023.01)
  H10B 63/10      (2023.01)
(52) U.S. Cl.
  CPC ........... H10B 63/845 (2023.02); H10B 63/10 (2023.02); H10B 63/34 (2023.02)
(58) Field of Classification Search
  CPC ...... H10B 63/845; H10B 63/10; H10B 63/34; H10B 63/30; H10N 70/231; H10N 70/823; H10N 70/8828
  See application file for complete search history.

(56) References Cited

U.S. PATENT DOCUMENTS

2007/0217254 A1*  9/2007  Matsuoka .......... G11C 13/0069
                                                  257/E27.071
2008/0149913 A1*  6/2008  Tanaka ................... H10B 63/34
                                                  438/238

(Continued)

FOREIGN PATENT DOCUMENTS

JP        2008160004 A      7/2008
WO      2012077174 A1      6/2012

OTHER PUBLICATIONS

M. Kinoshita et al., "Scalable 3-D vertical chain-cell-type phase-change memory with 4F2 poly-Si diodes" 2012 Symposium on VLSI Technology Digest of Technical Papers, Jul. 19, 2012, pp. 35-36.

*Primary Examiner* — S M Sohel Imtiaz
(74) *Attorney, Agent, or Firm* — Kim & Stewart LLP

(57)        ABSTRACT

According to one embodiment, a cell block includes memory cells and select transistors. The memory cells correspond are connected in parallel between a local source line and a local bit line. The select transistor is connected between the local bit line and a bit line. The memory cell includes a cell transistor and a resistance change element. A gate of the cell transistor is connected to a word line. The resistance change element is connected to the cell transistor in series between the local source line and the local bit line. Each cell block is configured as a columnar structure penetrating a plurality of conductive films functioning as word lines. The select transistor and the local bit line are connected at a contact portion formed of a material different from a material of the local bit line.

14 Claims, 57 Drawing Sheets

(56) References Cited

U.S. PATENT DOCUMENTS

| | | | |
|---|---|---|---|
| 2013/0228739 A1 * | 9/2013 | Sasago | H10B 63/20 |
| | | | 257/4 |
| 2014/0286081 A1 * | 9/2014 | Takahashi | G11C 11/1693 |
| | | | 365/158 |
| 2014/0347919 A1 * | 11/2014 | Aoki | G11C 11/1673 |
| | | | 365/158 |
| 2015/0109851 A1 * | 4/2015 | Higo | G11C 13/003 |
| | | | 365/148 |
| 2015/0187393 A1 * | 7/2015 | Ueda | G11C 13/0004 |
| | | | 365/72 |
| 2016/0379697 A1 * | 12/2016 | Sakai | G11C 11/1675 |
| | | | 365/66 |
| 2017/0053697 A1 * | 2/2017 | Katou | G11C 13/004 |
| 2017/0077180 A1 * | 3/2017 | Ito | H10B 63/34 |
| 2018/0337330 A1 * | 11/2018 | Liu | H10B 63/20 |
| 2020/0303006 A1 * | 9/2020 | Suzuki | H10N 70/882 |
| 2022/0383919 A1 * | 12/2022 | Yano | G11C 16/10 |
| 2022/0399400 A1 | 12/2022 | Takashima | |
| 2023/0128347 A1 * | 4/2023 | Yoo | G11C 16/10 |
| | | | 365/185.33 |

* cited by examiner

NONVOLATILE SEMICONDUCTOR STORAGE DEVICE AND MANUFACTURING METHOD

CROSS-REFERENCE TO RELATED APPLICATION(S)

This application is based upon and claims the benefit of priority from Japanese Patent Application No. 2022-149589, filed Sep. 20, 2022, the entire contents of which are incorporated herein by reference.

FIELD

Embodiments described herein relate generally to a nonvolatile semiconductor storage device and a method of manufacturing a nonvolatile semiconductor storage device.

BACKGROUND

In nonvolatile semiconductor storage devices having memory cells that include resistance change elements, high-resistant and low resistance states of the resistance change elements can be switched by allowing currents to flow through the resistance change elements. When nonvolatile semiconductor storage devices are highly integrated, the number of stacked transistors for switching resistant change elements increases. Therefore, it is preferable to provide a configuration in which channel resistances of transistors do not increase. It is also preferable to allow currents to flow through resistance change elements appropriately.

BRIEF DESCRIPTION OF THE DRAWINGS

FIG. 3 is a perspective view of a cell array according to a first embodiment.

FIG. 23 is a cross-sectional view illustrating the manufacturing method of the cell array according to the first embodiment.

FIG. 38 is a cross-sectional view illustrating an A-A cross section region and a B-B cross section region in the manufacturing method of the cell array according to the first embodiment.

FIG. 40 is a cross-sectional view illustrating the A-A cross section region and the B-B cross section region in the manufacturing method of the cell array according to the first embodiment.

FIG. 42 is a cross-sectional view illustrating the A-A cross section region and the B-B cross section region in the manufacturing method of the cell array according to the first embodiment.

FIG. 47 is a plan view illustrating the manufacturing method of the cell array according to the first embodiment.

FIG. 48 is a cross-sectional view illustrating the A-A cross section region and the B-B cross section region in the manufacturing method of the cell array according to the first embodiment.

FIG. 50 is a cross-sectional view illustrating the A-A cross section region and the B-B cross section region in the manufacturing method of the cell array according to the first embodiment.

FIG. 52 is a cross-sectional view illustrating the A-A cross section region and the B-B cross section region in the manufacturing method of the cell array according to the first embodiment.

FIG. 54 is a cross-sectional view illustrating the A-A cross section region and the B-B cross section region in the manufacturing method of the cell array according to the first embodiment.

FIG. 55 is a plan view illustrating the manufacturing method of the cell array according to the first embodiment.

FIG. 56 is a cross-sectional view illustrating the A-A cross section region and the B-B cross section region in the manufacturing method of the cell array according to the first embodiment.

Figure 57:
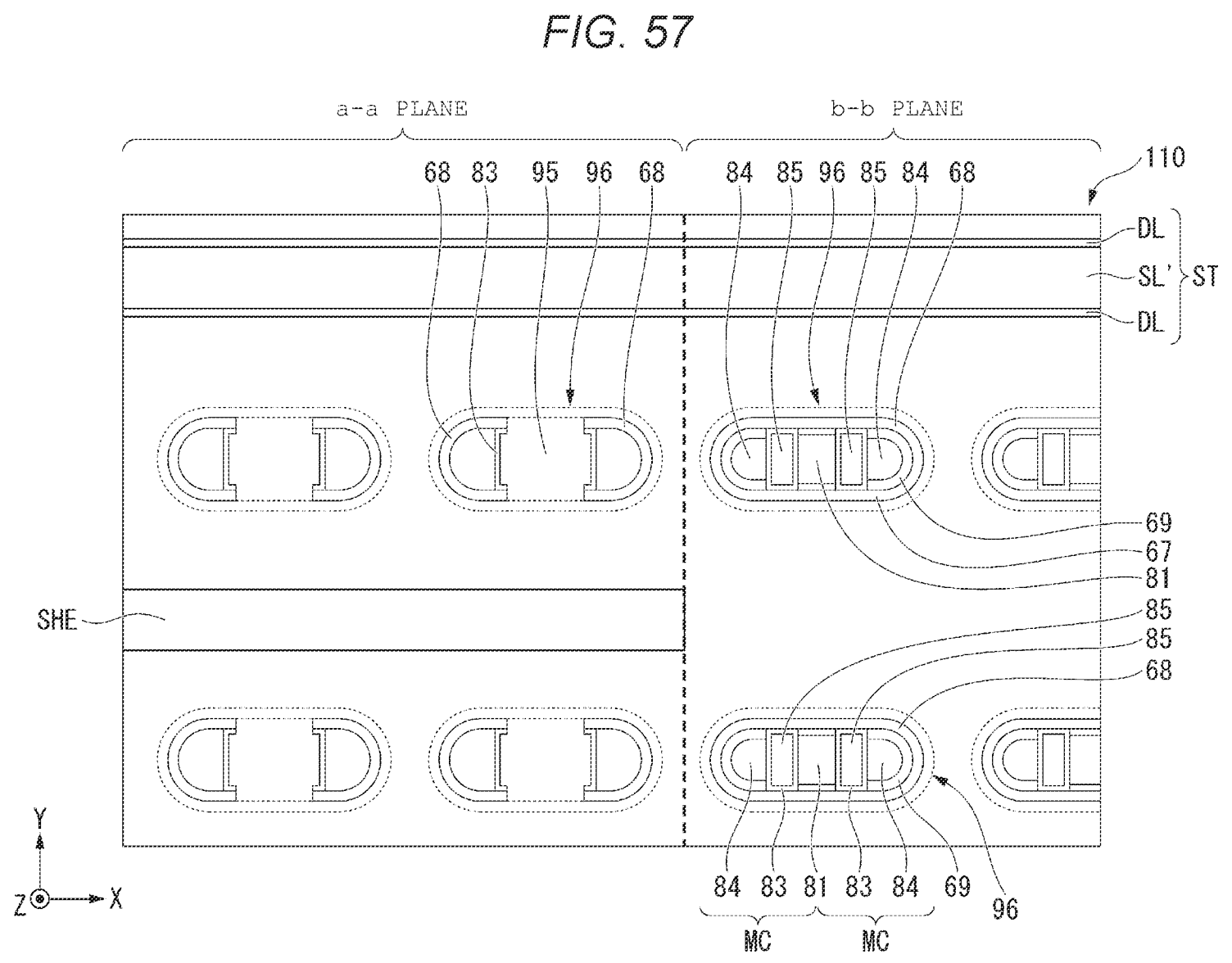

FIG. 57 is a plan view illustrating the manufacturing method of the cell array according to the first embodiment.

DETAILED DESCRIPTION

Figure 1:
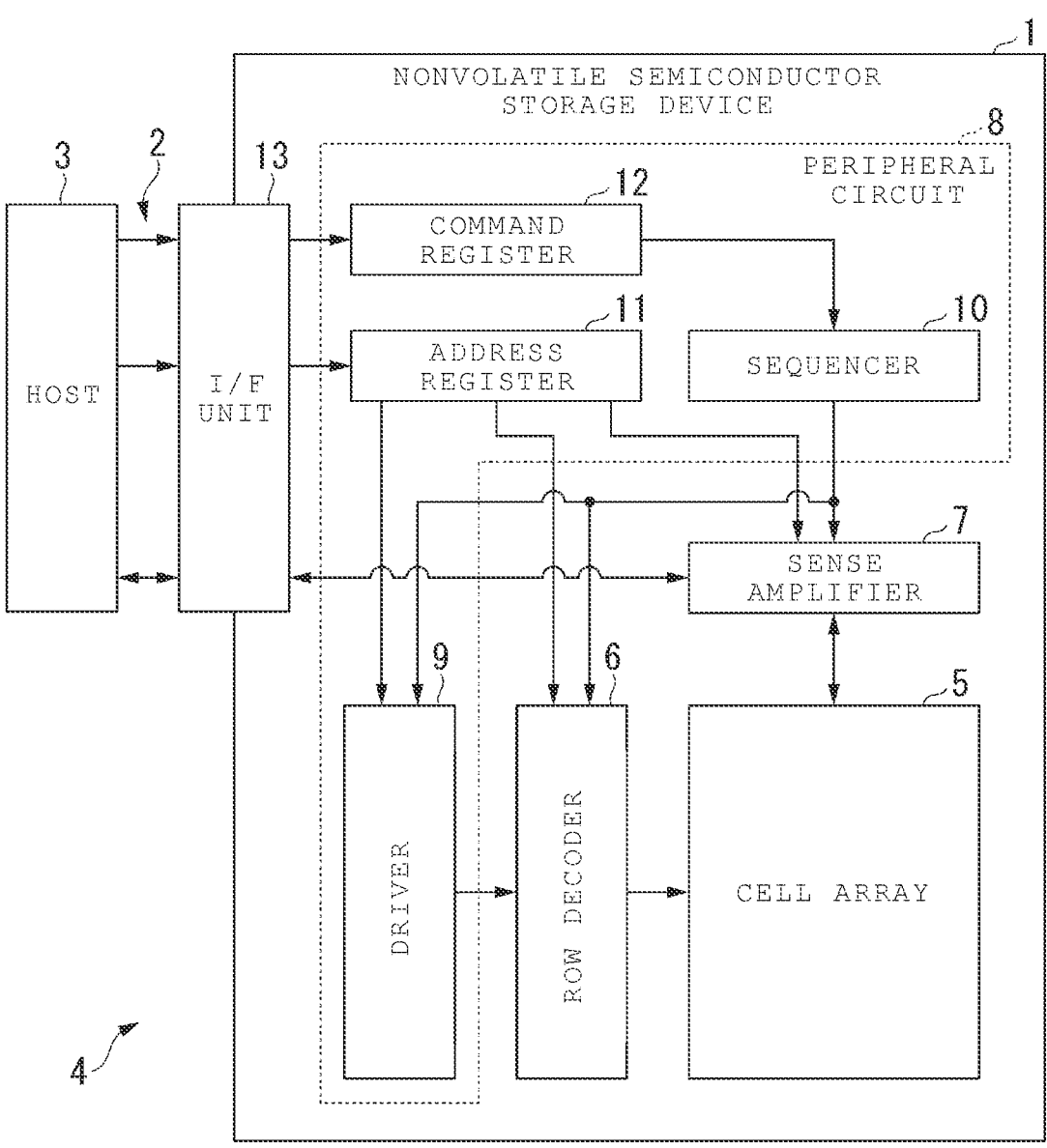
FIG. 1 is a diagram illustrating a schematic configuration of a nonvolatile semiconductor storage device according to a first embodiment.

Embodiments relate to a nonvolatile semiconductor storage device capable of allowing currents to flow through resistance change elements appropriately without increasing channel resistances of transistors despite high integration. A method of manufacturing such a nonvolatile semiconductor storage device is also described.

In general, according to one embodiment, a nonvolatile semiconductor storage device includes a plurality of bit lines, each extending in a first direction and spaced from each other in a second direction intersecting the first direction. A stacked body in the device includes a plurality of word line layers stacked one on the other in a third direction intersecting the first and second directions. A plurality of cell blocks are arrayed in the first and second directions within the stacked body as columnar structures extending in the third direction. Each cell block is in a columnar structure with another cell block adjacent in the second direction and having one end connected to a bit line. The adjacent cell block in the columnar structure has one end connected to another bit line. Each cell block includes a plurality of memory cells connected in parallel between a local source line and a local bit line in the columnar structure, and a select transistor connected between the local bit line and the respective bit line of the cell block. Each memory cell includes a cell transistor with a gate connected to a respective word line layer within the stacked body, and a resistance change element that is connected in series with the cell transistor between the local source line and the local bit line. The select transistor and the local bit line are connected to one another via a conductive contact formed of a material different than the local bit line.

Hereinafter, a nonvolatile semiconductor storage device according to certain example embodiments will be described with reference to the drawings. The present disclosure is not limited to these example embodiments.

First Embodiment

A nonvolatile semiconductor storage device according to a first embodiment will be described. The nonvolatile semiconductor storage device is, for example, a nonvolatile semiconductor memory in which the plurality of memory cells are disposed in a 3-dimensional array.

Semiconductor memories are used for almost every device type such as a personal computer, a home appliance, and a portable terminal as well as a main storage of a large computer. As types of the semiconductor memories, a volatile dynamic random access memory (DRAM), a static RAM (SRAM), a nonvolatile mask-read only memory (MROM), and a flash electrically erasable programmable ROM (EEPROM) such as a NAND flash memory or a NOR flash memory are available. DRAMs are excellent in terms of low cost (a cell area is less than ¼ of the SRAM) and high speed (faster than the flash EEPROM) regardless of volatile memories, and thus have large market shares in personal computer markets and portable terminal markets.

However, markets in the nonvolatile flash EEPROMs capable storing information after turning off power and permitting rewriting are increasing in portable terminals, various memory cards, solid-state drives (SSDs), and the like. In 3-dimensional flash memories, after control gates (word lines) are stacked, memory holes MH are formed then filled with film materials to form memory cells. Therefore, a reduction in cost can be achieved, which becomes the mainstream of the present market. However, the number of rewrites (W/E number of times) is just $10^4$ to $10^3$ and a write time of about microseconds or milliseconds is necessary. Further, a high voltage of 12 V to 22 V is necessary, and thus there is room for improvement in terms of miniaturization and performance.

In contrast, a ferroelectric memory (ferroelectric RAM (FeRAM)), a magnetoresistive memory (magnetoresistive RAM (MRAM)), a phase change memory (PCM), a resistance change memory (resistive RAM (ReRAM)), and the like are being developed as new memories. Of these, the MRAM, the PCM, and the ReRAM are resistance change memories that change resistances of information storage elements of the memory cells and store resistance states as information. In the PCM and the ReRAM, multi-values are possible in that a resistance values can varied in multiple increments for storing multi-bit data (for example, from two digits to five digits) and high integration is suitable in that a write current and a read current can be decreased by reducing the size of a storage element. Substitution of the NOR flash or NAND flash memories is possible. A resistance change rate of the MRAM is less than that of the PCM and the ReRAM (for example, about 200%). If a diamagnetic field problem is solved, substitution of the NOR flash or NAND flash memories is possible.

That is, for 3-dimensional flash memories, cost of fabrication is relatively low. However, there is a possibility of write or read performance or a fatigue frequency deteriorating. In a resistance change memory with high performance, such as the PCM, manufacturing cost becomes high since word lines and bit lines must be alternately formed with one another.

To solve this problem, the following configurations can be adopted in the nonvolatile semiconductor storage device.

Specifically, a nonvolatile semiconductor storage device 1 according to the present embodiment may have a configuration illustrated in FIG. 1. FIG. 1 is a diagram illustrating a schematic configuration of the nonvolatile semiconductor storage device 1. The nonvolatile semiconductor storage device 1 can be connected to a host 3 via a communication medium 2. The nonvolatile semiconductor storage device 1 is, for example, a resistance change memory. The communication medium 2 is, for example, a synchronous parallel communication line. The host 3 is, for example, a controller or a CPU. A configuration including the nonvolatile semiconductor storage device 1, the communication medium 2, and the host 3 may be referred to as a memory system 4. The memory system 4 may be a memory card such as an SD card, may be a storage system such as an SSD, or may be an eMMC device. The host 3 may be a controller or a CPU.

The nonvolatile semiconductor storage device 1 includes a cell array 5, a row decoder 6, a sense amplifier 7, a peripheral circuit 8, and an interface unit (I/F unit) 13. The peripheral circuit 8 includes a driver 9, a sequencer 10, an address register 11, and a command register 12. In the cell array 5, a plurality of memory cells are disposed. The plurality of memory cells can be accessed using the plurality of word lines and a plurality of bit lines. Each of the plurality of word lines is correlated with a row address. Each of the plurality of bit lines is correlated with a column address. The command register 12 stores a command provided in a host request received from the host 3 via the I/F unit 13. The address register 11 stores an address provided in the host request received from the host 3 via the I/F unit 13.

The sequencer 10 executes the command stored in the command register 12 to control a data operation (e.g., a write operation or a read operation) on the cell array 5. Under the control of the sequencer 10, the row decoder 6 can decode the address stored in the address register 11 to select a word line corresponding to a decoded row address. Under the control of the sequencer 10, the driver 9 generates a voltage to be applied for selecting a word line and supplies the voltage to the row decoder 6. Under the control of the sequencer 10, the sense amplifier 7 can decode the address stored in the address register 11 to select a bit line corresponding to a decoded column address.

When the plurality of memory cells are disposed 3-dimensionally in the cell array 5, a chain connection type memory may be taken as an example as a configuration which is applicable to the resistance-varied memory such as the PCM. In the chain connection type memory, the plurality of memory cells are connected in series (in a chain) as a string (string unit). Each memory cell includes a resistance change element and a cell transistor which are connected in parallel. By turning off the cell transistor of a selected memory cell and turning on the cell transistor of a non-selected memory cell, it is possible to selectively apply a voltage to a resistance change element of the selected memory cell. This structure may be implemented as a structure similar to that of a 3-dimensional flash memory.

For example, a gate oxide film, a semiconductor film, a resistance change film, and a core insulating film may be deposited sequentially on an inner surface of a memory hole. In manufacturing, the semiconductor film is deposited as a polycrystalline semiconductor column or the like. In an operation, a cell current flows through a cylindrical semiconductor film in an axial direction. That is, in the chain connection type memory, channel regions of a plurality of cell transistors in the string are connected in series, and a current path passing through the semiconductor film is lengthened in an operation for access to the resistance change element (a resistance change film). Therefore, due to an influence of a grain boundary or the like in the semiconductor film, a cell current amount is more likely to be insufficient with respect to a current amount required for read or write of the resistance change element.

Figure 2:
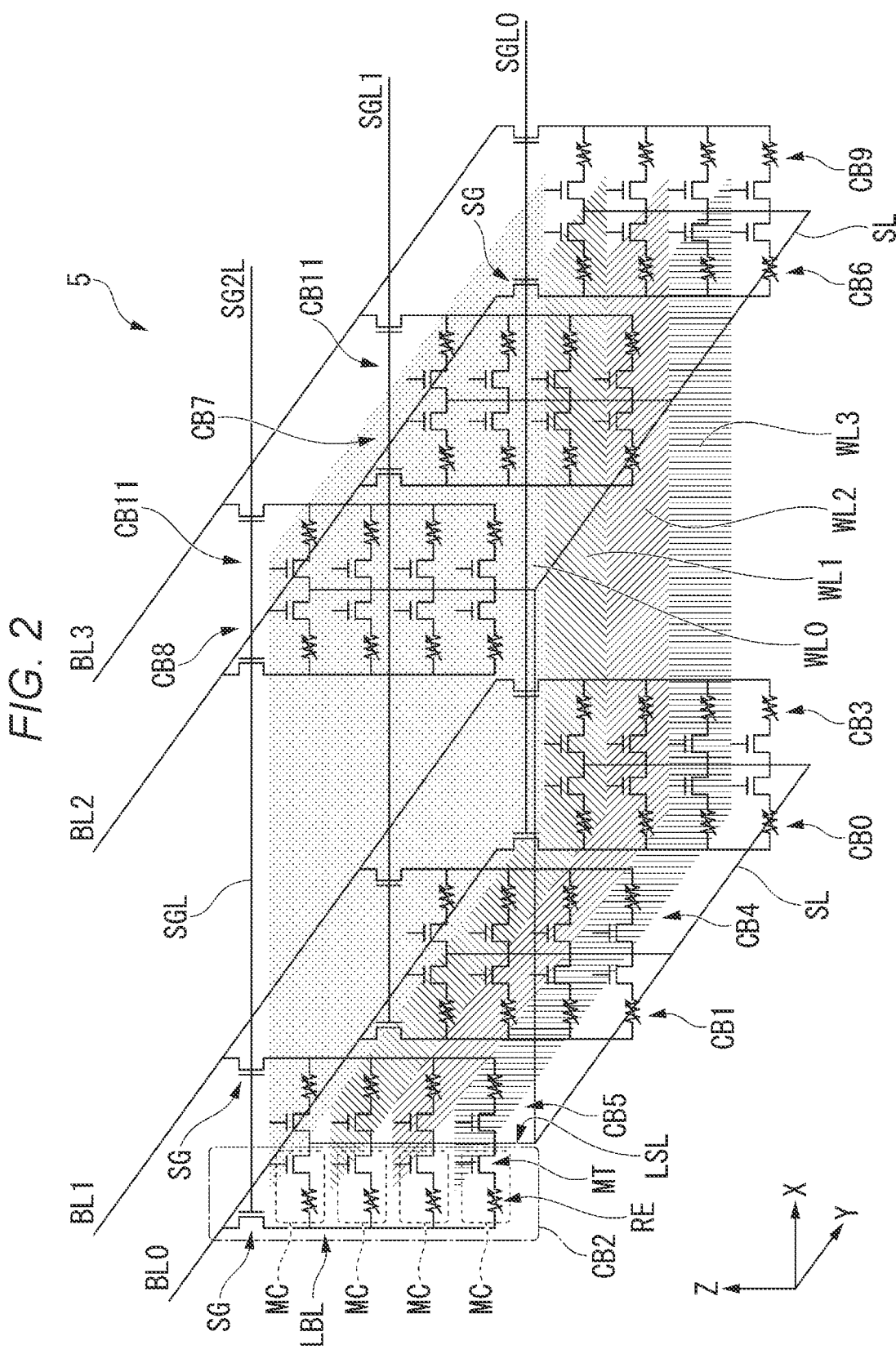
FIG. 2 is a circuit diagram illustrating a configuration of a cell array according to a first embodiment.

Accordingly, as this countermeasure, a ladder connection type memory can be adopted instead of the chain connection type memory. In the ladder connection type memory, a plurality of cell blocks CB (cell blocks CB0 to CB11 as illustrated in FIG. 2) are disposed 2-dimensionally to configure the cell array 5. FIG. 2 is a circuit diagram illustrating a configuration of the cell array 5. Each cell block CB has a plurality of memory cells MC that are connected in parallel in a ladder form between a local bit line LBL and a local source line LSL. Each memory cell MC has a resistance change element RE and a cell transistor MT connected in series. The local bit line LBL is connected to a bit line BL via a select transistor SG. The local source line LSL is connected to a source line SL.

In an operation for access to a resistance change element RE (resistance change film), a select transistor SG of the selected cell block CB is turned on and a select transistor SG of the non-selected cell block CB is turned off. In the selected cell block CB, a cell transistor MT of the selected memory cell MC is turned on and a cell transistor MT of the non-selected memory cell MC is turned off. When a voltage is applied to the bit line BL and the source line SL, a cell current may flow along a path of the bit line BL→the local bit line LBL→a resistance change element RE of the selected memory cell MC→the cell transistor MT of the selected memory cell MC→the local source line LSL→the source line SL.

That is, in the ladder connection type memory, corresponding to parallel connection of the channel regions of the plurality of cell transistors MT in the cell block CB, the current path passing through the semiconductor film in the operation for access to the resistance change element RE can be shortened. Therefore, even if a current is lowered due to an influence of a grain boundary or the like in the semiconductor film, a cell current amount can be provided to the degree that a write operation (a Set or Reset operation) of the resistance change element RE and a read operation (Set or Reset state detection) of the resistance change element RE can be performed.

Figure 3:
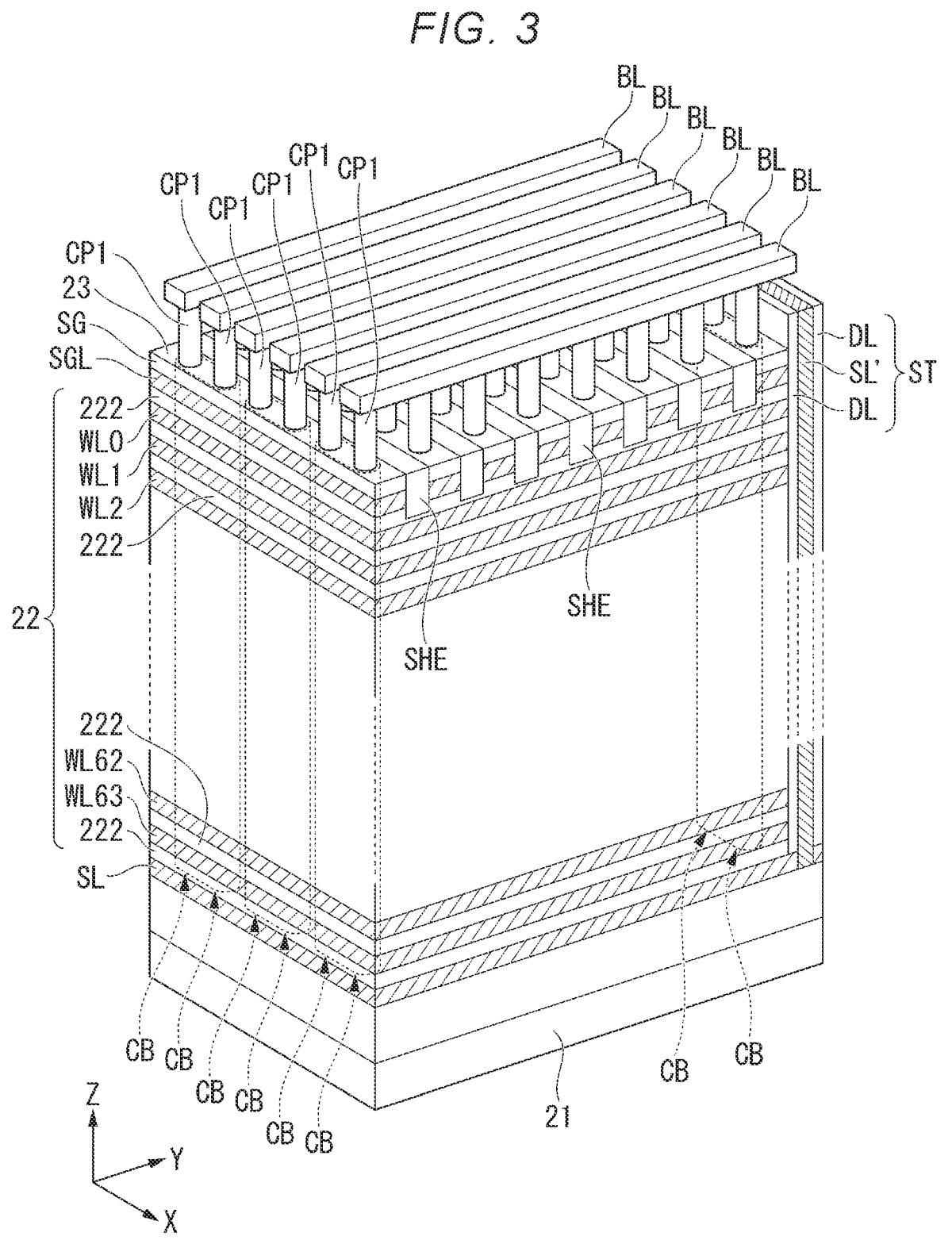

A circuit illustrated in FIG. 2 may be implemented by a configuration illustrated in FIG. 3. FIG. 3 is a perspective view illustrating a partial configuration of the cell array 5. In FIG. 3, a direction in which the bit line BL extends is a Y direction, a direction in which the memory cell MC is stacked is a Z direction, and a direction perpendicular to the Y and Z directions is an X direction. As illustrated in FIG. 3, the cell array 5 includes the source line SL formed from a plate-shaped conductive film extending in the XY directions on the +Z side of a substrate 21. An insulating film 222 formed from an insulating film extending in the XY directions is on the +Z side of the source line SL. On the +Z side of the insulating film 222, columnar cell blocks CB are arrayed 2-dimensionally in the XY directions and a stacked body 22 is penetrated by the columnar cell blocks CB in the Z direction to form an array of the 3-dimensional memory cells MC.

On the +Z side of the substrate 21, a plurality of stacked bodies including the stacked body 22 may be disposed. The plurality of stacked bodies may be disposed at positions offset in the Y direction from one another with isolation portions ST in between adjacent bodies. A surface of the isolation portion ST is in contact with at least the stacked body 22, and the isolation portion ST is formed of an insulating material and electrically isolates the stacked body 22 from another stacked body adjacent thereto. The isolation portion ST has a fin type shape extending in the XZ directions.

The isolation portion ST includes two insulating portions DL that have a flat shape in the XZ directions and an electrode portion SL' which has a plate shape in the XZ directions and is interposed between the two insulating portions DL. The electrode portion SL' is connected to the source line SL that has a plate shape in the XY directions.

In the stacked body 22, the word lines WL and the insulating films 222 are alternately stacked in the Z direction. The word line WL is a plate-shaped conductive film extending in the XY directions. The word lines WL may referred to as a conductive film WL in some cases. In the stacked body 22, a plurality of conductive films WL0 to WL63 (word lines WL0 to WL63) are separated from each other in the Z direction. Each conductive film WL may be formed of a conductive material (for example, a metal such as tungsten) as a main component. Each insulating film 222 may be formed of an insulating material (for example, a silicon oxide) as a main component.

A cell block select line SGL is stacked in a +Z direction on the uppermost insulating film 222 of the stacked body 22. The cell block select line SGL is formed of the plate-shaped conductive film extending in the XY directions. In the following description, the cell block select line SGL is also referred to as a conductive film SGL. The conductive film SGL may be formed of a conductive material (for example, a metal such as tungsten) as a main component. The conductive film SGL is divided along the Y direction by a separation film SHE. The separation film SHE is provided above the conductive film WL (on the +Z side) and extends in the XZ directions to reach an uppermost interlayer insulating film 23 of the stacked body 22. The separation film SHE may be formed of an insulating material (for example, a silicon oxide). Accordingly, the cell block select lines SGL are electrically insulated from each other.

Each cell block CB extends in the Z direction and penetrates through the stacked body 22 in the Z direction. The cell block CB is configured as a columnar structure penetrating through the plurality of conductive films WL0 to WL63 in the Z direction. A plurality of cell blocks CB0 to CB(n−1) are disposed 2-dimensionally in the XY directions. Each cell block CB includes a semiconductor film CH (see FIG. 5) that extends in the Z direction and functions as a semiconductor channel. The semiconductor film CH penetrates through the stacked body 22 in the Z direction and functions as the semiconductor channel. Each memory cell MC is at a position at which the semiconductor film CH and a conductive film WL intersect with each other, and the cell block select transistor SG is configured at a position at which the semiconductor film CH and the conductive film SGL intersect with each other.

The interlayer insulating film 23 is disposed on the +Z side of the conductive film SGL. The interlayer insulating film 23 may be formed of an insulating material (for example, a silicon oxide) as a main component.

The plurality of bit lines BL are disposed on the +Z side of the interlayer insulating film 23. The plurality of bit lines BL are spaced at predetermined intervals in the X direction. Each bit line BL is formed of a line-shaped conductive film extending in the Y direction. Each bit line BL may be formed of a conductive material (for example, a metal such as tungsten, copper, or aluminum) as a main component.

A contact plug CP1 may be disposed between the bit line BL and the semiconductor film CH. In this case, the contact plug CP1 can be in contact with the bit line BL at an upper end and in contact with the semiconductor film CH at a lower end to electrically connect the bit line BL and the semiconductor film CH. The contact plug CP1 may be formed of a conductive material (for example, a metal such as tungsten) as a main component.

The two cell blocks CB adjacent to each other in the X direction are paired at alternate intervals. For example, as illustrated in FIG. 2, the cell blocks CB0 and CB3 are paired, the cell blocks CB3 and CB6 are not paired, but the cell blocks CB6 and CB9 are paired.

Figure 5:
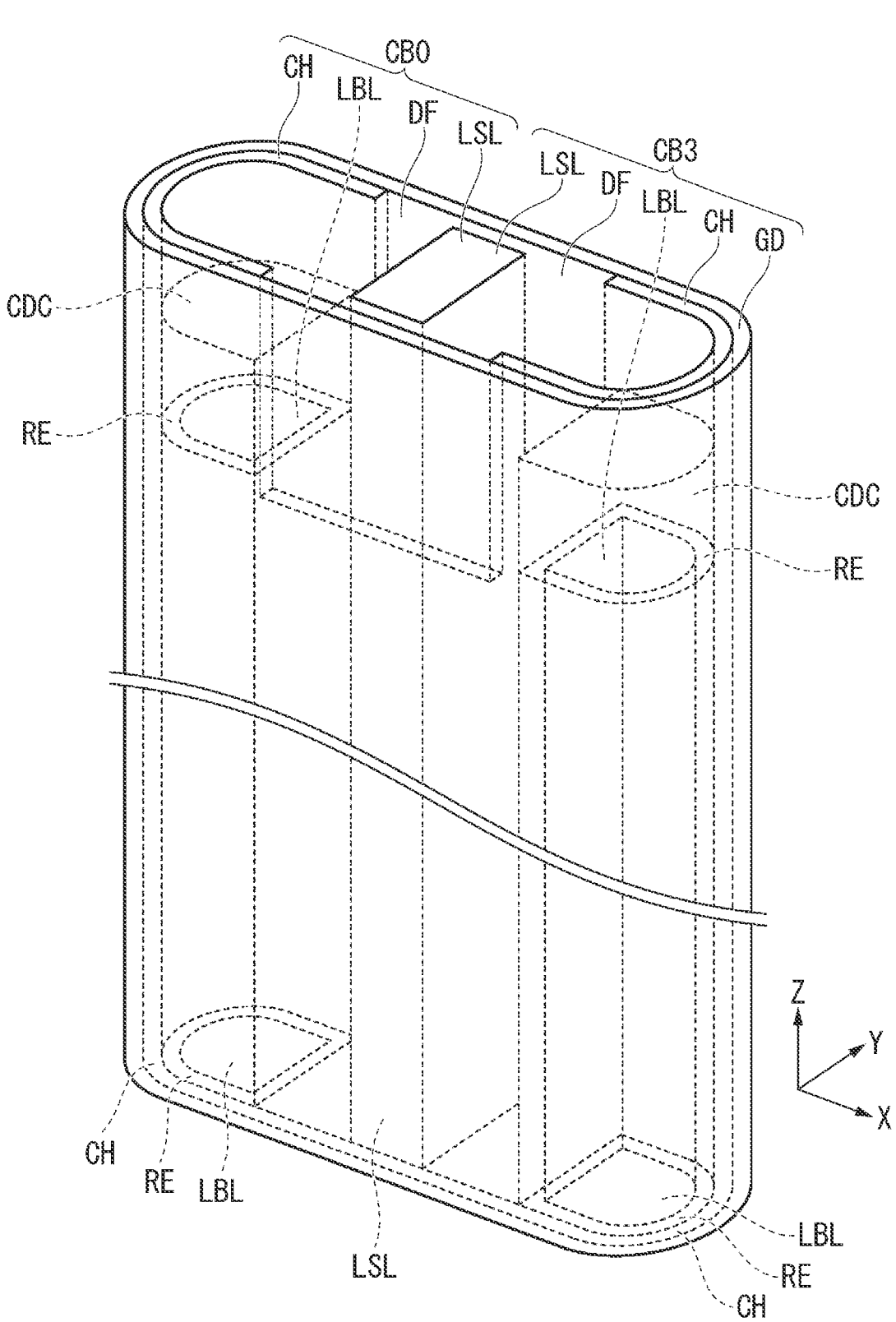
FIG. 5 is a perspective view illustrating a configuration of a cell block according to a first embodiment.

A set (group) comprising two cell blocks CB adjacent to each other in the X direction is formed, for example, as illustrated in FIGS. 5 to 7C. FIG. 5 is a perspective view illustrating a configuration of the cell blocks CB. The depicted set includes the two cell blocks CB0 and CB3.

Figure 6:
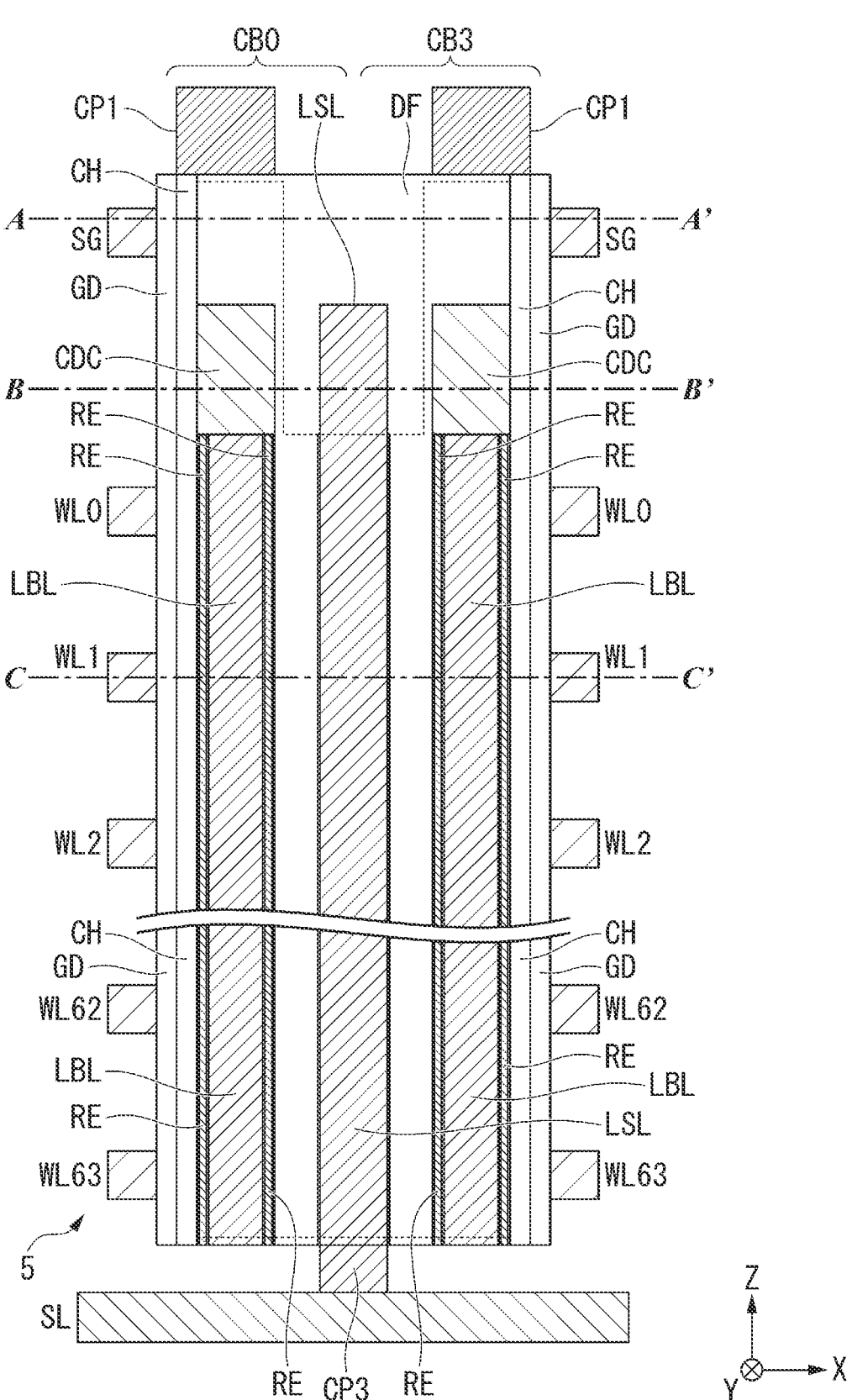
FIG. 6 is a cross-sectional view of a cell array according to a first embodiment.
Figure 7A:
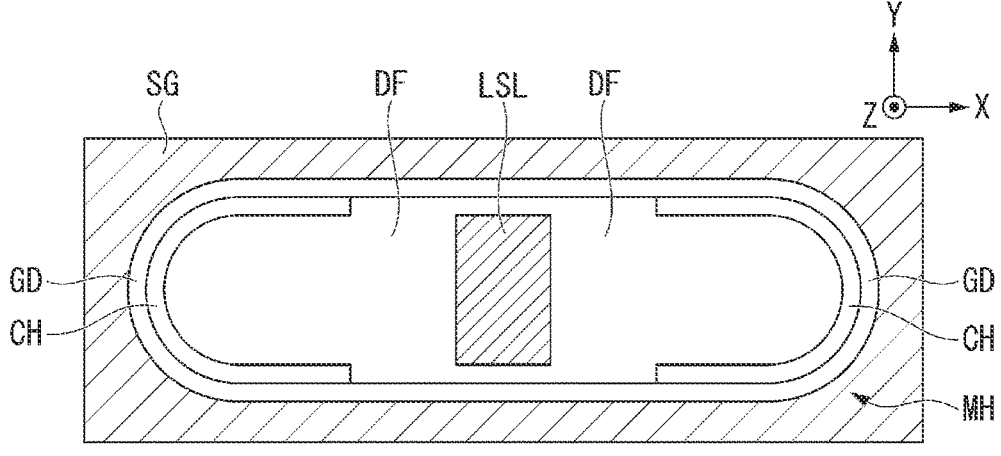
FIGS. 7A to 7C are cross-sectional views of a cell array according to a first embodiment.
Figure 7B:
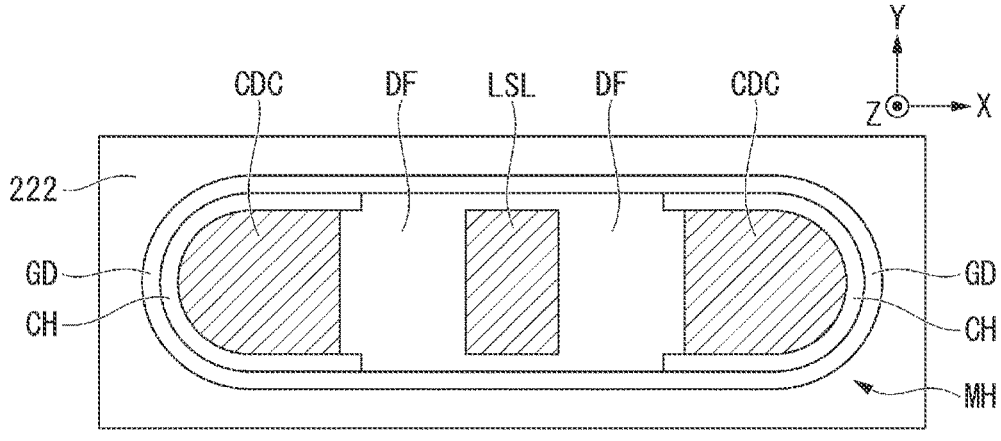
Figure 7C:
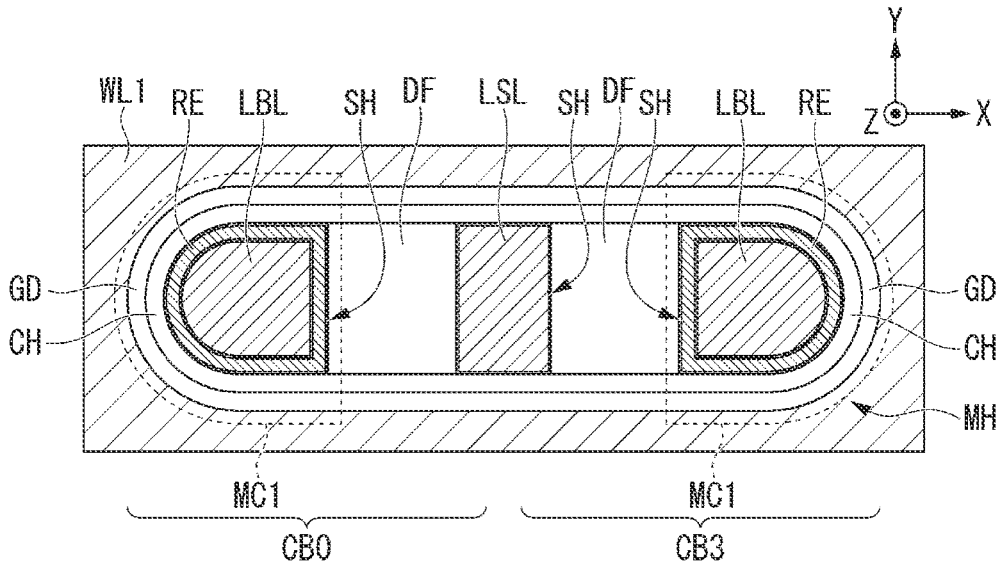

FIG. 6 is a cross-sectional view illustrating a configuration of the cell blocks CB in a vertical direction and illustrates an XZ cross-section passing through a central axis of a cell block CB. In FIG. 6, the insulating films located between the word lines WL are not illustrated for representational simplicity. FIGS. 7A to 7C are cross-sectional views illustrating a configuration of the cell blocks CB in a planar direction. FIG. 7A illustrates an XY cross-section taken along the line A-A' of FIG. 6, FIG. 7B illustrates an XY cross-section taken along the line B-B' of FIG. 6, and FIG. 7C illustrates an XY cross-section taken along the line C-C' of FIG. 6.

Each of the cell blocks CB0 and CB3 in the set is configured as a columnar structure, as illustrated in FIGS. 5 to 7C. The columnar structure of the cell block CB0 and the columnar structure of the cell block CB3 are paired in the X direction as a set, and this set has a substantially elliptical columnar shape.

The columnar structure of each cell block CB includes a gate insulating film GD, a semiconductor film CH, a local bit line column LBL, a local source line column LSL, a resistance change film RE, and a conductive contact CDC.

The local source line column LSL is shared in the set by the cell blocks CB0 and CB3.

The gate insulating film GD extends in the Z direction and penetrates through the conductive films WL0 to WL63. The gate insulating film GD has a substantially elliptical cylindrical shape. The semiconductor film CH extends in the Z direction and penetrates through the plurality of conductive films WL0 to WL63 within the region surrounded by the gate insulation film GD. The semiconductor film CH has a substantially semi-elliptical cylindrical shape and an outer surface of the semiconductor film CH is in contact with an inner surface of the gate insulating film GD.

The resistance change film RE includes a portion in contact with the semiconductor film CH and a portion in contact with the local bit line column LBL.

The local bit line column LBL extends in the Z direction and penetrates through the conductive films WL0 to WL63 in the semiconductor film CH. The local bit line column LBL has a substantially semi-columnar shape.

The local source line column LSL extends in the Z direction and penetrates through the conductive films WL0 to WL63. The local source line column LSL has a substantially prismatic shape. In each cell block CB set, a lower end portion of the local source line column LSL is connected to the source line SL via a contact plug CP3.

The resistance change film RE penetrates through the conductive films WL0 to WL63. The resistance change film RE includes a portion adjacent to the semiconductor film CH and a portion adjacent to the local bit line column LBL. The resistance change film RE has a substantially semi-cylindrical shape, an outer surface of the resistance change film RE is adjacent to an inner surface of the semiconductor film CH, and an inner surface of the resistance change film RE is adjacent to an outer surface of the local bit line column LBL.

In each cell block CB, the +Z side (upper) end of the local bit line column LBL and the resistance change film RE is slightly closer to the contact plug CP1 than is the uppermost word line WL (the word line WL0). The conductive contact CDC is located between the cell block select line SGL and the +Z side ends of the local bit line column LBL and the resistance change film RE. A shape of the conductive contact CDC in a plan view is the same as a shape of a combined shape of the local bit line column LBL and the resistance change film RE in a plan view. A circumferential surface of the conductive contact CDC is in contact with an inner circumferential surface of the semiconductor film CH. A surface of the conductive contact CDC on the −Z side is in contact with the +Z side ends of the local bit line column LBL and the resistance change film RE.

The conductive contact CDC is formed of a conductive material such as TiN or TaN containing a metal that is different than the semiconductor film CH. Alternatively, the conductive contact CDC may be formed of a conductive material such as a metal silicide. As an example of a metal silicide, a Si layer can be transformed into a silicide by first forming a Si layer and then implanting metal ions such as Ni or Co into the layer.

The conductive contact CDC can be formed of a good conductor material containing a metal. Therefore, when the select transistor SG is turned on, good contact performance (low electrical resistance) between the semiconductor film CH and the local bit line column LBL is provided by the conductive contact CDC.

Figure 4:
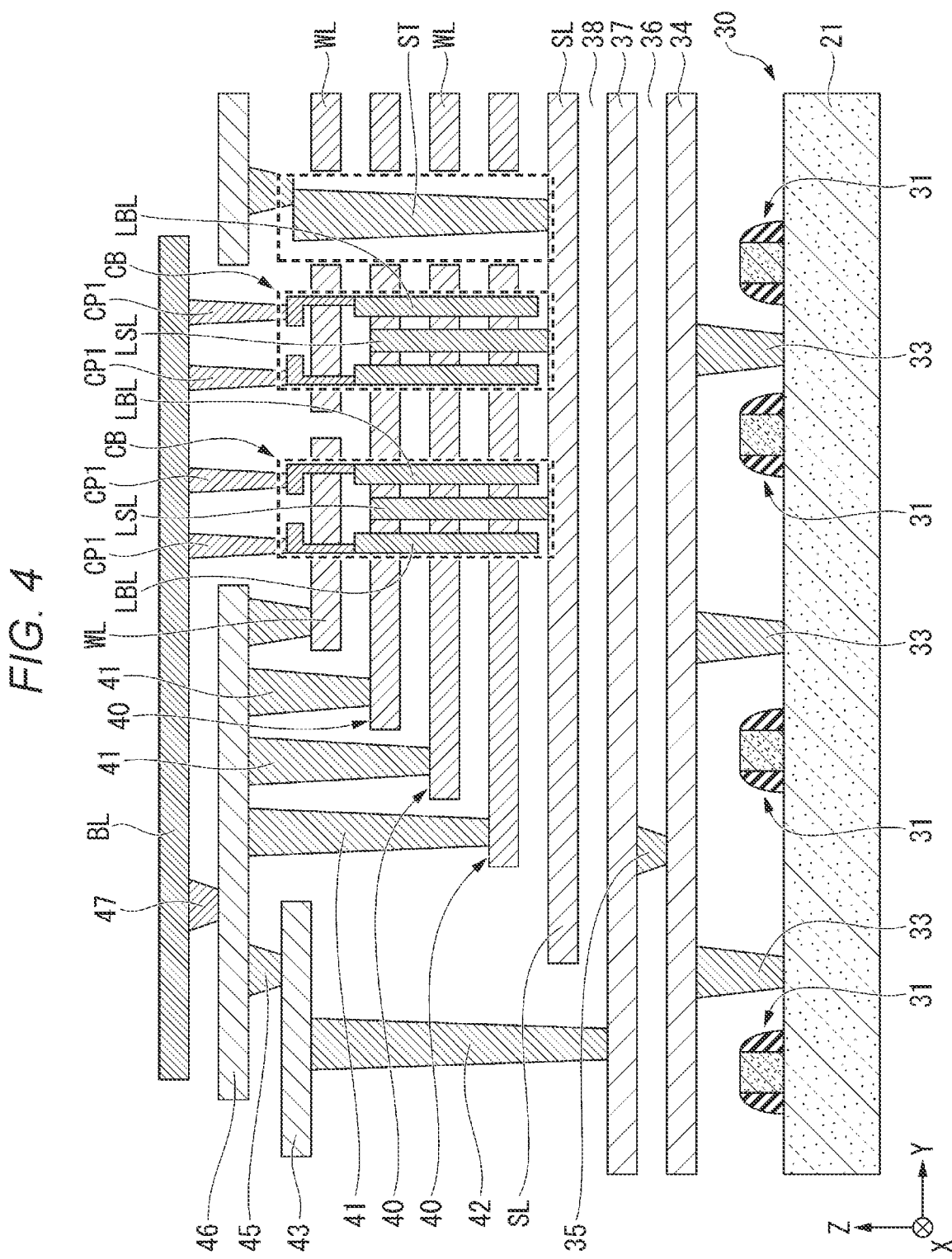
FIG. 4 is a cross-sectional view of a peripheral circuit board integrated with the cell array according to a first embodiment.

FIG. 4 illustrates an example of a configuration in which the cell array 5 is integrated with a peripheral circuit board. A peripheral circuit board 30 includes a plurality of driving transistors 31 on the upper side (+Z side) of the substrate 21. Each driving transistor 31 includes a gate electrode provided on the substrate 21 with a gate insulating film interposed therebetween and a source diffusion layer and a drain diffusion layer provided in the substrate 21.

The peripheral circuit board 30 includes a plurality of contact plugs 33 provided on the gate electrodes, the source diffusion layer, or the drain diffusion layer of the driving transistor 31. Further, the peripheral circuit board 30 includes a first interconnection layer 34 that is provided on the +Z side of the contact plug 33 and includes a plurality of interconnections, a second interconnection layer 36 that is provided on the +Z side of the first interconnection layer 34 and includes a contact plug 35, and a third interconnection layer 37 that is provided on the +Z side of the second interconnection layer 36. An insulating film is provided between the substrate 21 and the interconnection layer 34. The insulating film is not specifically illustrated and various layer-to-layer interconnections between interconnection layers 34, 36, and 37 are likewise not specifically illustrated in FIG. 4.

The source line SL is formed on the insulating film 38 provided on the +Z side of the third interconnection layer 37, the stacked body 22 described with reference to FIG. 3 is formed on the +Z side of the source line SL, and the cell blocks CB penetrating through the stacked body 22 are provided.

In FIG. 4, stair portions 40 at which end of the word lines WL are formed in a stair shape are formed in regions to the −Y side of the regions in which the cell blocks CB are formed.

An insulating film is formed in each of a region of the stair portion 40 and the source line SL on the +Z side and a region of the stair portion 40 and the source line SL on the −Y side. This insulating film is not specifically illustrated in FIG. 4.

A via plug 41 connected to each word line WL is connected to the stair portion 40 to penetrate through an insulating film in the Z direction. In a region of the source line SL on the −Y side, a metal plug 42 penetrates through an insulating film to the +Z side of the second interconnection layer 37. The metal plug 42 is connected to the bit line BL via a fourth interconnection layer 43, a via plug 45, a fifth interconnection layer 46, and a contact plug 47.

As illustrated in FIG. 4, the highly integrated nonvolatile semiconductor storage device 1 can be provided by stacking the cell array 5 on the peripheral circuit board 30.

An overview of a process when the cell blocks CB are manufactured will be described below.

After the source lines SL on the +Z side of the semiconductor substrate 21 (see FIG. 3) has been formed, insulating films 222 and sacrificial films are alternately stacked to form the stacked body 22. The insulating films 222 are formed of, for example, a material that has a silicon oxide as a main component and the sacrificial films are formed of, for example, a material that has a silicon nitride as a main component. To form the cell blocks CB, memory holes MH penetrating through the stacked body 22 in the Z direction are formed and a set including two cell blocks CB is formed in each memory hole MH. Each memory hole MH reaches the source line SL. Thereafter, by removing the sacrificial films and replacing the removed sacrificial films with the conductive films WL by filling the cavities formed by removal of the sacrificial films, it is possible to implement a low cost nonvolatile semiconductor storage device.

When the set including two cell blocks CB is formed, as illustrated in FIGS. 5, 6, and 7A to 7C, the gate insulating film GD is deposited on the inner circumference of the side wall of the elliptical memory hole MH which is horizontally elongated in the XY plan view. The shape of the memory hole MH and/or the columnar structure including the two cell blocks CB may be referred to as an elongated oval shape, a racetrack shape, or elliptical shape. The semiconductor film CH is then deposited on the gate insulating film GD. Thereafter, after the inside is filled with an insulating film DF, three (middle, right, and left) sub-holes SH are formed using lithography. The inside of the middle sub-hole SH in FIG. 7C is filled with a low-resistant local source line column LSL using tungsten or the like.

At a Z position of the cell block select line SGL and a Z position between the cell block select line SGL and the conductive film WL, as illustrated in FIGS. 7A and 7B, the local bit line LBL is not in contact with the semiconductor film CH. At Z positions corresponding to the conductive film WL, as illustrated in FIG. 7C, the local bit line columns LBL have a structure adjacent to the semiconductor film CH.

In the right and left sub-holes SH illustrated in FIG. 7C, the resistance change films RE are deposited to be in contact with the semiconductor film CH in the semiconductor film CH. At the Z position of the cell block select line SGL and the Z position between the cell block select line SGL and the conductive film WL, as illustrated in FIGS. 7A and 7B, the resistance change film RE is removed. In the semiconductor film CH, portions near the middle in the X direction and until the Z position directly above the conductive film WL are removed. Further, the inside is filled with the low-resistant local bit line columns LBL formed of tungsten or the like. At the Z position of the cell block select line SGL, as illustrated in FIG. 7A, the local bit line column LBL is removed.

Accordingly, at the Z position of the cell block select line SGL, the select transistor SG of the cell block which can be controlled with the cell block select line SGL can be formed, and connection switches of bit lines BL0 and BL1 and local bit lines LBL0 and LBL1 can be formed.

At the Z position between the cell block select line SGL and the conductive film WL, the local bit line LBL is electrically connected to the semiconductor film CH. Therefore, when the select transistor SG is turned on, the local bit line LBL is electrically connected to the bit lines BL0 and BL1.

At the Z position corresponding to the conductive film WL, the local bit line column LBL is connected to the local source line column LSL via the resistance change film RE and the semiconductor film CH. Therefore, the memory cell MC can be formed. For example, when the resistance change film RE is formed of a phase-change material such as a chalcogenide-based material (Ge, Sb, or Te), the memory cell MC can be configured as a PCM memory cell.

Figure 8:
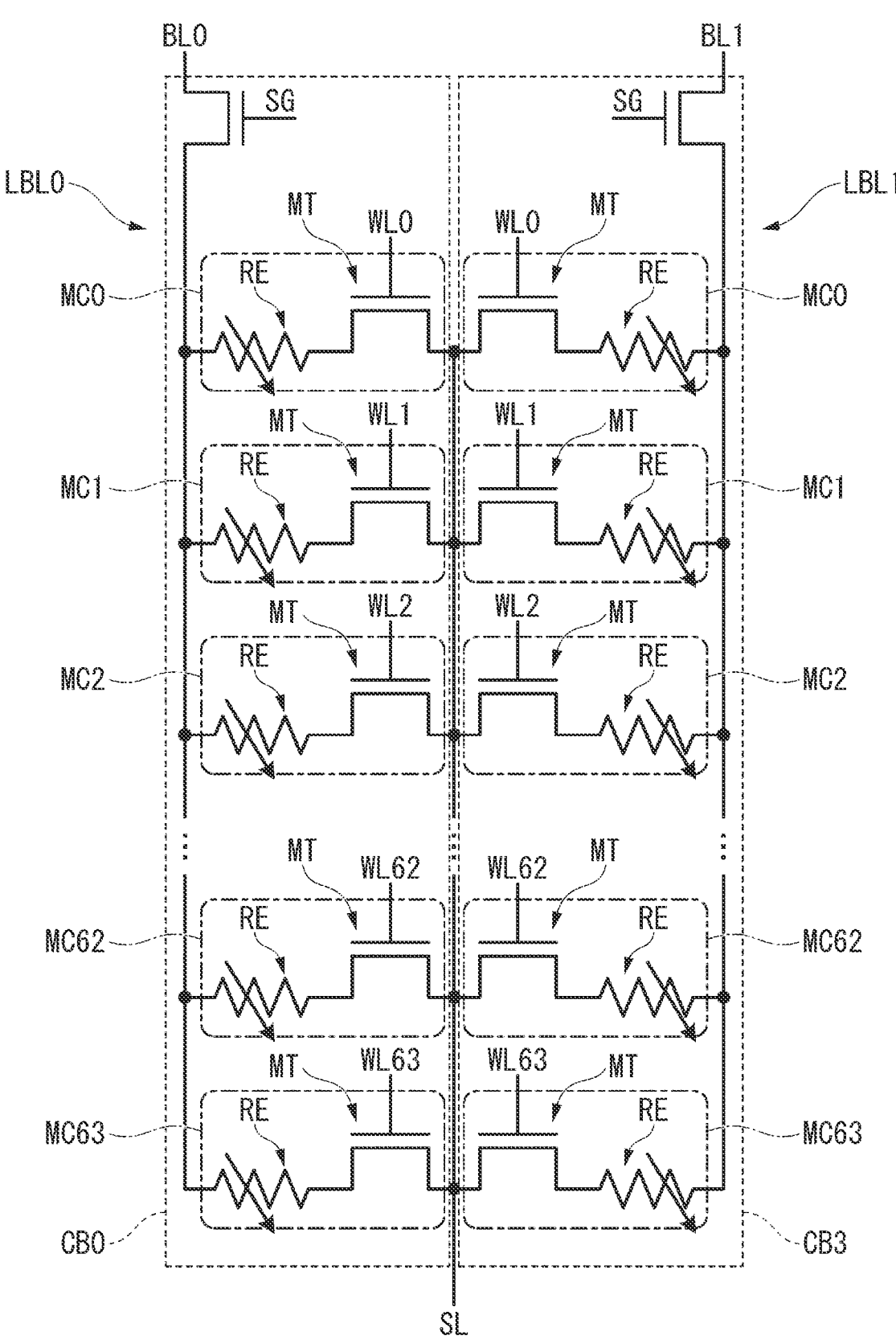
FIG. 8 is a circuit diagram illustrating a configuration of a cell block according to a first embodiment.

An equivalent circuit diagram of the set including the cell blocks CB0 and CB3 is a diagram of a configuration illustrated in FIG. 8. FIG. 8 is a circuit diagram illustrating a configuration of the cell blocks CB.

As illustrated in the equivalent circuit diagram of FIG. 8, the memory cells MC are a cell transistor MT (with a gate connected to a word line WLi (where i=0 to 63)) connected in series with a 2-terminal type resistance change element RE. In each cell block CB, one end of each memory cell MC is connected to a local bit line (LBL0 or LBL1) and the other end of the memory cell MC is connected to the source line SL (local source line LSL). That is, the memory cells MC in the same cell block CB are connected in parallel between the local bit line (LBL0 or LBL1) and the local source line LSL. Memory cells MC in the cell blocks CB of the same cell block group share the same local source line LSL. The local bit lines LBL are connected to the bit lines BL0 and BL1 via the cell block select transistors SG0 and SG1.

In this configuration, by selecting the cell blocks CB0 and CB3 in a state in which the cell block select transistors SG0 and SG3 are turned on and turning on the cell transistor MT connected with the selected word lines WL among the selected cell blocks CB0 and CB3, it is possible to selectively apply a voltage or apply a current to the resistance change element RE of the selected memory cell MC, and thus random read or random write is possible.

Further, the number of the transistors connected in series in a current path between the bit line BL and the source line SL can be reduced to just two, and thus it is possible to supply a current with which a Set/Reset operation of the resistance change element RE is possible sufficiently despite high ON resistance of the transistors.

In this example, the equivalent circuit with cell blocks CB0 and CB3 in which a local source line LSL is shared common is illustrated. Likewise, in this example, the word lines WL are shared in common as is and the cell block select line SGL, and thus the memory cells MC1 of the two cell blocks CB0 and CB3 may be simultaneously read or written.

Figure 9:
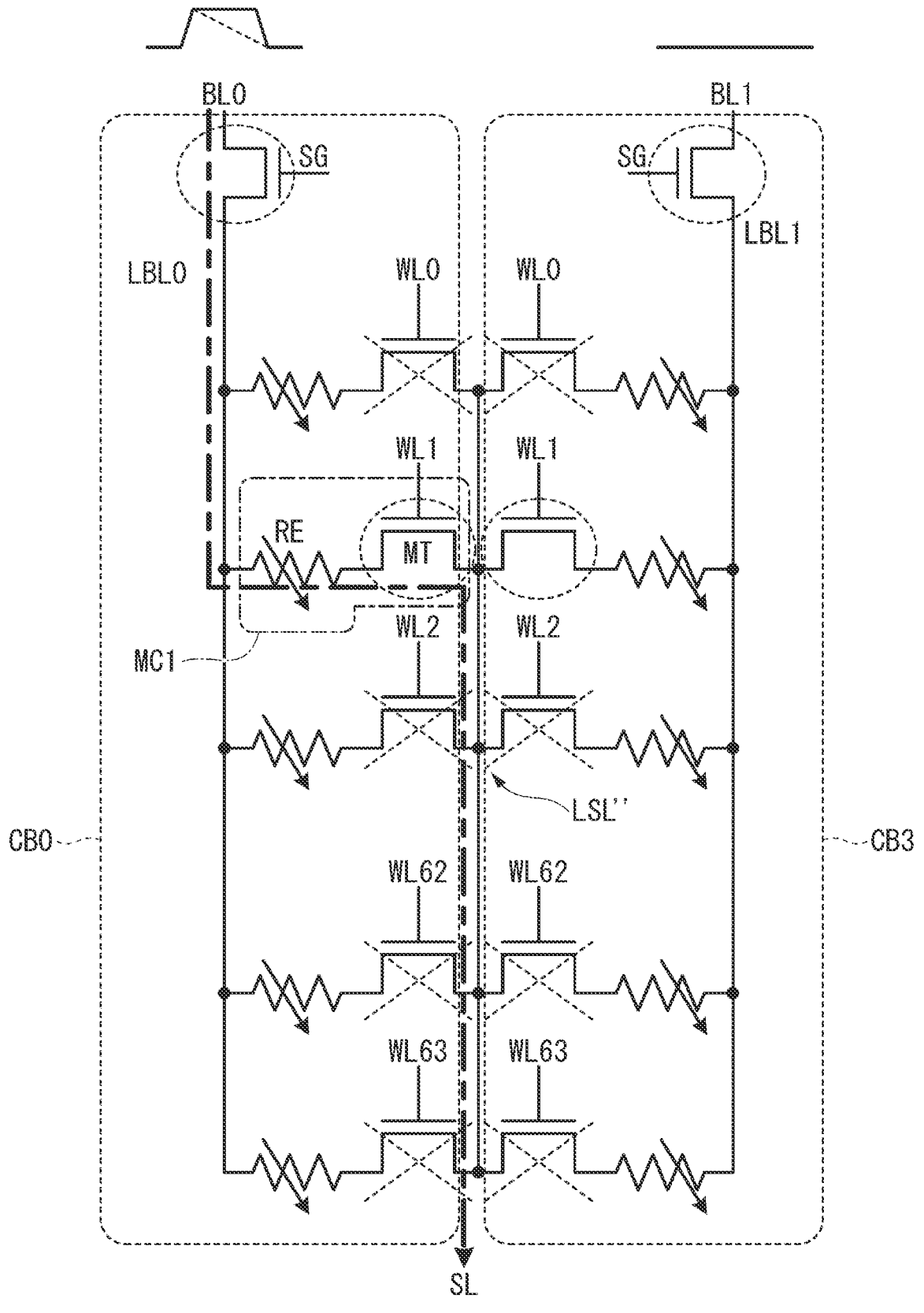
FIG. 9 is a circuit diagram illustrating an operation of a cell block according to a first embodiment.

Alternatively, as illustrated in FIG. 9, a potential of the bit line BL1 corresponding to the cell block CB3 on the right side of the drawing is set as a fixed potential equal to a potential of the source line SL and a voltage is applied to the selected word line WL1. Accordingly, in the cell block CB3, a voltage is not applied to the memory cell MC1 corresponding to the selected word line WL1 and non-access of the memory cell MC1 in cell block CB 3 can be achieved. A potential of the bit line BL0 corresponding to the cell block CB0 on the left side of the drawing is set to a potential greater than a potential of the source line SL. Accordingly, in the cell block CB0, a cell current selectively flows through the memory cell MC1 corresponding to the selected word line WL1, and thus read or write can be performed.

In this case, a current path is a path in which a current flows from the local bit line column LBL of the selected cell block CB0 to the middle local source line column LSL via the semiconductor film CH of the selected memory cell MC1, as illustrated in FIGS. 6, 7C, and 9. FIG. 9 is a circuit diagram illustrating an operation of the cell blocks CB. A current path in which the selected word line is WL1 is indicated by a one-dot chain line. At this time, since a current amount is changed in accordance with a resistant state (a Set or Reset state) of the resistance change film RE, a read operation is possible.

In the cell transistor MT disposed in an opening of the stacked word line WL, mobility is generally lower than in a polysilicon channel in a normal bulk transistor. However, the number of transistors connected in series in the cell blocks CB at the time of access (in the case of FIG. 9, the cell block select transistor SG and one cell transistor MT) is small as two, a sufficiently large cell current may still flow. Therefore, a Set/Reset driving operation of the resistance change element RE is easy. When the local bit line column LBL or the local source line column LSL are formed of low-resistance tungsten or the like, the cell current in a read or write operation of the resistance change element RE is not substantially reduced despite an increase in the number of stacked word lines WL. Therefore, it is possible to implement a low-cost memory.

In the first embodiment, a thermal barrier film may be provided between the resistance change film RE and the local bit line column LBL and between the resistance change film RE and the semiconductor film CH.

The thermal barrier film can be formed of a conductive material with high thermal resistance. For example, the thermal barrier film can be formed of a conductive material such as TiN, TaN, titanium oxide (TiOx), carbon (C), or carbonitride (CN).

The thermal barrier film can inhibit heat leakage from the resistance change film RE while still passing a current between the resistance change film RE and the local bit line column LBL. The thermal barrier film can inhibit heat leakage from the resistance change film while still passing a current between the resistance change film RE and the semiconductor film CH.

For example, when the resistance change film RE is formed of some type of phase-change material, a magnetic material, or a metal oxide material, the resistance change film RE operates with an increase in temperature or operates to easily switch at a high temperature. Therefore, if the resistance change film RE is interposed between the thermal barrier films having a high thermal resistance, it is possible to inhibit heat leakage due to heat generation and also increase the temperature of the resistance change film RE at a lower current.

When a thermal barrier film is inserted around the middle local source line column LSL, thermal energy of the resistance change film RE can be prevented from leaking to the local source line column LSL via the semiconductor film CH. Additionally, the thermal barrier film can lower electric contact resistance between the resistance change film RE and another film.

The thermal barrier film can prevent diffusion of various types of atoms to the resistance change film RE or from the resistance change film RE, and thus can inhibit deterioration in data retention reliability.

As described above, the thermal barrier film can be interposed between the resistance change film RE and the local bit line column LBL and the thermal barrier film can be interposed between the resistance change film RE and the semiconductor film CH. Accordingly, it is possible to reduce magnitude of a cell current for increasing a temperature of the resistance change film RE of the selected memory cell MC until a temperature at which a Set/Reset operation is possible, and thus it is possible to reduce power consumption of the nonvolatile semiconductor storage device 1.

A material with a relatively high electric resistance at an interface may be adopted as a material of the thermal barrier film and may have a thermal assisting function of using the heat generated by the interface resistance to increase the temperature of the resistance change film RE. Alternatively, a material with high thermal resistance relative to the resistance change film RE may be selected as a material of a thermal barrier and an interface between the thermal barrier film and the resistance change film RE may be set to an initial high resistance state. Accordingly, it is possible to implement current path separation between the conductive films WL. In this way, the thermal barrier film is applicable to many uses.

Second Embodiment

Next, a nonvolatile semiconductor storage device according to a second embodiment will be described with reference to FIG. 10. Hereinafter, differences from the first embodiment will be mainly described.

In the first embodiment, as illustrated in FIG. 6, the conductive contact CDC is in contact with the +Z side end of the local bit line column LBL of each cell block CB. In the second embodiment, as illustrated in FIG. 10, a conductive contact CDC2 is in contact with the +Z side end of the local bit line column LBL of each cell block CB. The conductive contact CDC2 according to the second embodiment has a different shape than the conductive contact CDC illustrated in FIG. 6.

The conductive contact CDC2 includes a base portion 50 in contact with the +Z side end of the local bit line column LBL and an extension portion 51 extending from an edge of the base portion 50 in a cylindrical shape on the +Z side. The base portion 50 is in contact with the +Z side end of each of the local bit line column LBL and the resistance change film RE.

A material of the conductive contact CDC2 is a material similar to the material of the conductive contact CDC. For example, the conductive contact CDC2 is formed of a conductive film containing a metal such as TiN or TaN or a conductive film such as a metal silicide.

The base portion 50 and the extension portion 51 are formed of a conductive film with the same film thickness, and the extension portion 51 is in contact with an inner surface of the semiconductor film CH. The conductive contact CDC2 is formed in a U shape on a cross section in the vertical direction, as illustrated in FIG. 10. In other words, the conductive contact CDC2 has a film thickness less than a line width (a width in the X direction of FIG. 10) of the local bit line column LBL and is formed of a conductive film containing a metal.

The other configurations are similar to the configurations of the first embodiment. The cell block CB including the conductive contact CDC2 is provided in the cell array 5 to configure the nonvolatile semiconductor storage device.

When a conductive film is deposited from a film formed more upward than the +Z side end of the local bit line column LBL and the film fills the entire inside of the semiconductor film CH, as illustrated in FIG. 7B, a film forming time becomes long when a film for the entire conductive contact CDC is formed.

Figure 10:
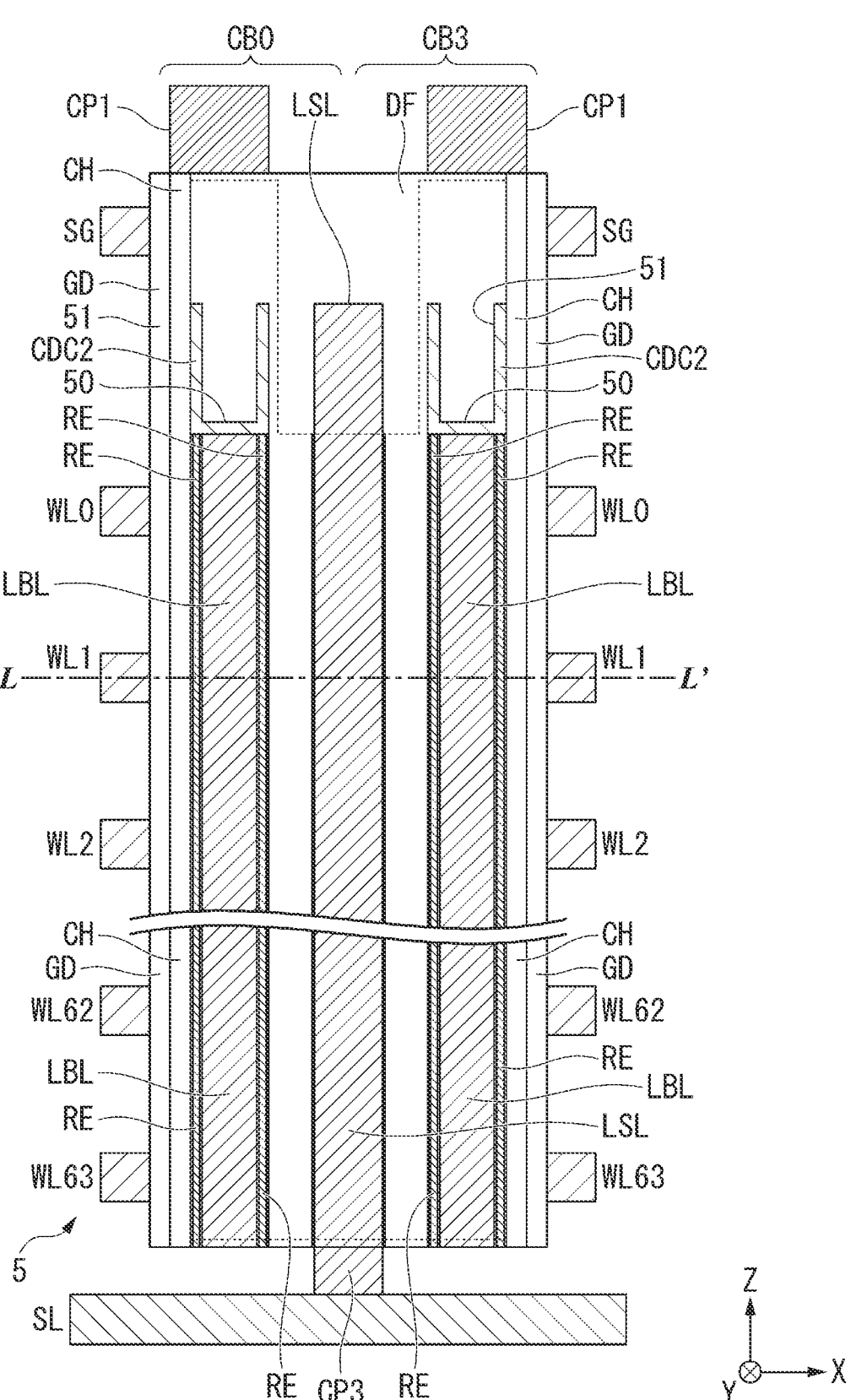
FIG. 10 is a cross-sectional view of a cell array according to a second embodiment.

As illustrated in FIG. 10, the conductive contact CDC2 that includes the base portion 50 and the extension portion 51 and has a film thickness less than the line width of the local bit line column LBL contributes to a decrease in the film forming time and a manufacturing time.

The conductive contact CDC2 is in contact with the local bit line column LBL in the base portion 50 and is in contact with the semiconductor film CH in a large area in the extension portion 51. Therefore, when the select transistor SG is turned on, contact resistance of a conductive portion from the bit line BL to the local bit line column LBL can be reduced, and thus a good conductive state can be obtained.

The other operational effects are similar to those of the nonvolatile semiconductor storage device according to the first embodiment.

Third Embodiment

Next, a nonvolatile semiconductor storage device according to a third embodiment will be described with reference to FIG. 11. Hereinafter, differences from the first embodiment will be mainly described.

In the first embodiment, as illustrated in FIG. 6, the conductive contact CDC is in contact with the +Z side end of the local bit line column LBL of each cell block CB. In the third embodiment, as illustrated in FIG. 11, a configuration in which a conductive contact CDC3 is in contact with the +Z side end of the local bit line column LBL of each cell block CB is similar. The conductive contact CDC3 has a different shape from the conductive contact CDC illustrated in FIG. 6 and a position at which the conductive contact CDC3 is formed is different.

The conductive contact CDC3 includes a base portion 50 in contact with the +Z side end of the local bit line column LBL and an extension portion 51 extending from an edge of the base portion 50 in a cylindrical shape on the +Z side. The base portion 50 is in contact with the +Z side end of each of the local bit line column LBL and the resistance change film RE in detail.

A material of the conductive contact CDC3 is a material similar to the material of the conductive contact CDC. For example, the conductive contact CDC3 is formed of a conductive film containing a metal such as TiN or TaN or a conductive film such as a metal silicide.

The base portion 50 and the extension portion 51 are formed of a conductive film with the same film thickness, and the extension portion 51 is in contact with an inner surface of the semiconductor film CH. The conductive contact CDC3 is formed in a U shape on a cross section in the vertical direction, as illustrated in FIG. 11. In other words, the conductive contact CDC3 has a film thickness less than a line width (a width in the X direction of FIG. 10) of the local bit line column LBL and is formed of a conductive film containing a metal.

It is noted that, in the third embodiment, the local bit line column LBL and the resistance change film RE extend to the +Z side further than the configuration illustrated in FIG. 6. Specifically, the local bit line column LBL and the resistance change film RE extend until the vicinity of the select transistor SG in the Z direction and the conductive contact CDC3 is provided on the +Z side.

The extension portion 51 of the conductive contact CDC3 extends to a region where the select transistor SG is formed. An insulating film DF is formed between the +Z side end of the extension portion 51 and the contact plug CP1.

In the third embodiment, the local source line column LSL also extends to the +Z side similarly to the local bit line column LBL. The tip end of the local source line column LSL in the +Z direction is formed at the same position as the tip end of the local bit line column LBL in the +Z direction. On the tip end side of the local source line column LSL, an extension portion CDC4 including a base portion 52 and an extension portion 53 is provided. A material of the extension portion CDC4 is the same as that of the conductive contact CDC3 and a configuration of the extension portion CDC4 is also the same as that of the conductive contact CDC3. In the configuration of FIG. 11, the conductive contact CDC3 is connected to the tip end of the local bit line column LBL and a part of the semiconductor film CH forming a channel region directly under the gate electrode of the select transistor SG.

The other configurations are similar to the configurations of the first embodiment. The cell block CB including the conductive contact CDC2 is provided in the cell array 5 to configure the nonvolatile semiconductor storage device.

When a conductive film is deposited from a film formed more upward than the +Z side end of the local bit line column LBL and the film fills the entire inside of the semiconductor film CH, as illustrated in FIG. 7B of the first embodiment, a film forming time becomes long when a film for the entire conductive contact CDC is formed.

Figure 11:
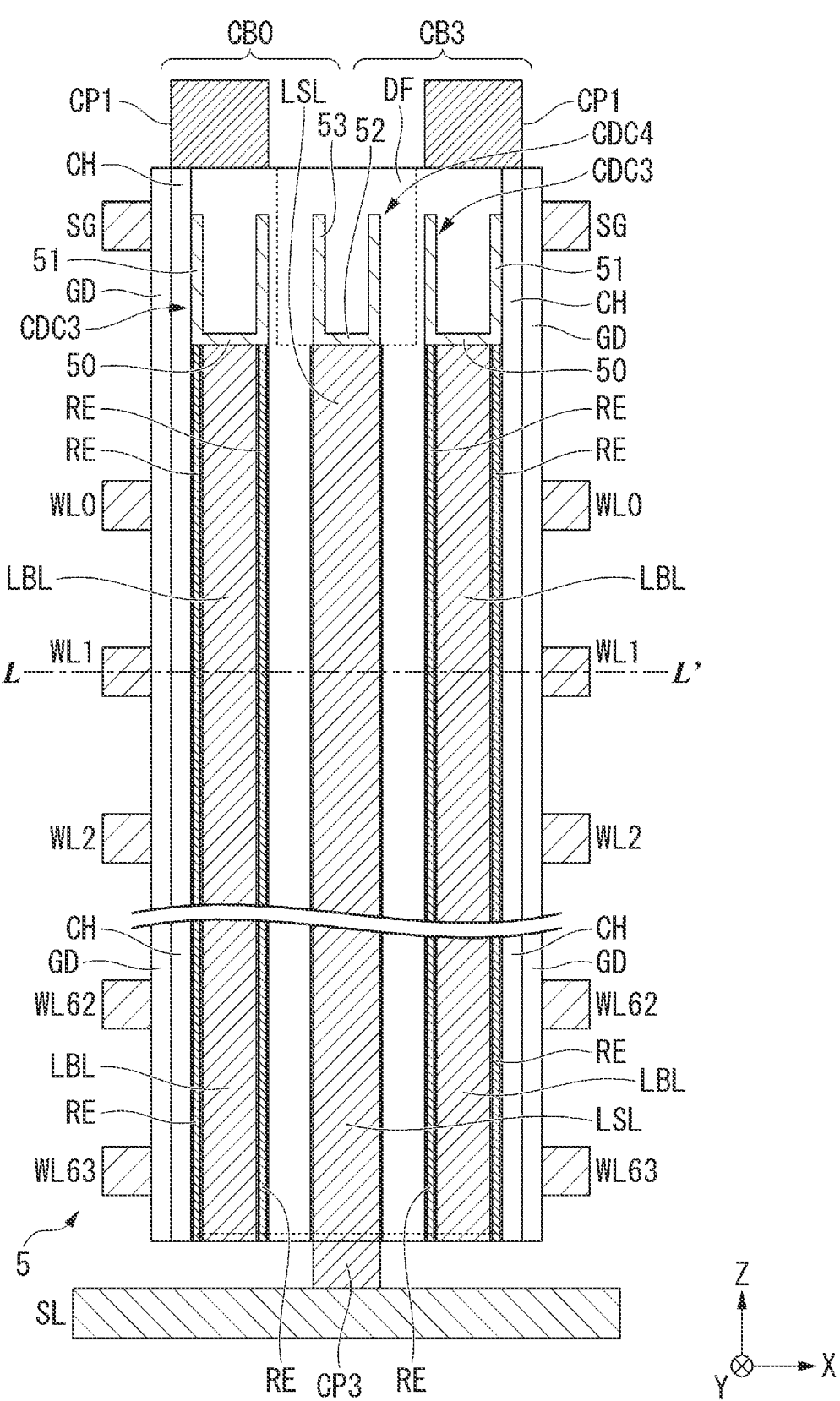
FIG. 11 is a cross-sectional view of a cell array according to a third embodiment.

As illustrated in FIG. 11, the conductive contact CDC3 that includes the base portion 50 and the extension portion 51 and has a film thickness less than the line width of the local bit line column LBL contributes to a decrease in the film forming time.

The conductive contact CDC3 is in contact with the local bit line column LBL in the base portion 50 and is in contact with the semiconductor film CH in a large area in the extension portion 51. Therefore, when the select transistor SG is turned on, contact resistance of a conductive portion from the bit line BL to the local bit line column LBL can be reduced, and thus a good conductive state can be obtained.

In the configuration illustrated in FIG. 11, since the conductive contact CDC3 is formed near the select transistor SG, a distance between the select transistor SG and the word line WL can be shortened. Therefore, when the select transistor SG is turned on, better contact performance between the semiconductor film CH and the local bit line column LBL than in the first and second embodiments can be guaranteed.

In the third embodiment, the extension portion CDC4 connected to the local source line column LSL is provided in addition to the conductive contact CDC3 connected to the local bit line column LBL. The extension portion CDC4 can be manufactured through the same process when the conductive contact CDC3 is formed in the insulating film DF.

The other operational effects are similar to those of the nonvolatile semiconductor storage device according to the first embodiment.

Disposition Configuration of Cell Block Set

Figure 12:
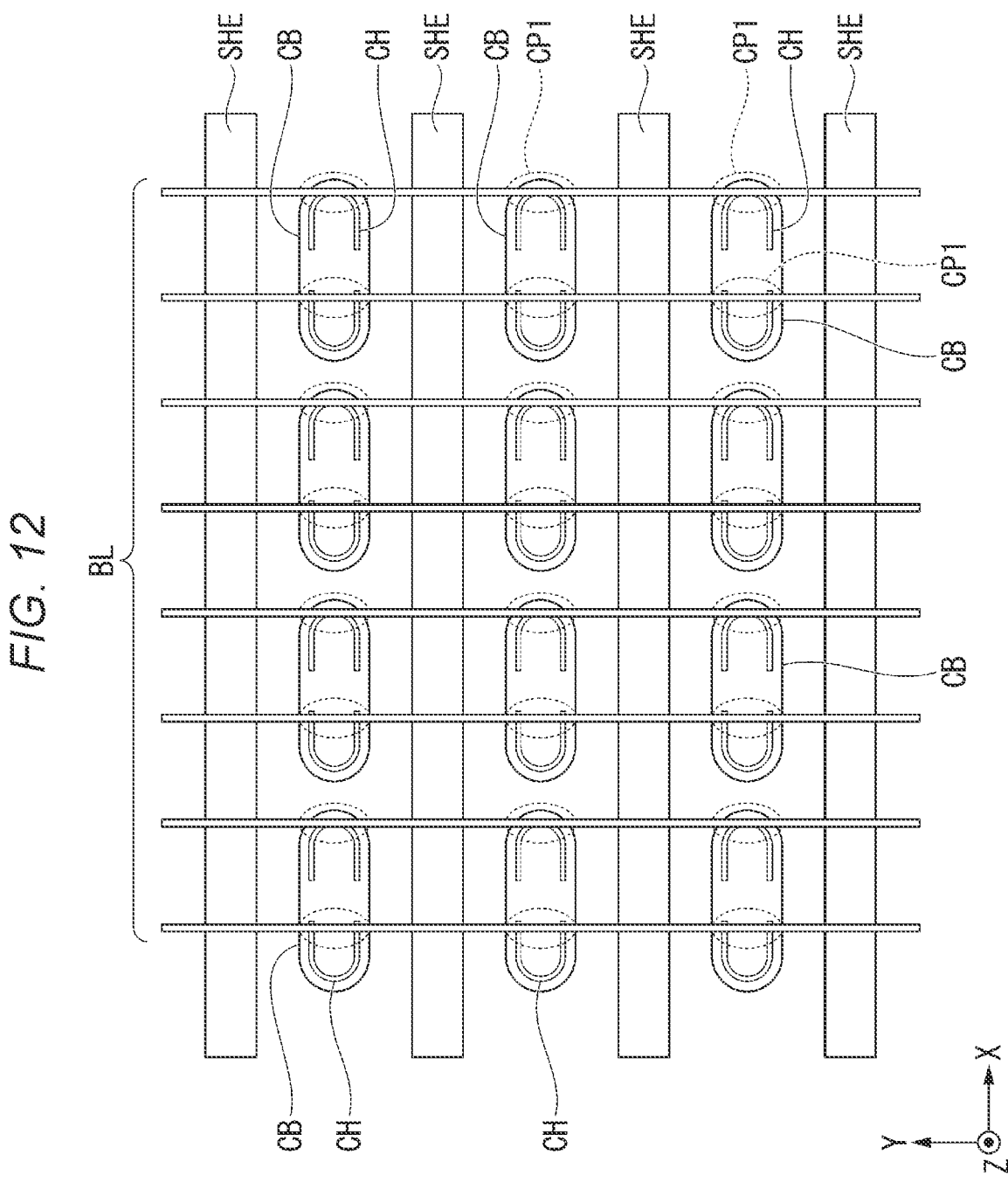
FIG. 12 is a plan view illustrating a disposition of cell blocks according to a first embodiment.

FIG. 12 illustrates a disposition relation among the cell blocks CB, the bit lines BL, and the separation films SHE in the nonvolatile semiconductor storage device 1 according to the first embodiment.

As illustrated in FIG. 12, the plurality of bit lines BL are located in the Y direction to be spaced at predetermined intervals in the X direction, and the plurality of separation films SHE are located in the X direction to be spaced at predetermined intervals in the Y direction. Two cell blocks CB provided in the set are coupled in the X direction and have a substantially elliptical columnar shape. Here, a cell block set 55 which is a coupled body of two cell blocks provided in the set will be described.

In the first embodiment, the cell block sets 55 are located in one row between the plurality of separation films SHE to be spaced at predetermined intervals in the X direction. The cell block set 55 has a racetrack shape in a plan view. The major axes of individual racetracks of the cell block sets 55 in a plan view are aligned in the X direction and the cell block sets 55 are located to be spaced at intervals with the other cell block sets 55 adjacent in the X direction.

It is necessary to connect the bit line BL to each of two cell blocks CB provided in the cell block set 55, two bit lines BL are connected to one cell block set 55. The contact plug CP1 is disposed in a portion in which the bit line BL is connected to the cell block CB.

The disposition configuration of the cell block set 55 provided in a region between the separation films SHE is not limited to the example illustrated in FIG. 12. An embodiment to be described below may be adopted.

Fourth Embodiment

Figure 13:
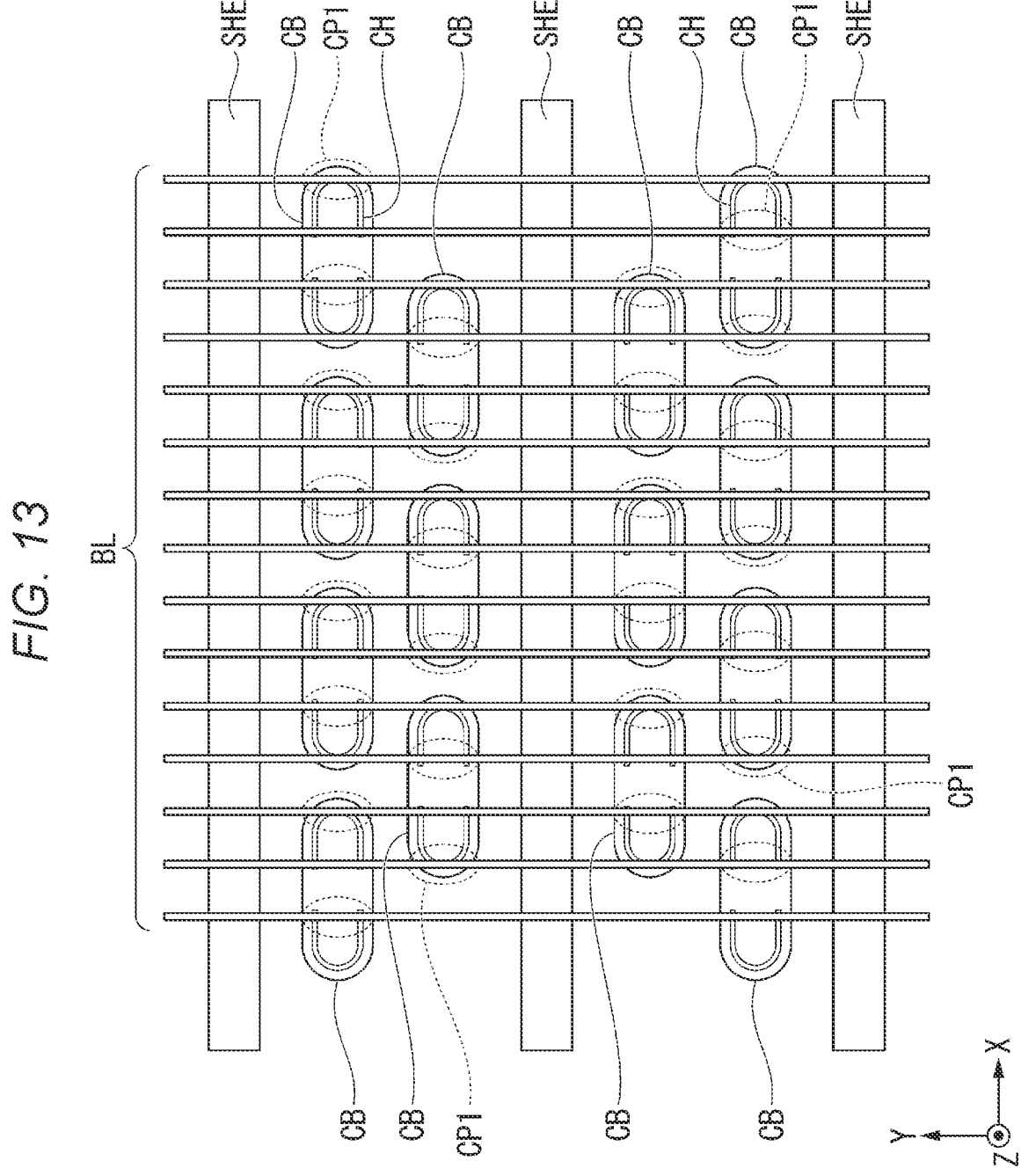
FIG. 13 is a plan view illustrating a disposition of cell blocks according to a fourth embodiment.

FIG. 13 illustrates a disposition configuration of the cell block sets 55 in a nonvolatile semiconductor storage device according to a fourth embodiment.

As illustrated in FIG. 13, the cell block sets 55 in two rows are located in zigzags in the X direction in a region between the separation films SHE.

Since two bit lines BL are necessary for each cell block set 55, as illustrated in FIG. 13, the plurality of bit lines BL are located in the X direction at intervals less than in the configuration illustrated in FIG. 12.

Fifth Embodiment

Figure 14:
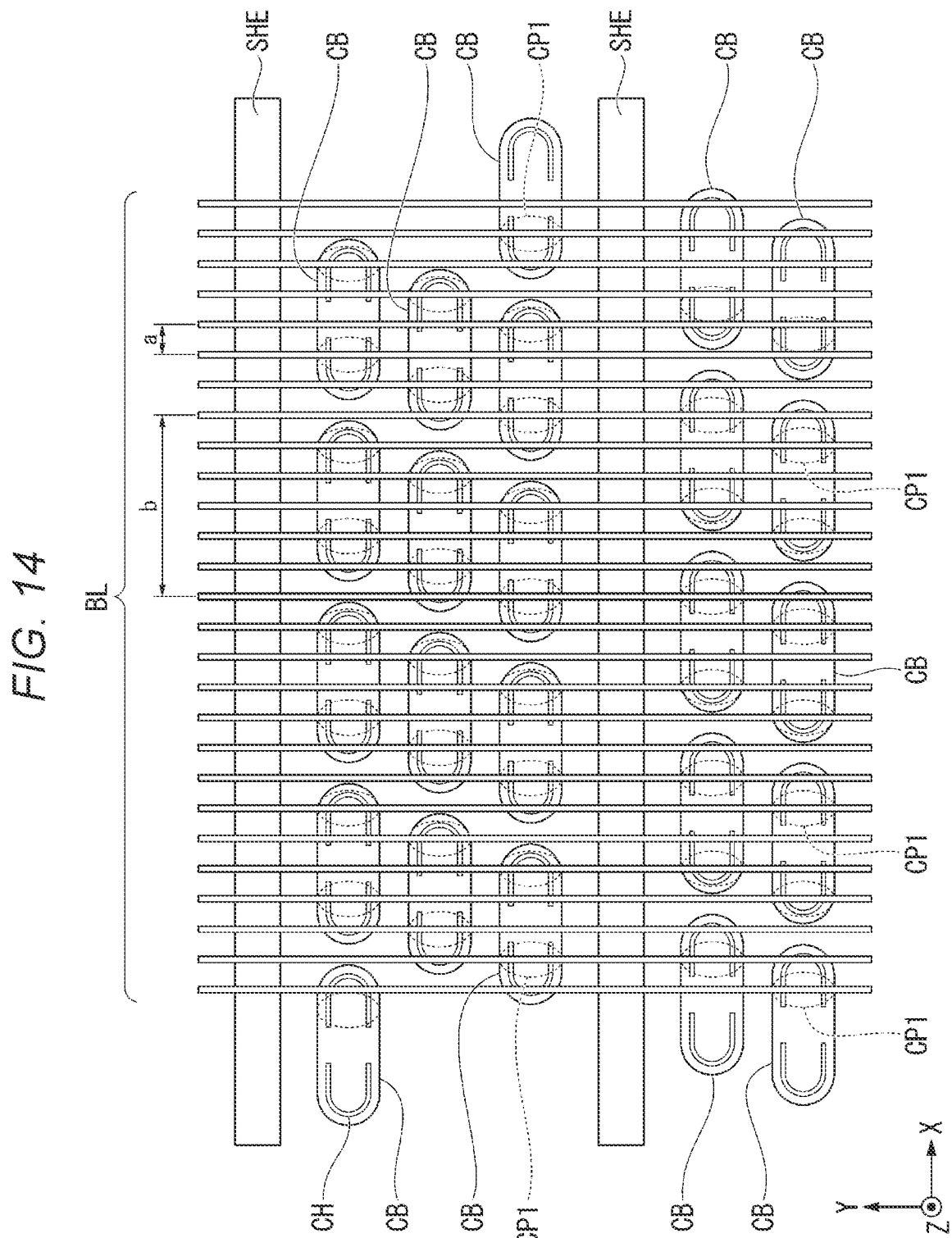
FIG. 14 is a plan view illustrating a disposition of cell blocks according to a fifth embodiment.

FIG. 14 illustrates a disposition configuration of the cell block sets 55 in a nonvolatile semiconductor storage device according to a fifth embodiment.

As illustrated in FIG. 14, the cell block sets 55 in three rows are located in the X direction in a region between the separation films SHE.

When the cell block sets 55 are located, front and rear intervals of the cell block sets located in the X direction in each row can all be equal as in the first or second embodiment. Between the rows of the cell block sets 55 adjacent to each other in the Y direction, positions at which the cell block sets 55 are formed are displaced sequentially by a given distance in the X direction.

Since two bit lines BL are necessary in each cell block set 55, as illustrated in FIG. 14, the plurality of bit lines BL are located in the X direction at intervals less than in the configuration illustrated in FIG. 13. For example, the bit lines BL in the semiconductor storage device with a minute structure in a present state can be formed with a line width of 20 nm and a space of the bit lines BL adjacent to each other in the X direction of FIG. 14 can be set to about 40 nm. Six bit lines can be located in a region including a distance between one cell block set 55 and another cell block set 55 adjacent in the X direction. As illustrated in FIG. 14, when the bit lines BL are located and the cell block sets 55 are located to be positionally displaced in three rows in a region between the separation films SHE, a distance b between one cell block set 55 and another cell block set 55 adjacent in the X direction can be set to about 240 nm.

In the configuration illustrated in FIG. 14, the contact plug CP1 is located in an elliptic shape at a position drawn in a chain line. In the configuration illustrated in FIG. 14, as the cell block sets 55 are located densely to be positionally displaced in three rows between the adjacent separation films SHE, as illustrated in FIG. 14, the bit lines BL are located to be connected to each cell block CB.

The disposition examples of the cell block sets 55, as illustrated in FIGS. 12 to 14, are merely given as examples. The disposition form of the cell block sets 55 is not particularly limited in accordance with the size of a space between the adjacent separation films SHE, a line width and a space of the bit lines BL, a length in a major axis direction and a width in the minor axis direction of the cell block set 55. Any disposition form may be adopted.

Manufacturing Method of Nonvolatile Semiconductor Storage Device

Next, a manufacturing method of the nonvolatile semiconductor storage device according to the first embodiment will be described with reference to FIGS. 15 to 57.

Figure 15:
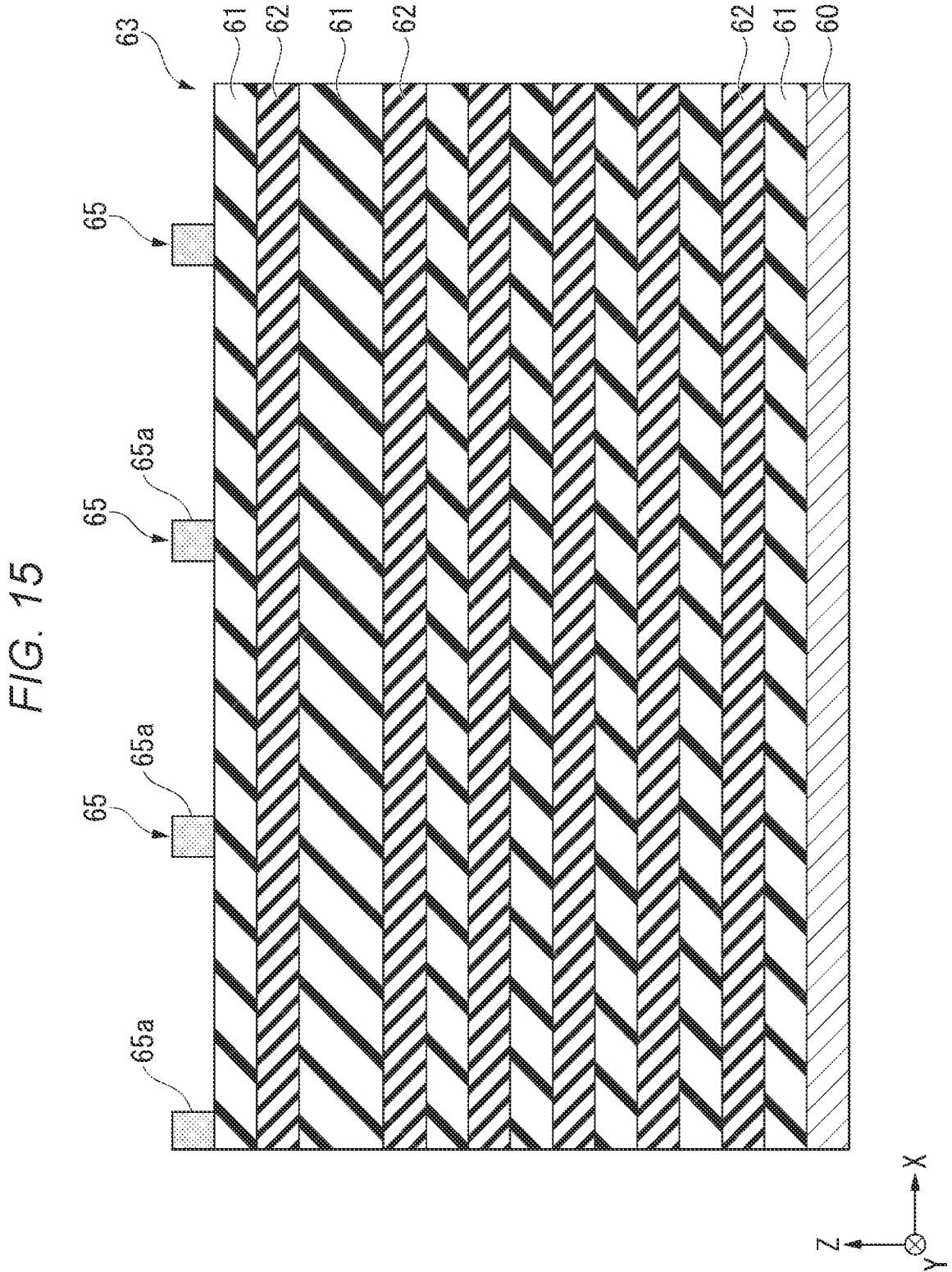
FIG. 15 is a cross-sectional view illustrating aspects of a manufacturing method of the cell array according to the first embodiment.

A source line 60 formed from a plate-shaped conductive film is formed on a substrate (not illustrated) with an insulating film interposed therebetween, as illustrated in FIG. 15, and a stacked body 63 in which a plurality of insulating films 61 and a plurality of sacrificial films 62 are alternately stacked on the source line 60 in the +Z direction is formed. The insulating films 61 are formed of, for example, a material that has a silicon oxide as a main component and the sacrificial films 62 are formed of, for example, a material that has a silicon nitride as a main component. The uppermost layer of the stacked body 63 is the insulating film 61. The second insulating film 61 counted from the insulating film 61 of the upper most layer is an insulating film slightly thicker than the other insulating films 61 and the other insulating films 61 are formed with an equal thickness.

Figure 16:
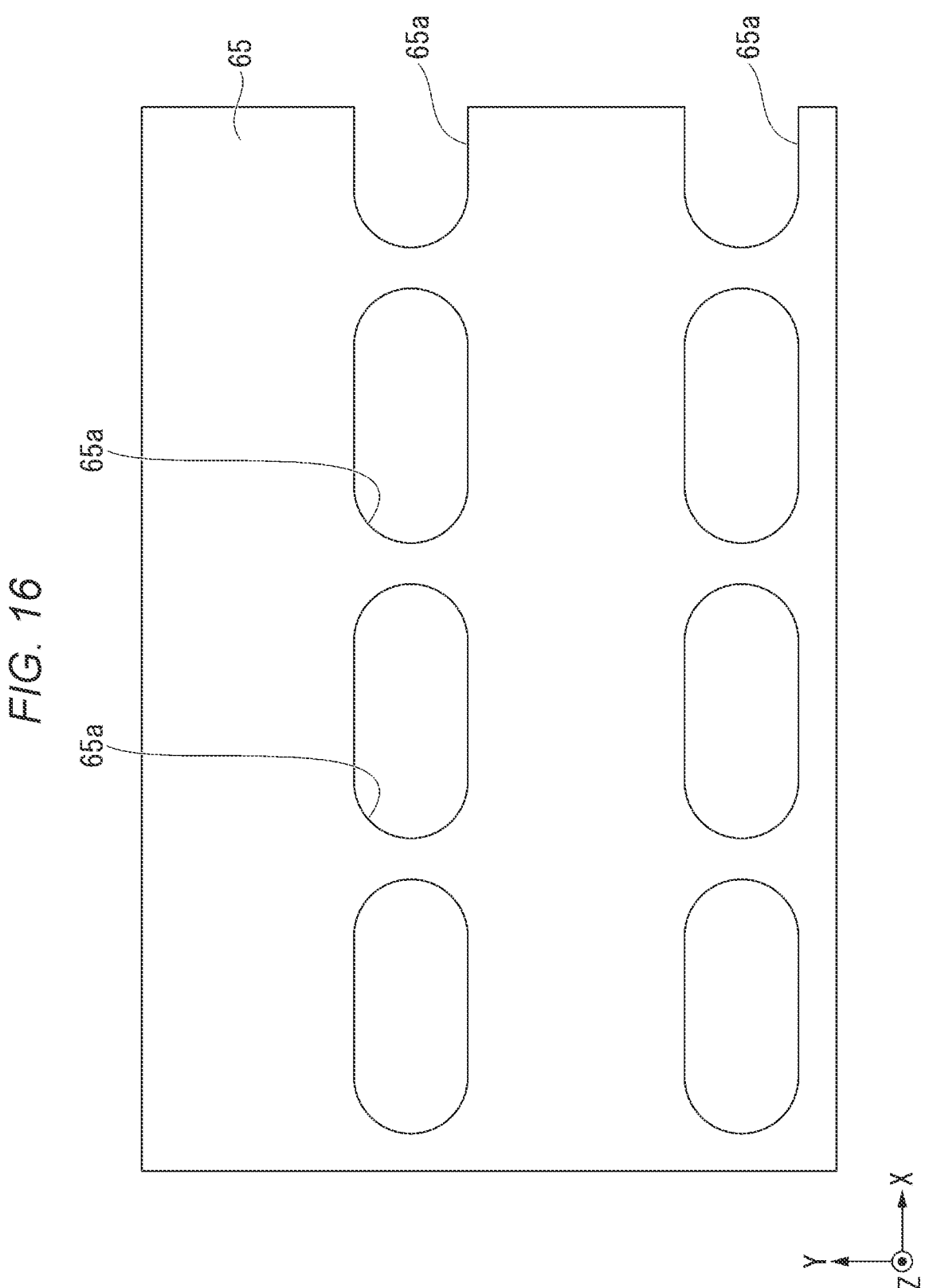
FIG. 16 is a plan view illustrating the manufacturing method of the cell array according to the first embodiment.

A first mask 65 for forming the memory holes MH is provided on the insulating film 61 of the upper most layer. FIG. 16 is a plan view illustrating the first mask 65. FIG. 16 illustrates a state in which a plurality of through-holes 65a that have a racetrack shape in a plan view to form memory holes are formed in two rows. In this example, to describe a manufacturing method of the cell blocks CB according to the first embodiment, as illustrated in FIG. 3, a plurality of major axes of the plurality of through-holes 65a that have the racetrack shape are formed in the X direction to be spaced at predetermined intervals in the X direction in the first mask 65. A plurality of through-hole rows in which the plurality of through-holes 65a are formed in the X direction are spaced at predetermined intervals in the Y direction. In FIG. 16, to facilitate the drawing, only two through-hole rows are displayed, but the number of necessary through-hole rows is provided in accordance with the number of cell block sets 55 provided in the entire nonvolatile semiconductor storage device 1.

Figure 17:
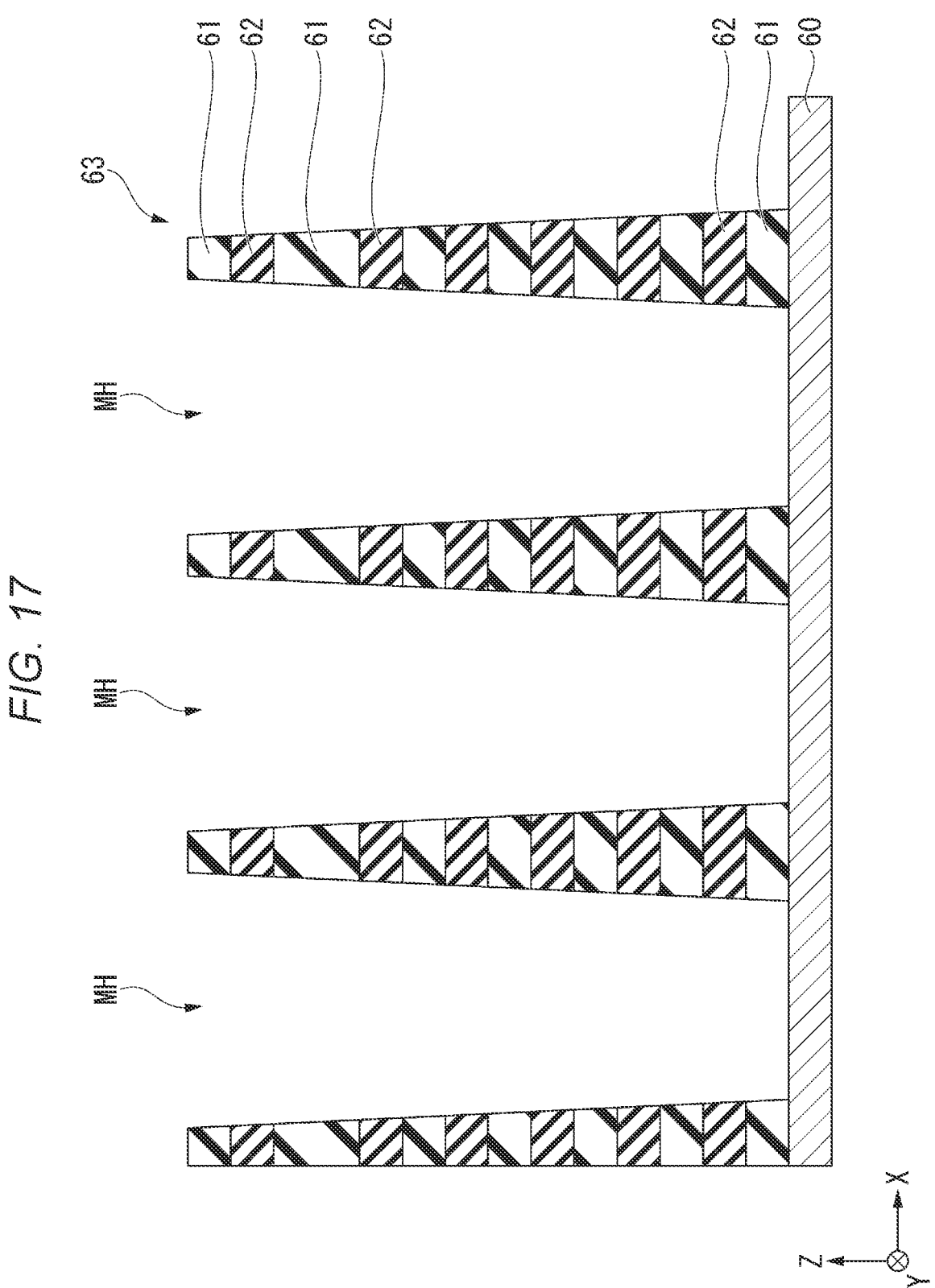
FIG. 17 is a cross-sectional view illustrating the manufacturing method of the cell array according to the first embodiment.
Figure 18:
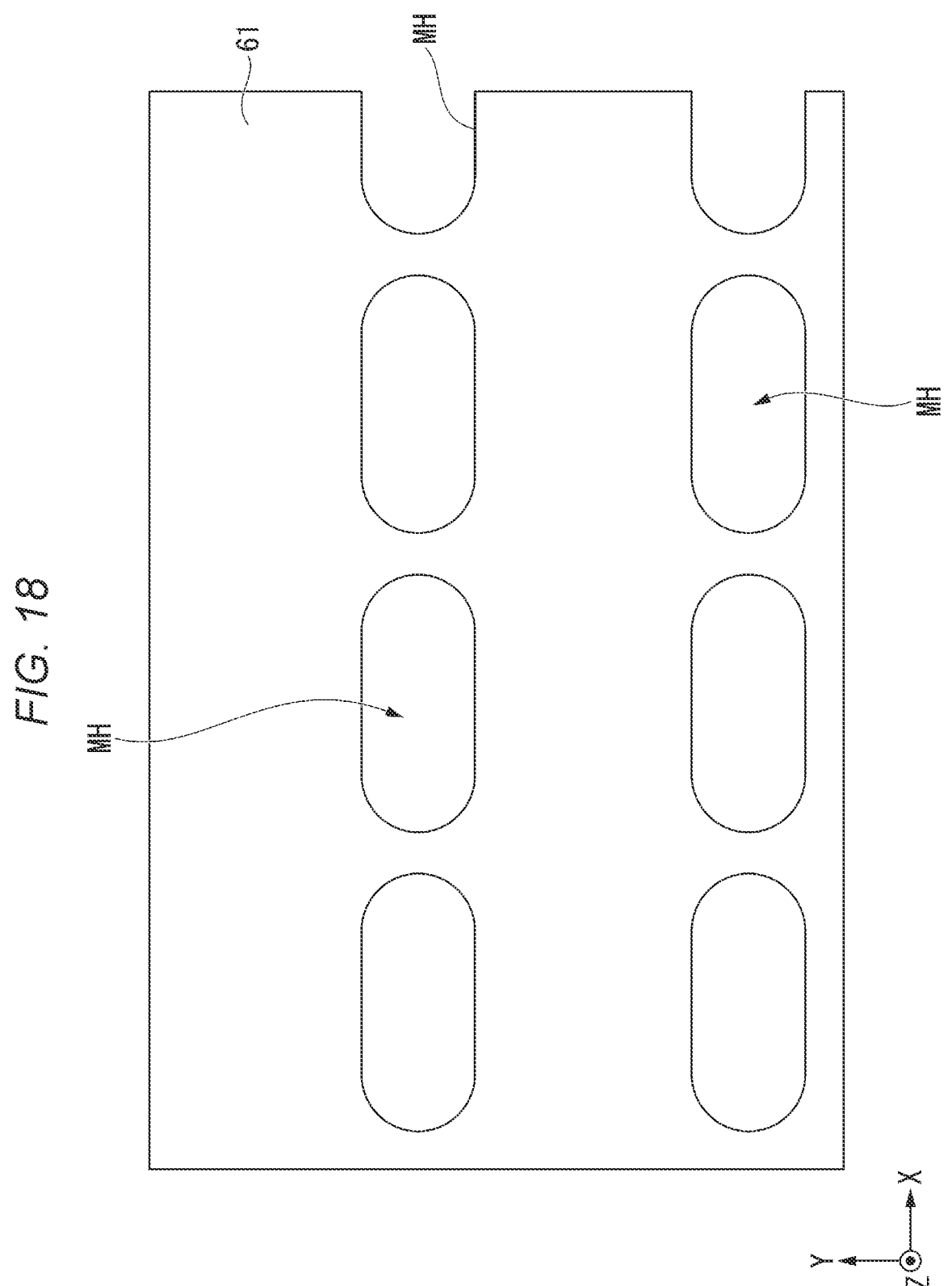
FIG. 18 is a plan view illustrating the manufacturing method of the cell array according to the first embodiment.

The memory holes MH reaching the source lines SL are formed in the stacked body 63, as illustrated in FIG. 17, by performing a method such as reactive ion etching via the first mask 65. FIG. 18 illustrates the shape of the memory holes MH in a plan view.

Figure 19:
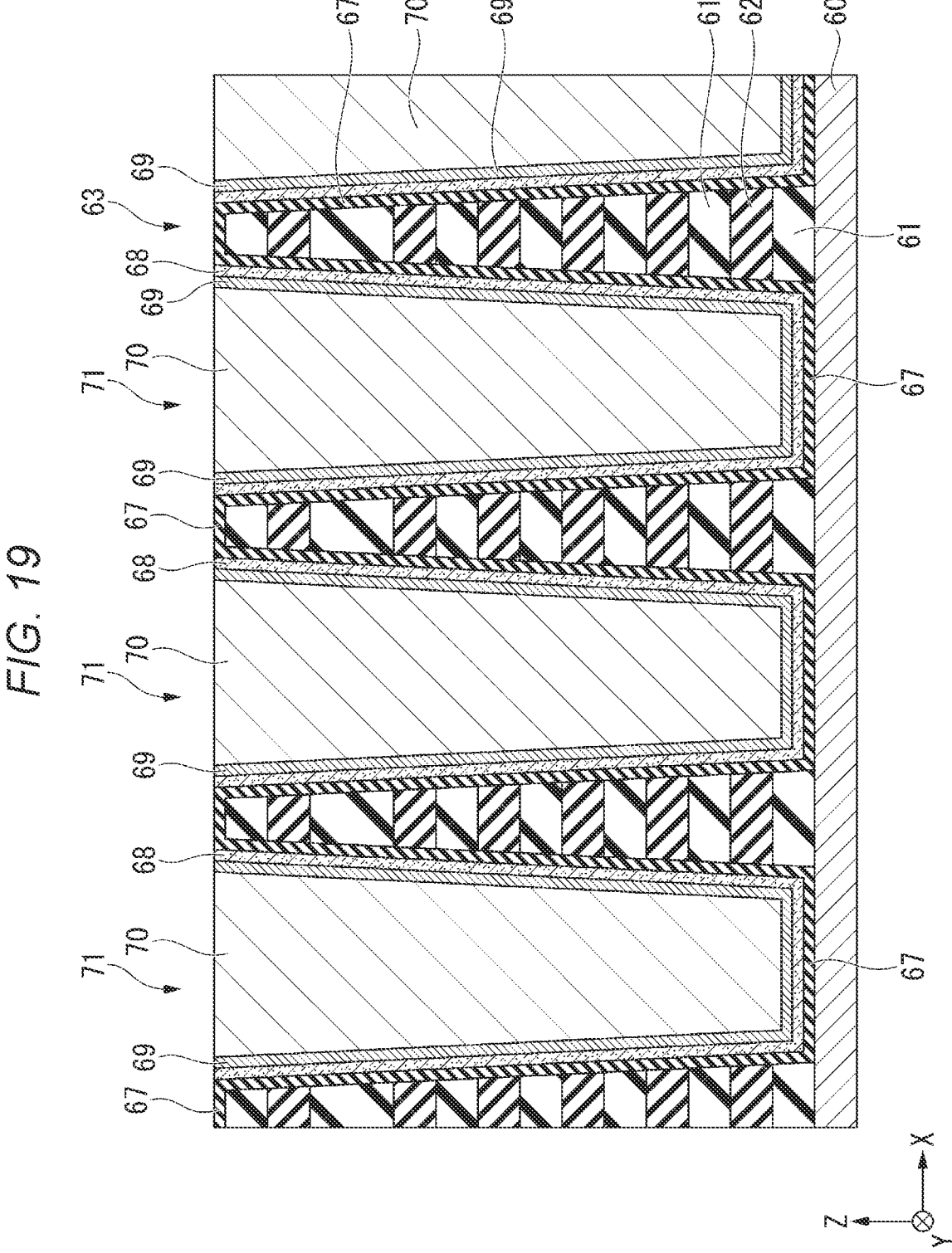
FIG. 19 is a cross-sectional view illustrating the manufacturing method of the cell array according to the first embodiment.

Subsequently, as illustrated in FIG. 19, a gate insulating film 67, a semiconductor film 68, and a resistance change film 69 are deposited sequentially on the surface of the stacked body 63 and inside the memory holes MH and remaining portions in the memory holes are filled (embedded) with a metal film 70. The gate insulating film 67 is formed of, for example, HfOx (a hafnium oxide), the semiconductor film 68 is formed of, for example, polycrystalline silicon, and the resistance change film 69 is formed of, for example, a phase-change material such as a chalcogenide-based material (Ge, Sb, or Te). The metal film 70 is formed of a metal material such as tungsten.

When film thicknesses of the insulating film 67, the semiconductor film 68, and the resistance change film 69 are thinner than the inner diameter of the memory holes MH, these films are deposited on the bottom surface and the inner circumferential surface of the memory holes MH. The metal film 70 is formed thickly to occupy most of the inside of the memory holes.

Figure 20:
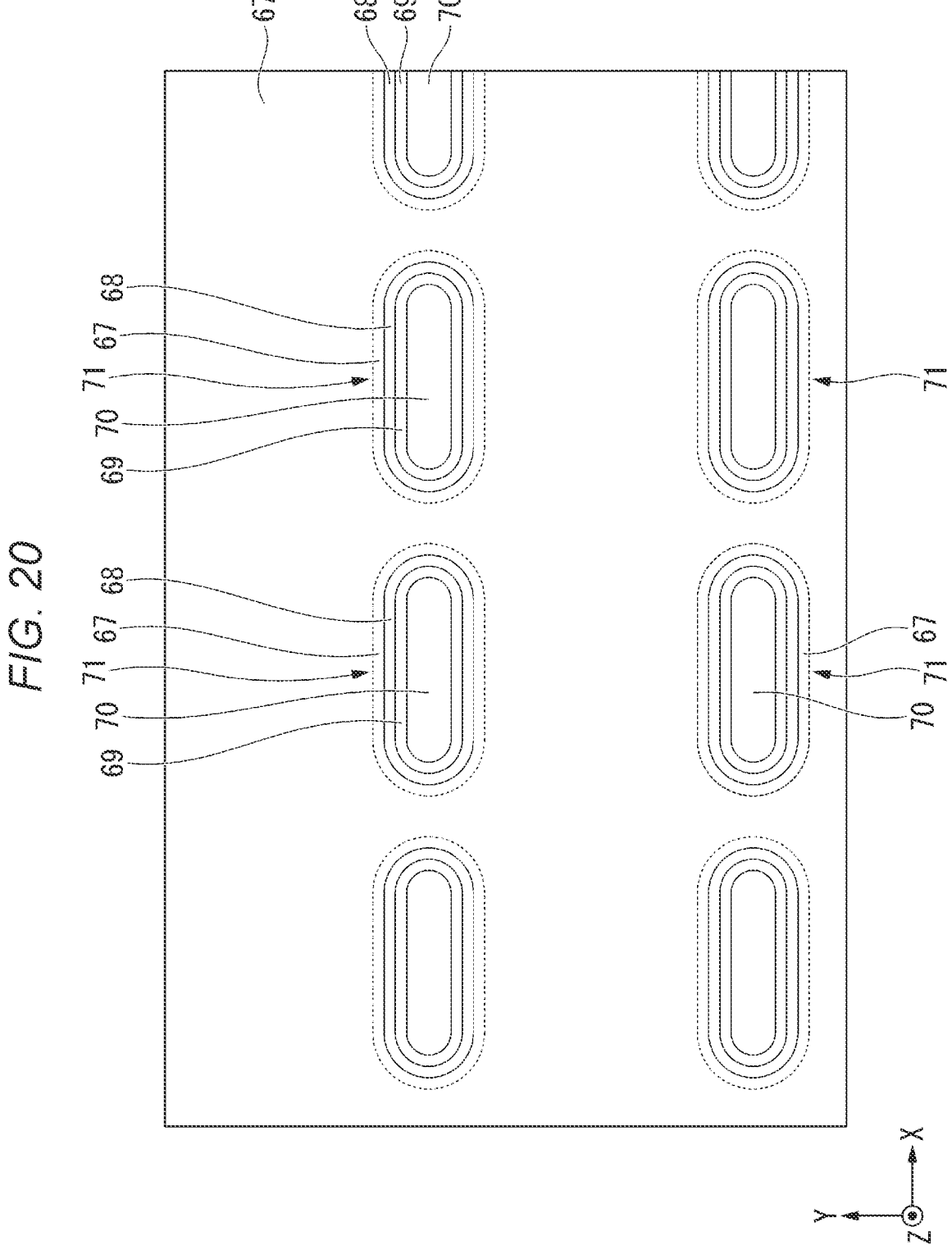
FIG. 20 is a plan view illustrating the manufacturing method of the cell array according to the first embodiment.

After each film is formed, processing is performed so that the surface of the stacked body 63 is flattened by chemical-mechanical polishing and only the gate insulating film 67 remains on the surface of the stacked body 63 outside the regions where the memory holes MH are formed. FIG. 19 illustrates a cross section of the stacked body 63 in the vertical direction after the chemical-mechanical polishing and FIG. 20 is a plan view illustrating the stacked body 63. Inside each memory hole MH, a filled body 71 that is formed from the metal film 70, the resistance change film 69, the semiconductor film 68, and the gate insulating film 67 and has a racetrack shape in a plan view fills the memory hole MH.

Figure 21:
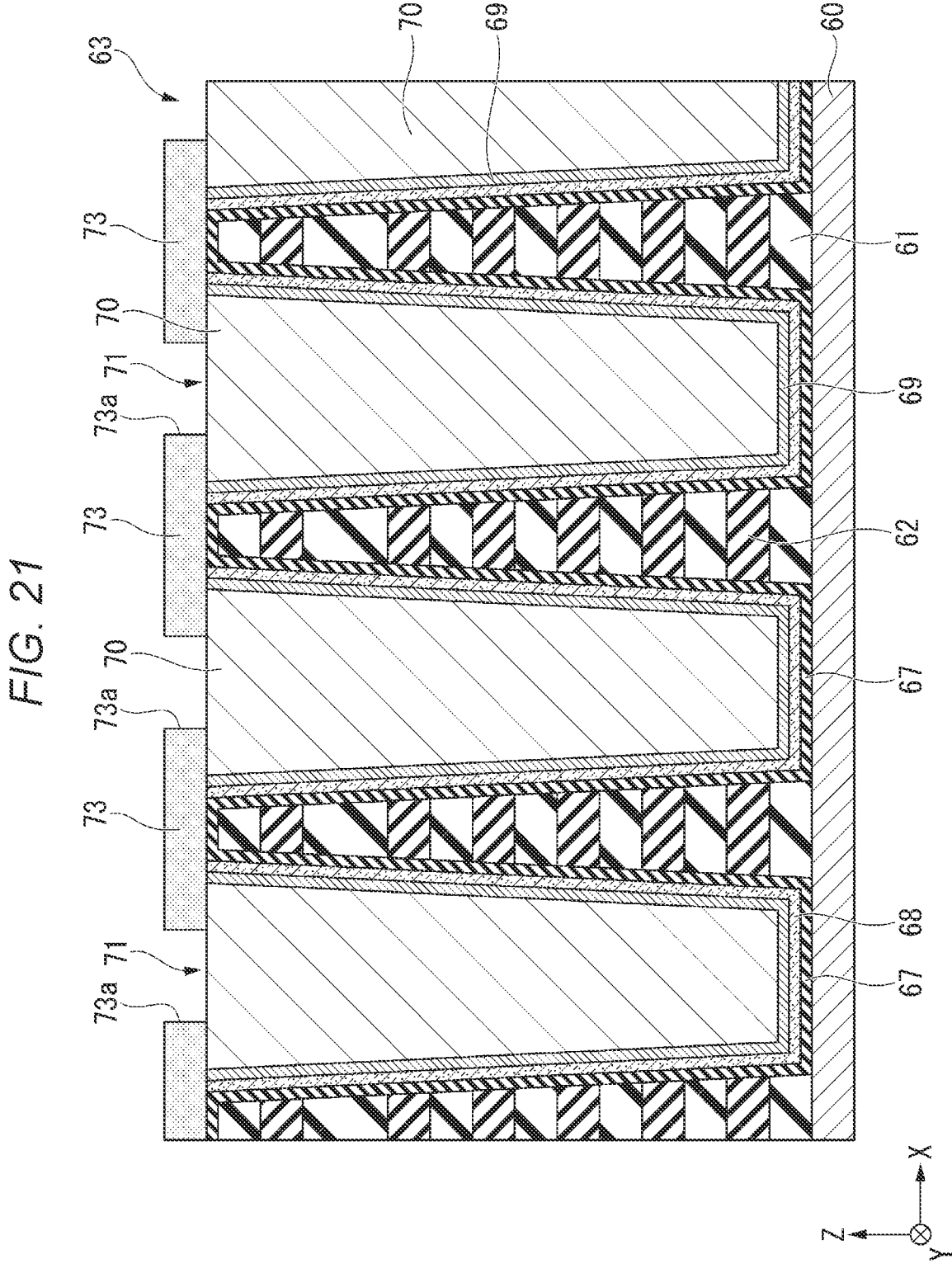
FIG. 21 is a cross-sectional view illustrating the manufacturing method of the cell array according to the first embodiment.
Figure 22:
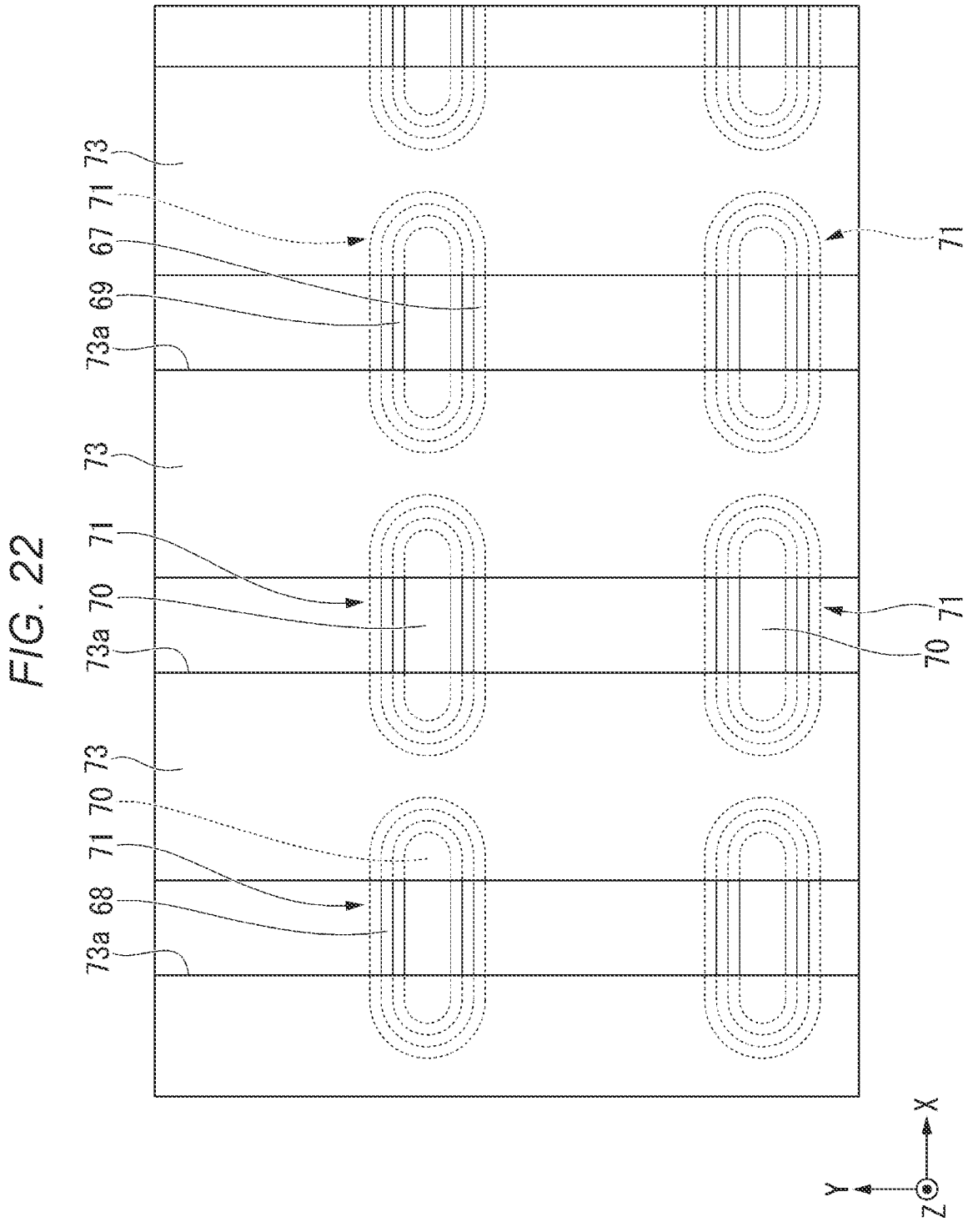
FIG. 22 is a plan view illustrating the manufacturing method of the cell array according to the first embodiment.

As illustrated in FIGS. 21 and 22, a second mask 73 for forming the sub-hole is formed on the stacked body 63. In the second mask 73, a plurality of slit-shaped through-holes 73a are located to cross a middle portion of each filled body 71 in the major axis direction in a plan view of the filled body 71 exposed to the surface of the stacked body 63 is disposed. Each through-hole 73a is located in the Y direction to be spaced at predetermined intervals in the X direction. The width of each through-hole 73a in the X direction illustrated in FIG. 22 is set to about ⅓ of the length of the filled body 71 in the X direction.

Figure 23:
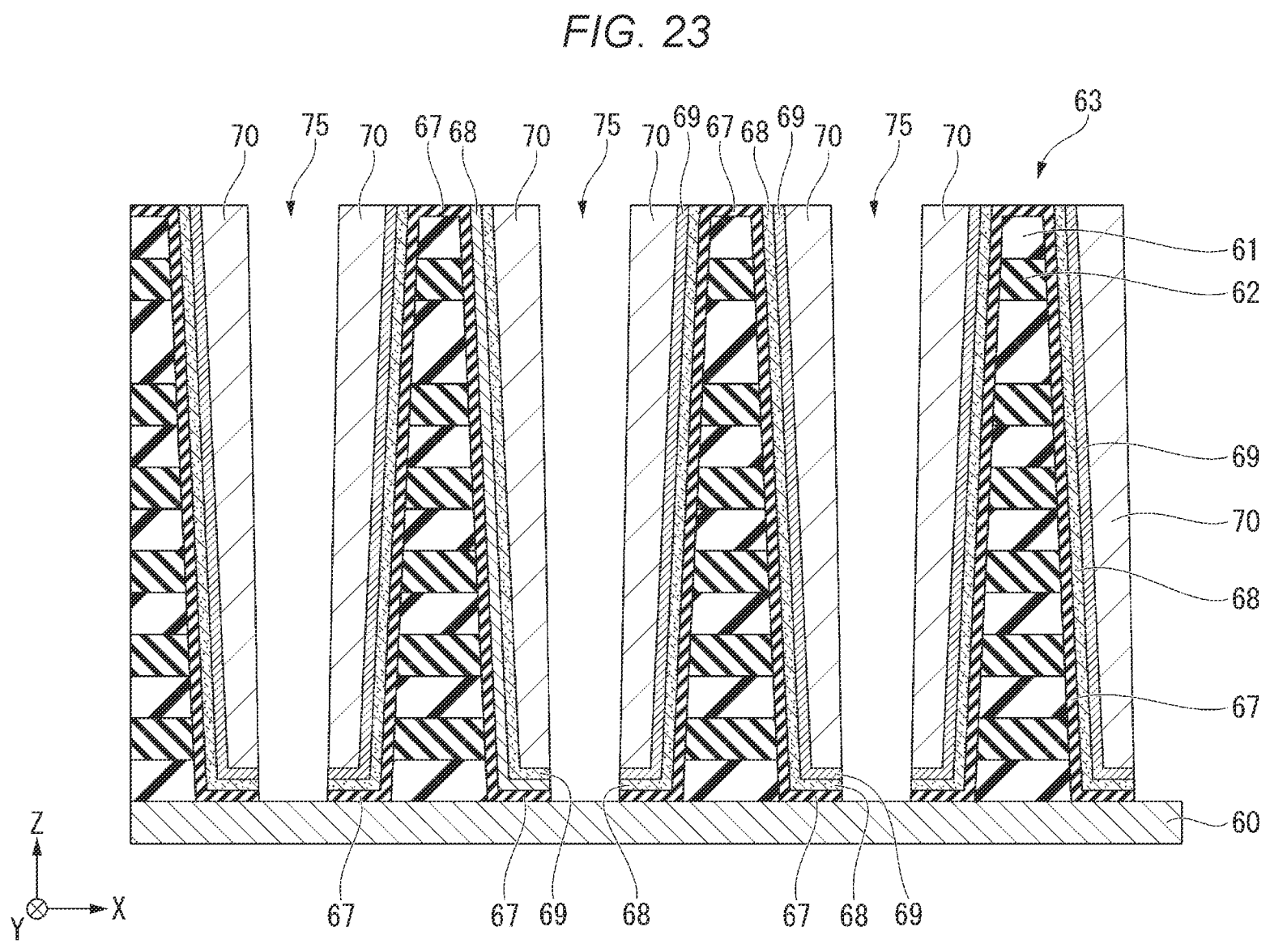
Figure 24:
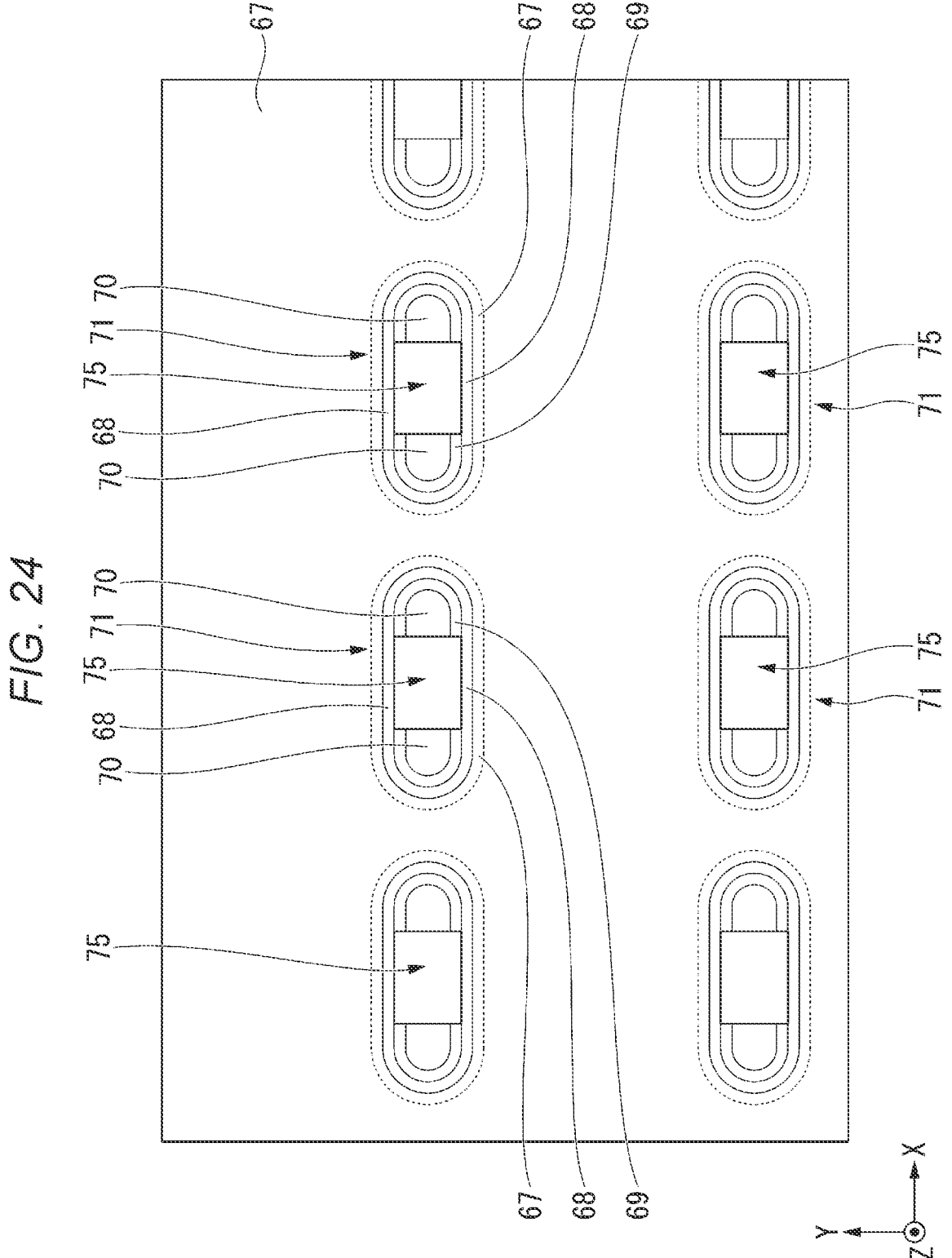
FIG. 24 is a plan view illustrating the manufacturing method of the cell array according to the first embodiment.

Subsequently, as illustrated in FIG. 23, first sub-holes 75 reaching the source line SL are formed in the stacked body 63 by a method such as reactive ion etching. FIG. 24 illustrates a shape of the first sub-hole 75 in a plan view. The first sub-hole 75 penetrates through the metal film 70 in the Z direction, further penetrate through the resistance change film 69, the semiconductor film 68, and the gate insulating film 67 on the −Z side, and reach the source line 60.

As illustrated in FIG. 24, the first sub-hole 75 is rectangular in a plan view and penetrates in the Z direction through a middle portion of the filled body 71 that has a racetrack shape in a plan view in the X direction. An inner width of the first sub-hole 75 in the X direction is a width in which the U-shaped resistance change film 69 is generated on both sides of the first sub-hole 75 in the X direction when the first sub-hole 75 is formed. An inner width of the first sub-hole 75 in the Y direction is a width obtained by adding film thicknesses of the resistance change films 69 to a length of the metal film 70 in the Y direction.

When the first sub-hole 75 is formed, the resistance change film 69 on the inner surface side of the filled body 71 in the Y direction is removed and the semiconductor film 68 is exposed to the inner surface side. Since a part of the resistance change film 69 is removed by forming the first sub-hole 75, the resistance change film 69 that has a U shape in a plan view is formed on both sides of the first sub-hole 75 in the X direction.

Figure 25:
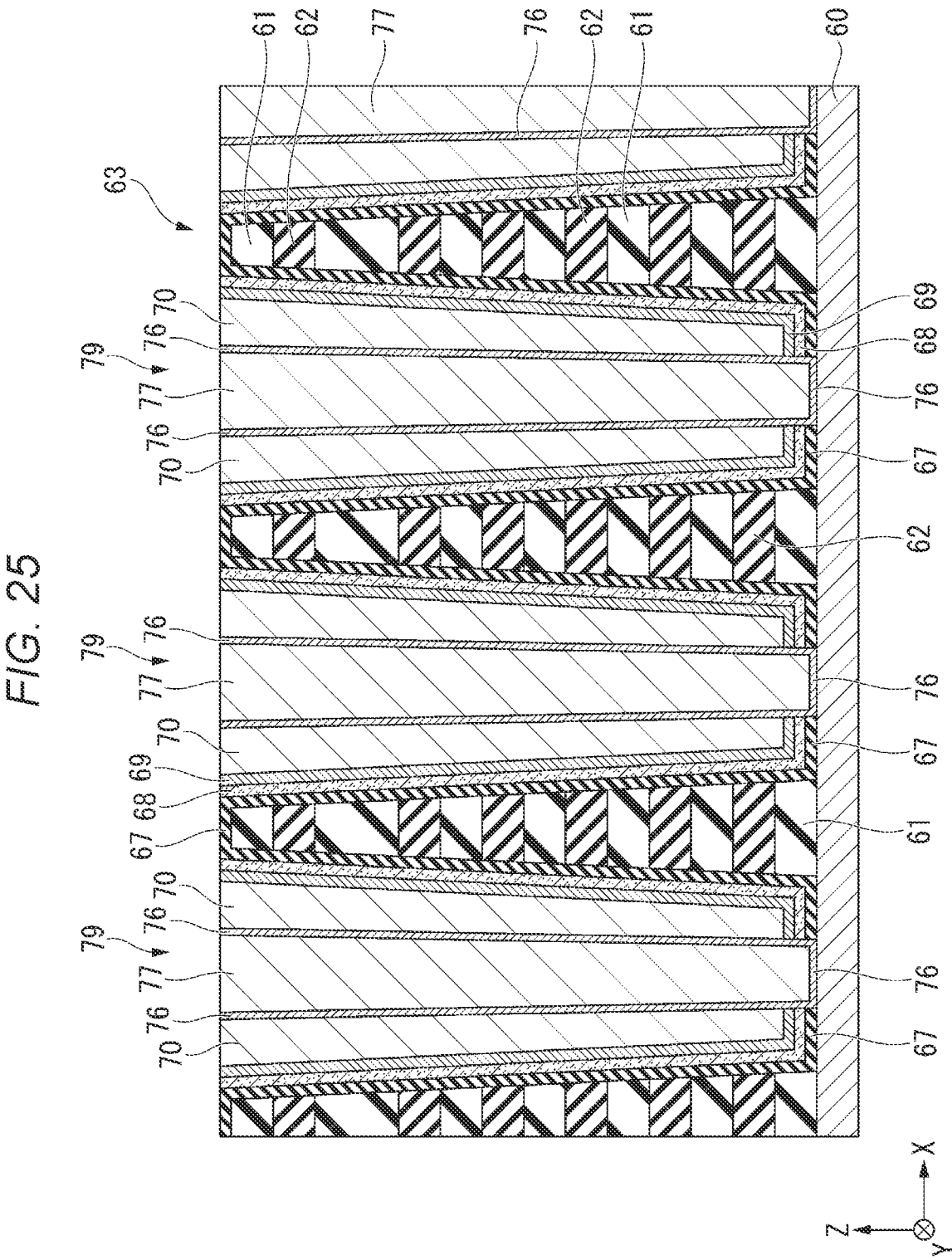
FIG. 25 is a cross-sectional view illustrating the manufacturing method of the cell array according to the first embodiment.
Figure 26:
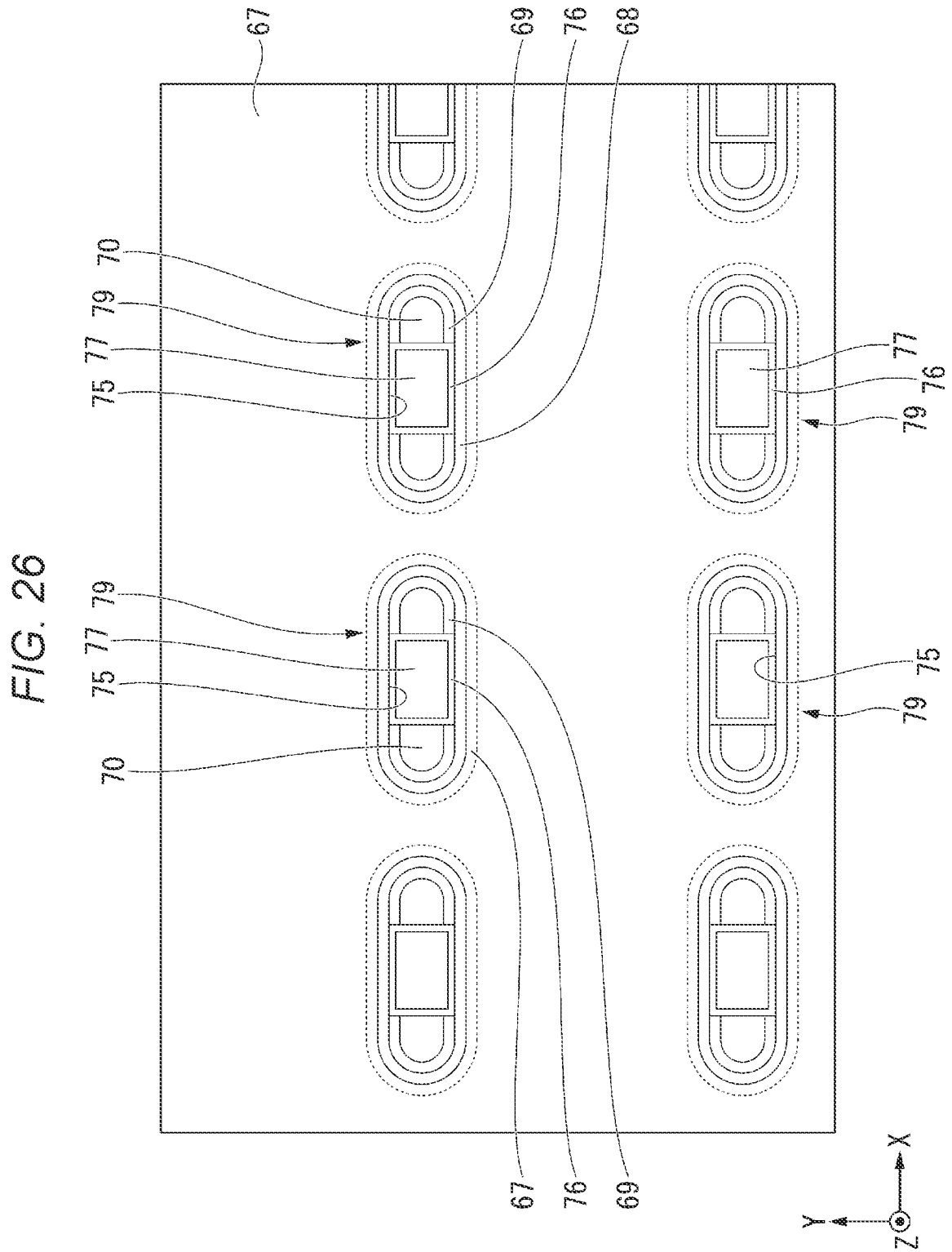
FIG. 26 is a plan view illustrating the manufacturing method of the cell array according to the first embodiment.

As illustrated in FIGS. 25 and 26, a conductive film 76 formed of a titanium nitride is formed on the inner surface side of the first sub-hole 75 and a metal layer 77 formed of a metal material such as tungsten fills a remaining portion of the first sub-hole 75. Since the bottom portion of the first sub-hole 75 penetrates through the resistance change film 69, the semiconductor film 68, and the gate insulating film 67 and reaches the source line 60, the conductive film 76 is in contact with the source line 60. Therefore, the metal layer 77 is electrically connected to the source line 60 via the conductive film 76.

As illustrated in FIG. 26, since the conductive film 76 and the metal layer 77 are in the first sub-hole 75, the filled body 71 that has a racetrack shape in a plan view illustrated in FIGS. 20 to 22 is replaced with a filled body 79 that has a racetrack shape in a plan view.

Figure 27:
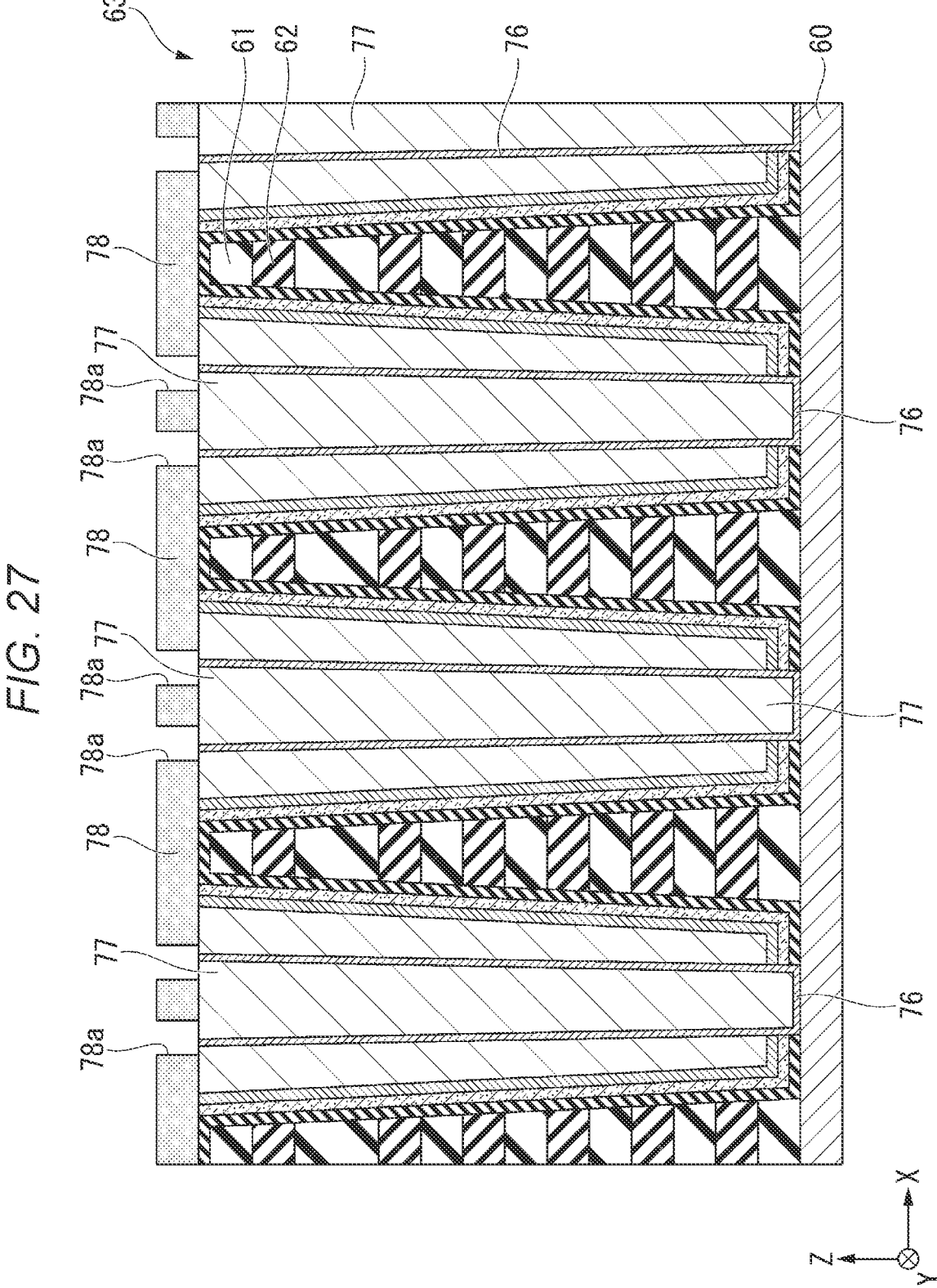
FIG. 27 is a cross-sectional view illustrating the manufacturing method of the cell array according to the first embodiment.
Figure 28:
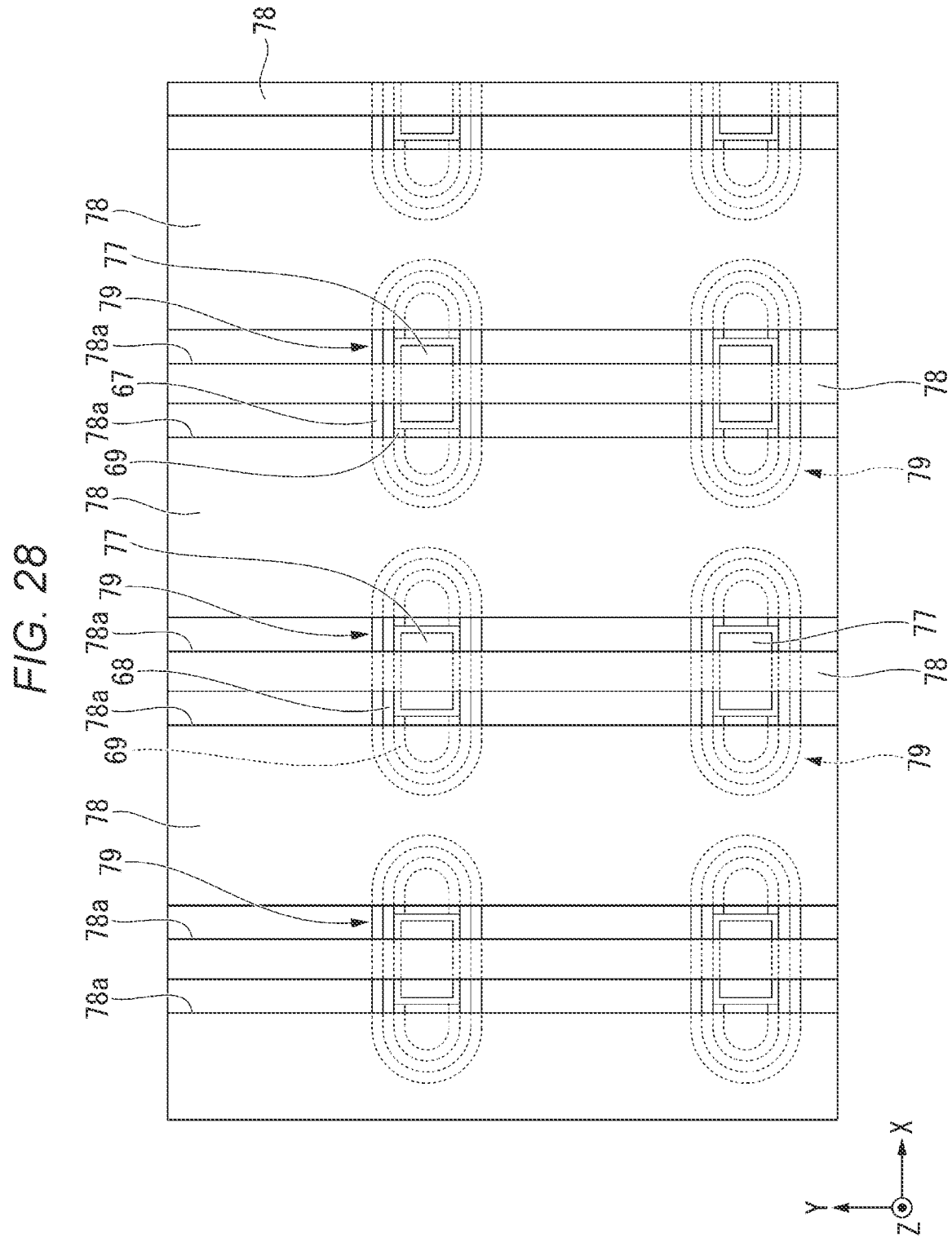
FIG. 28 is a plan view illustrating the manufacturing method of the cell array according to the first embodiment.

As illustrated in FIGS. 27 and 28, a processing third mask 78 is formed on the stacked body 63. In the third mask 78, a plurality of slit-shaped through-holes 78a including both ends of each metal layer 77 in the X direction are formed in a plan view of the filled body 79 exposed to the surface of the stacked body 63. Each through-hole 78a is located in the Y direction to be intermittent in the X direction. A width of each through-hole 78a in the X direction is a width including an end portion of the metal layer 77 in the X direction, a part of the conductive film 76 adjacent to the end portion, and a part of the metal film 70 adjacent to the conductive film 76 in the filled body 79 in a plan view.

Figure 29:
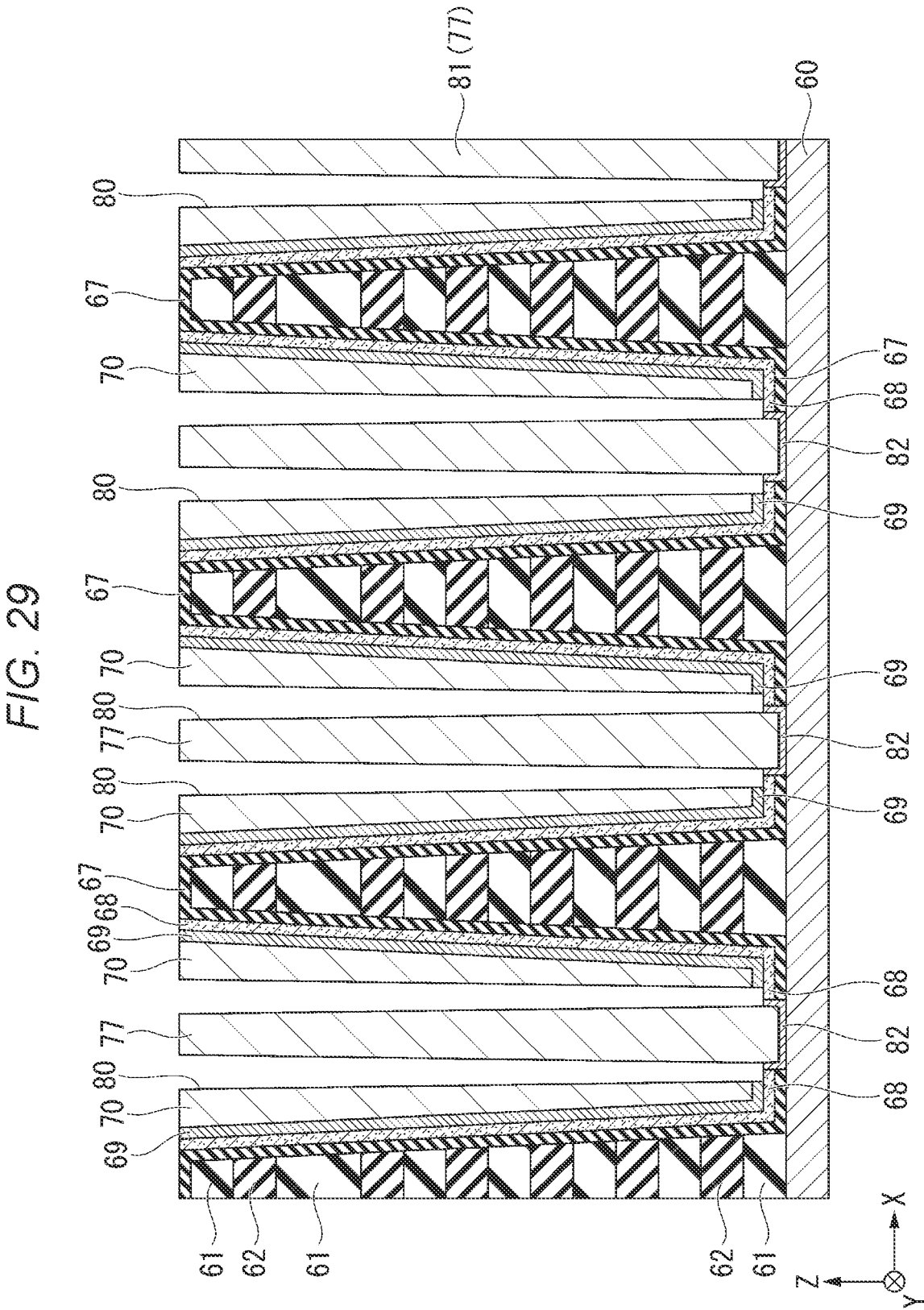
FIG. 29 is a cross-sectional view illustrating the manufacturing method of the cell array according to the first embodiment.
Figure 30:
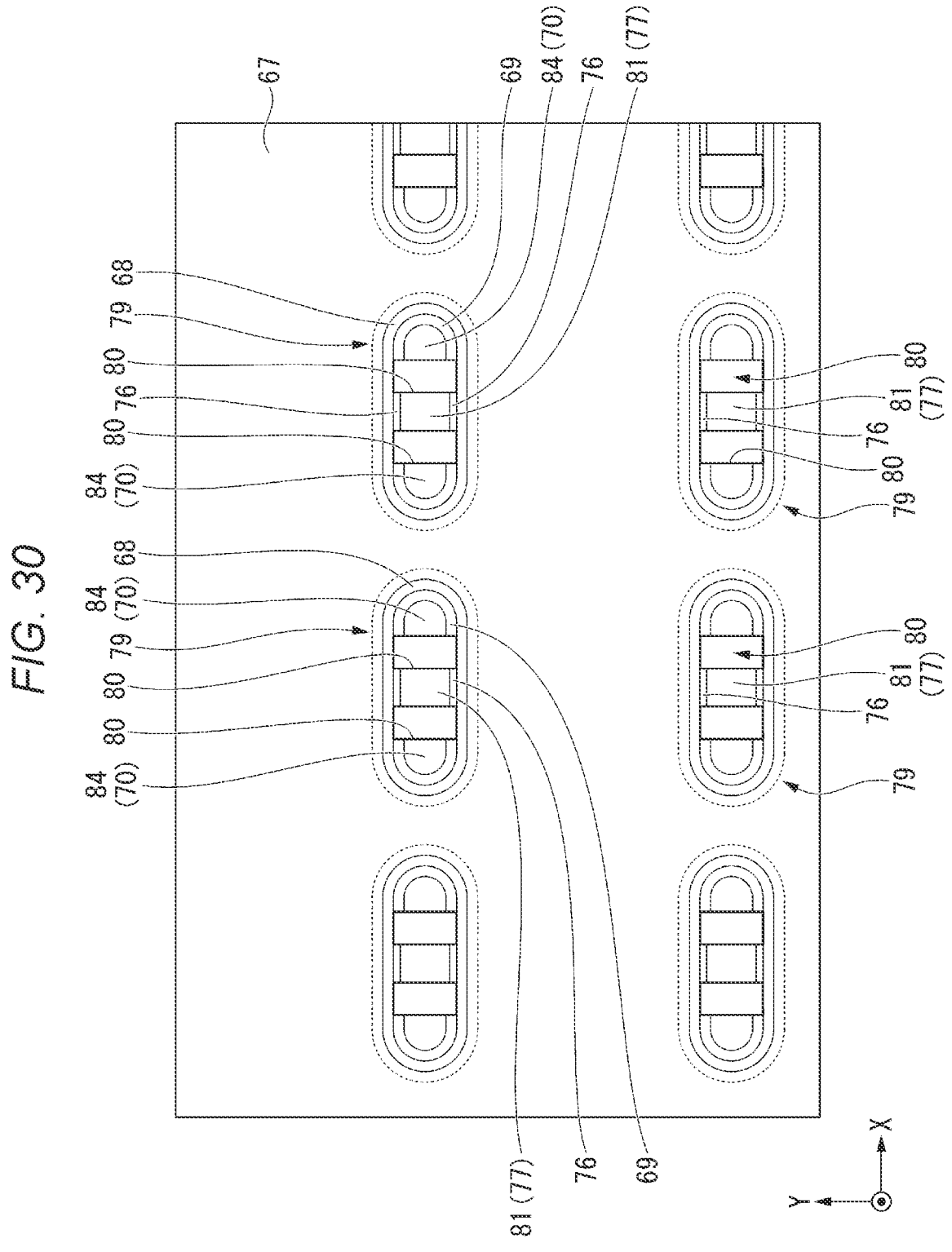
FIG. 30 is a plan view illustrating the manufacturing method of the cell array according to the first embodiment.

Subsequently, second sub-holes 80 illustrated in FIG. 29 are formed in the memory holes MH by performing a method such as reactive ion etching. FIG. 30 illustrates a shape of the second sub-hole 80 in a plan view. The second sub-hole 80 penetrates through the metal film 70 in the Z direction, further penetrate through the resistance change film 69 on the −Z side, and reach the semiconductor film 68 at the bottom of the memory hole.

As illustrated in FIG. 30, the second sub-holes 80 are rectangular in a plan view and penetrate in the Z direction through a position of the filled body 79 that has a racetrack shape in a plan view and is separated in the X direction.

An inner width of the second sub-hole 80 in the X direction is about a fraction of a length of the filled body 79 in the X direction. An inner width of the second sub-hole 80 in the Y direction is slightly less than a width of the filled body 79 in the Y direction. For example, the inner width of the second sub-hole 80 in the Y direction is considered to be a width obtained by adding the film thicknesses of the resistance change films 69 to the length of the metal film 70 in the Y direction.

When the second sub-hole 80 is formed, parts of the resistance change films 69 are removed in the Y direction. A part of the semiconductor film 68 is exposed to the inner surface side of the second sub-hole 80 in the Y direction.

Here, a local source line column 81 is formed between the second sub-holes 80 adjacent to each other in the X direction. The local source line column 81 has such a shape that both sides of the metal layer 77 is interposed between conductive films 76 in the Y direction. A conductive film 82 formed from a bottom of the conductive film 76 is formed on the bottom sides of the second sub-holes 80. The conductive film 82 is drawn in a U shape on the cross section illustrated in FIG. 29. The local source line column 81 is connected to the source line 60 via the conductive film 82. On both right and left sides of the local source line column 81 in the X direction, local bit line columns 84 formed from the metal film 70 are separated with the second sub-hole 80 interposed therebetween.

Figure 31:
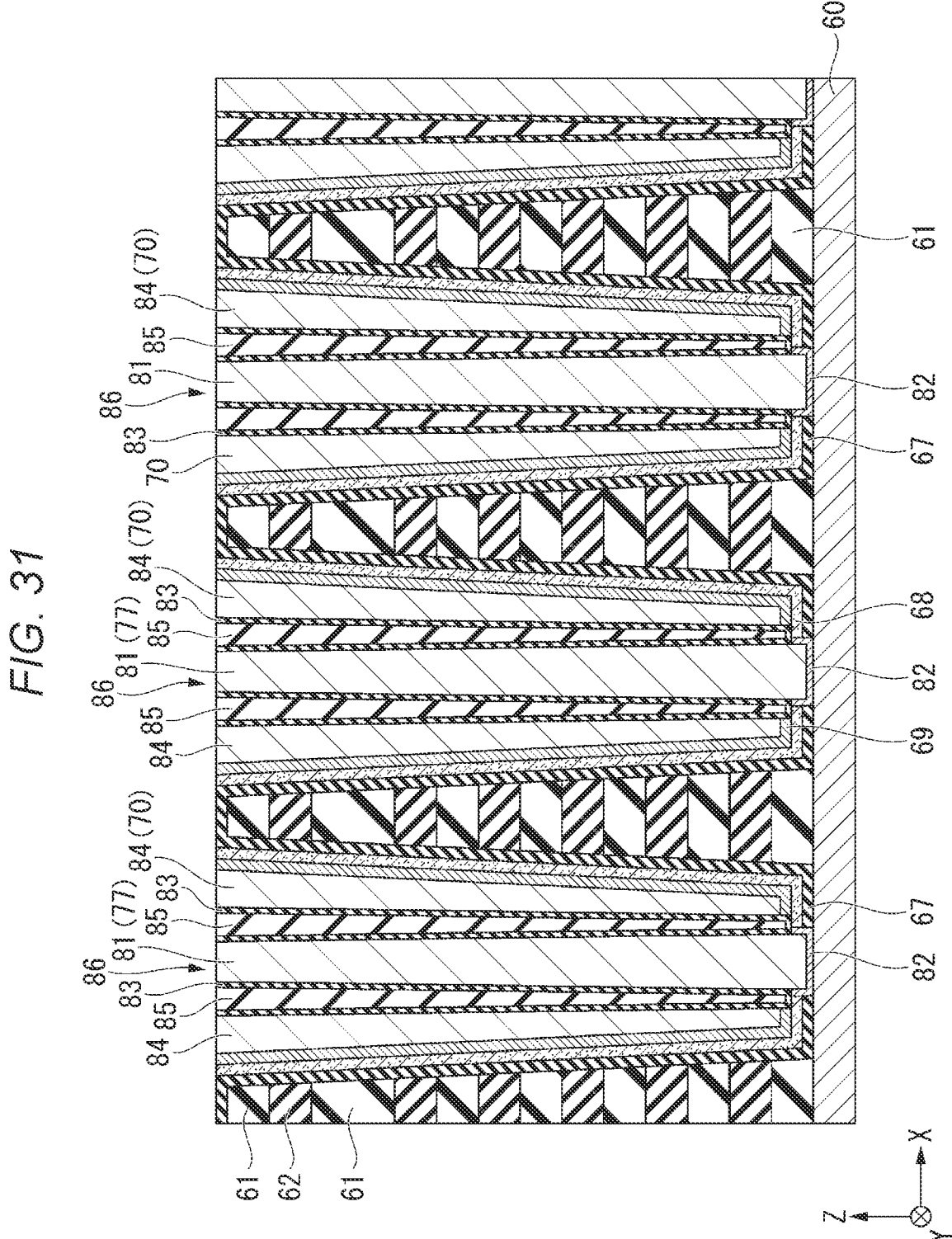
FIG. 31 is a cross-sectional view illustrating the manufacturing method of the cell array according to the first embodiment.
Figure 32:
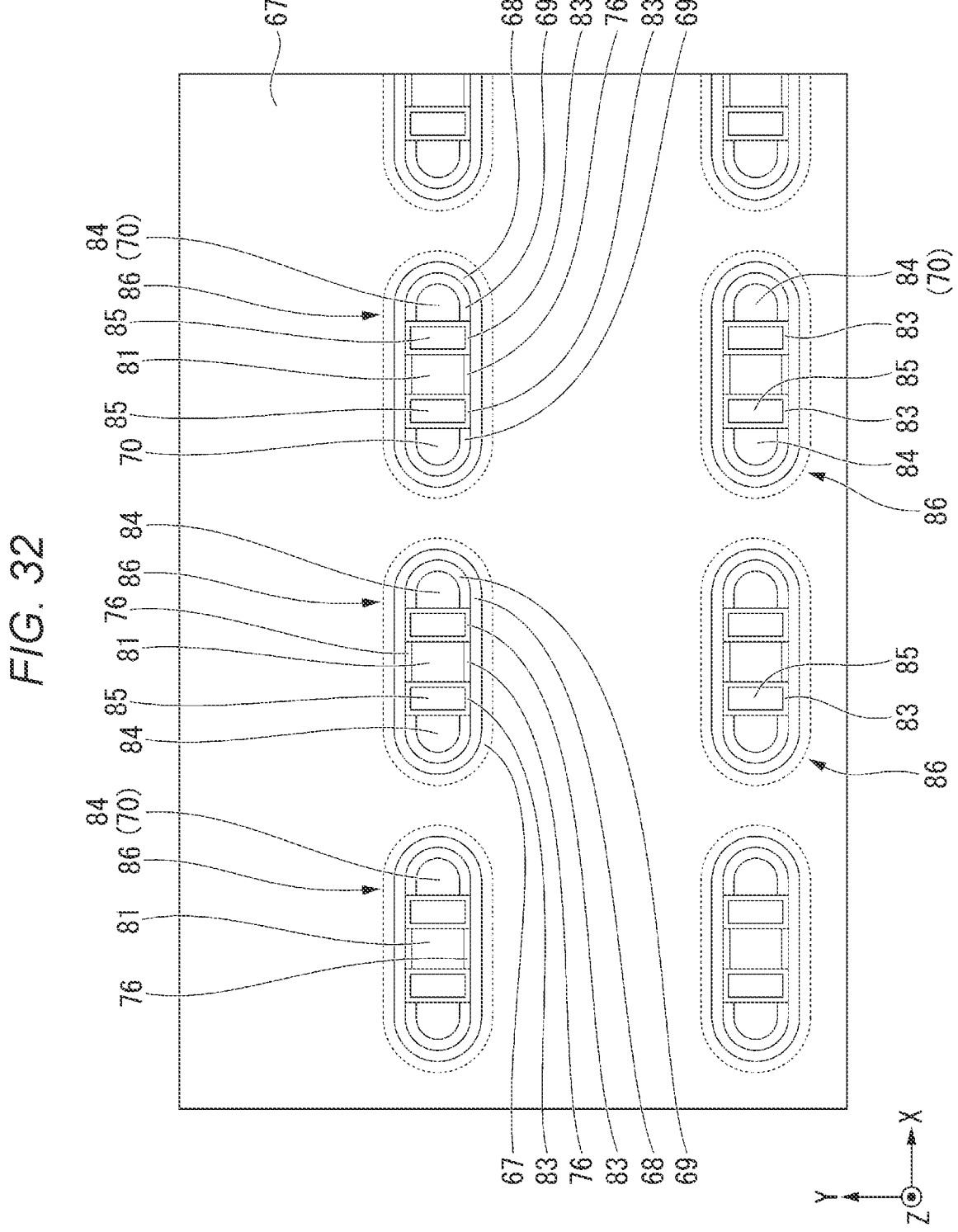
FIG. 32 is a plan view illustrating the manufacturing method of the cell array according to the first embodiment.

As illustrated in FIGS. 31 and 32, a thin liner film 83 formed of a silicon nitride is formed on the inner surface sides of the second sub-holes 80, and hole inner-insulating film 85 is formed of a silicon oxide in a remaining portion of the second sub-hole 80. Since the bottom of the second sub-hole 80 on the −Z side penetrates through the resistance change film 69 and reaches the semiconductor film 68, the −Z side end portion of the liner film 83 reaches the semiconductor film 68 and the conductive film 82. Since the liner film 83 is formed thinly, the inner-insulating film 85 formed in the liner film 83 penetrates through the bottom of the resistance change film 69 on the −Z side and is formed at a position close to the semiconductor film 68 at the bottom of the second sub-hole 80 on the −Z side.

As illustrated in FIGS. 31 and 32, the liner film 83 and the hole inner-insulating film 85 are in the second sub-hole 80. Therefore, the filled body 79 that has a racetrack shape in a plan view, as illustrated in FIGS. 25 to 28, is replaced with a filled body 86 that has a racetrack shape in a plan view.

Figure 33:
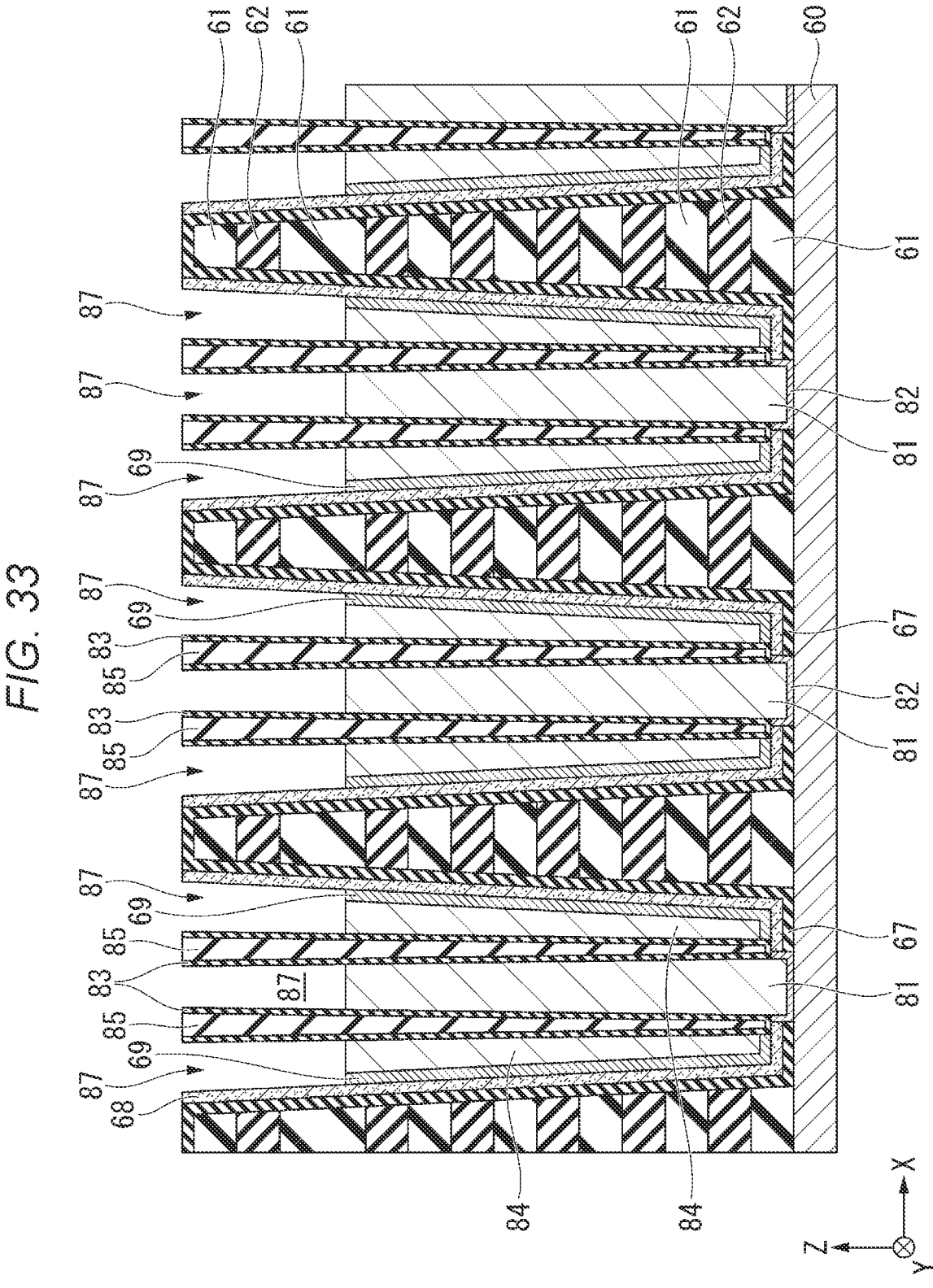
FIG. 33 is a cross-sectional view illustrating the manufacturing method of the cell array according to the first embodiment.
Figure 34:
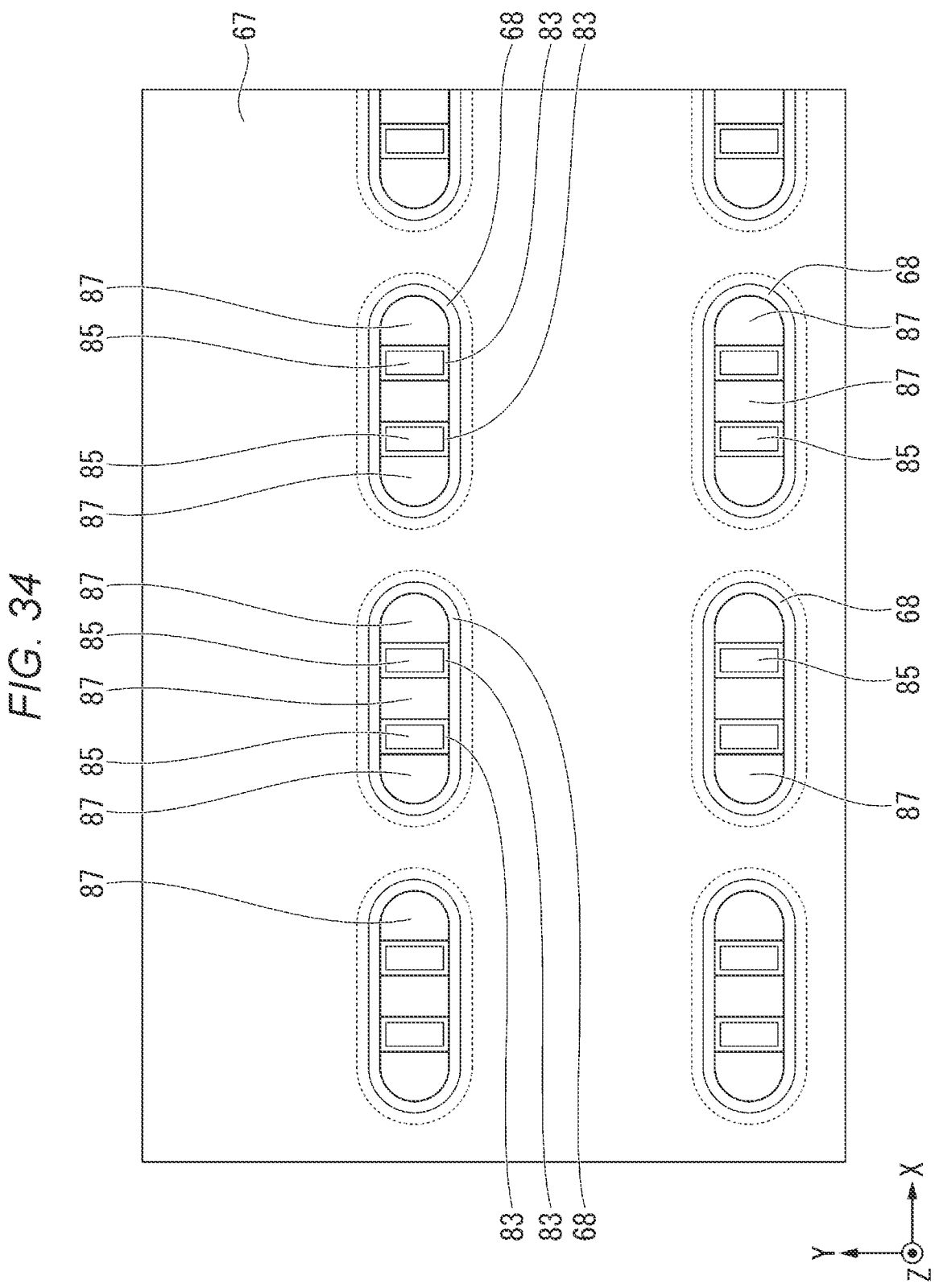
FIG. 34 is a plan view illustrating the manufacturing method of the cell array according to the first embodiment.

As illustrated in FIGS. 33 and 34, in the filled body 86 formed in the memory hole MH, the local bit line column 84 and the local source line column 81 on the upper side (the +Z side) of the memory hole are removed by etching. A contact hole 87 can be formed by the etching. The contact hole 87 passes through the insulating film 61 of the upper most layer on the +Z side in the stacked body 63 and the sacrificial film 62 under the insulating film 61 and is formed to the bottom side (−Z side) of the insulating film 61 under one film. Inside the contact hole 87, the hole inner-insulating film 85 the circumference of which is surrounded by the liner film 83 remains in a column shape.

Figure 35:
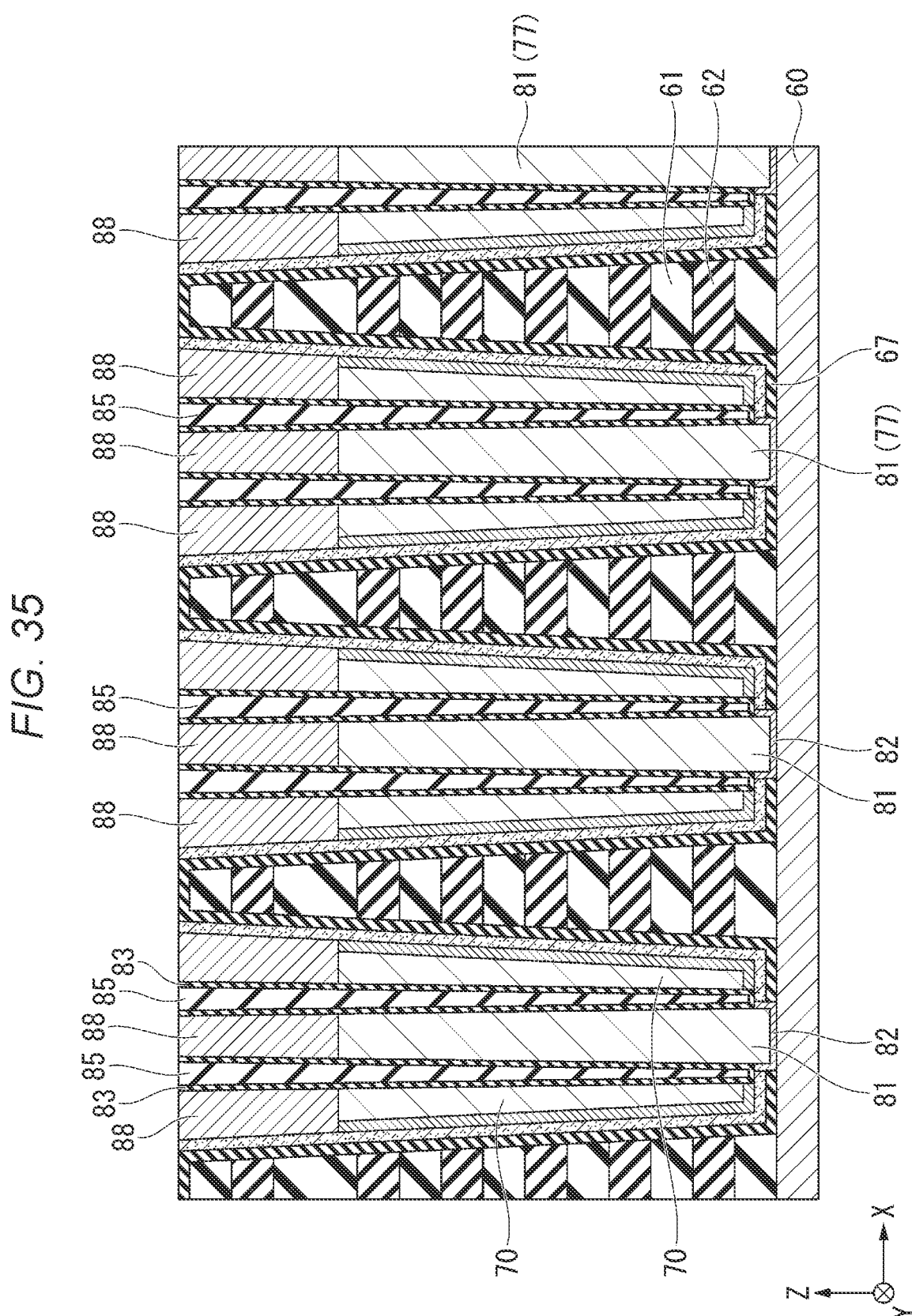
FIG. 35 is a cross-sectional view illustrating the manufacturing method of the cell array according to the first embodiment.
Figure 36:
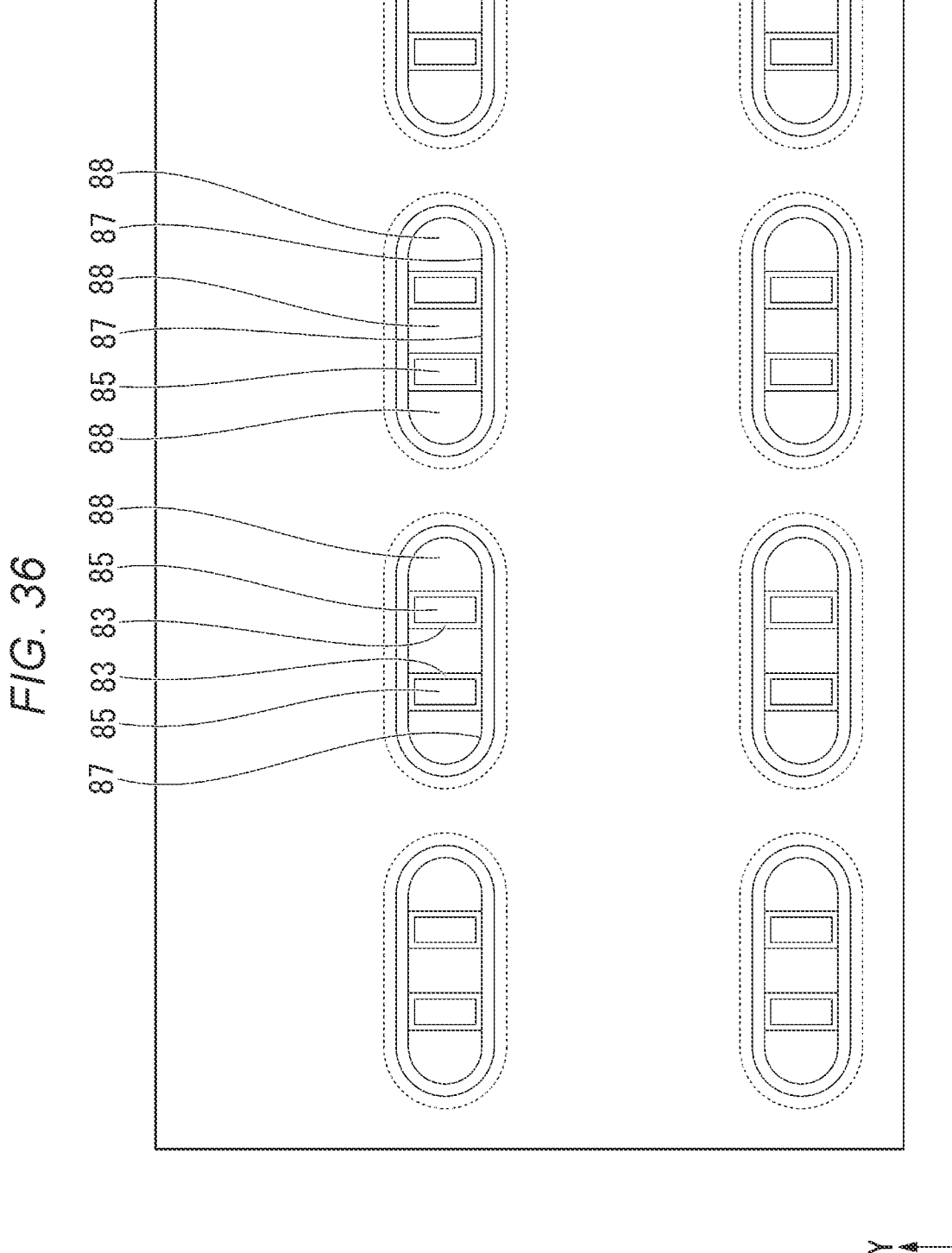
FIG. 36 is a plan view illustrating the manufacturing method of the cell array according to the first embodiment.

As illustrated in FIGS. 35 and 36, a conductive material layer 88 filling upper end the contact hole 87 is formed. The conductive material layer 88 is formed of a conductive material containing a metal such as TiN or TaN or a metal silicide formed by metal ions such as cobalt or nickel ions being implanted in a silicon film, which is different from the material of the semiconductor film CH.

Figure 37:
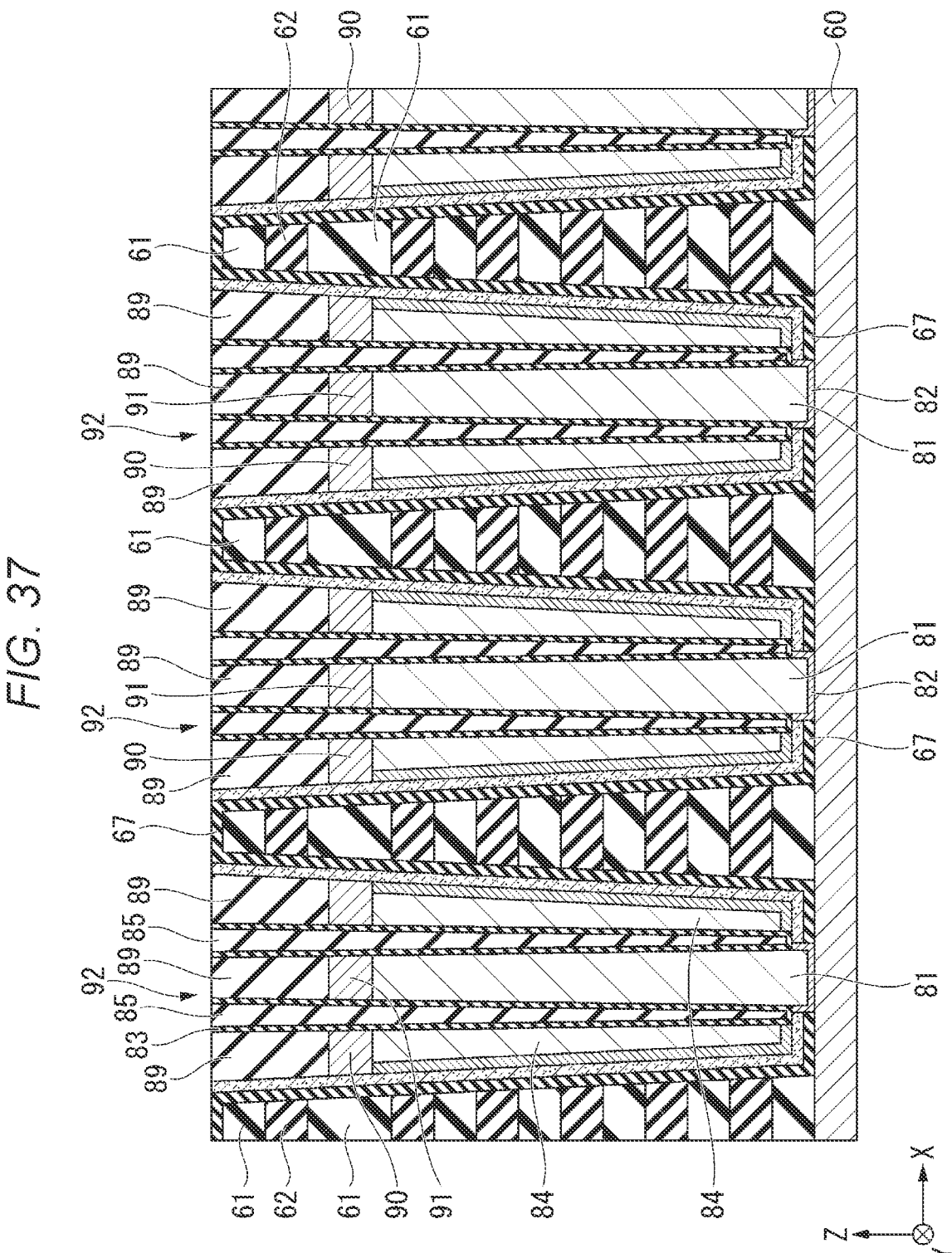
FIG. 37 is a cross-sectional view illustrating the manufacturing method of the cell array according to the first embodiment.

In the conductive material layer 88 illustrated in FIG. 35, a hole inner-insulating film 89 illustrated in FIG. 37 is formed by removing the upper side (the +Z side) by etching and then filling a hole formed by the etching with an insulation material. The hole inner-insulating film 89 passes through a region in which the insulating film 61 of the uppermost layer is formed and a region in which the sacrificial film 62 under the insulating film 61 is formed in the stacked body 63 and is formed to a position corresponding to the upper side (the +Z side) in a region in which the insulating film 61 under one film is formed.

On the lower side (the −Z side) of the hole inner-insulating film 89, a conductive contact 90 corresponding to a thickness of about half the adjacent insulating film 61 is formed. The conductive contact 90 is in contact with a +Z side tip end of the local bit line column 84. A conductive portion 91 formed of a material similar to the conductive contact 90 is in contact with a +Z side tip end of the local source line column 81.

Figure 38:
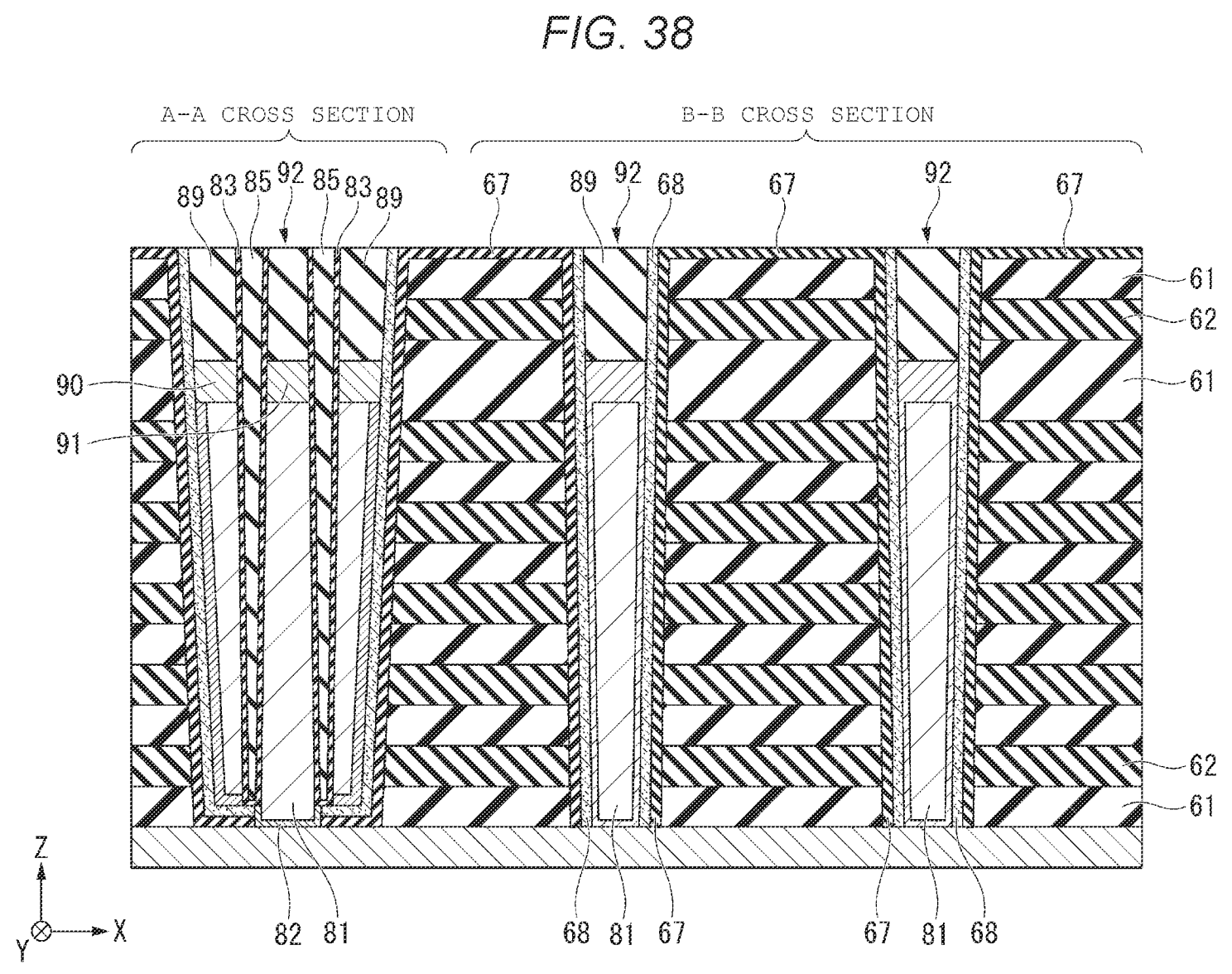
Figure 39:
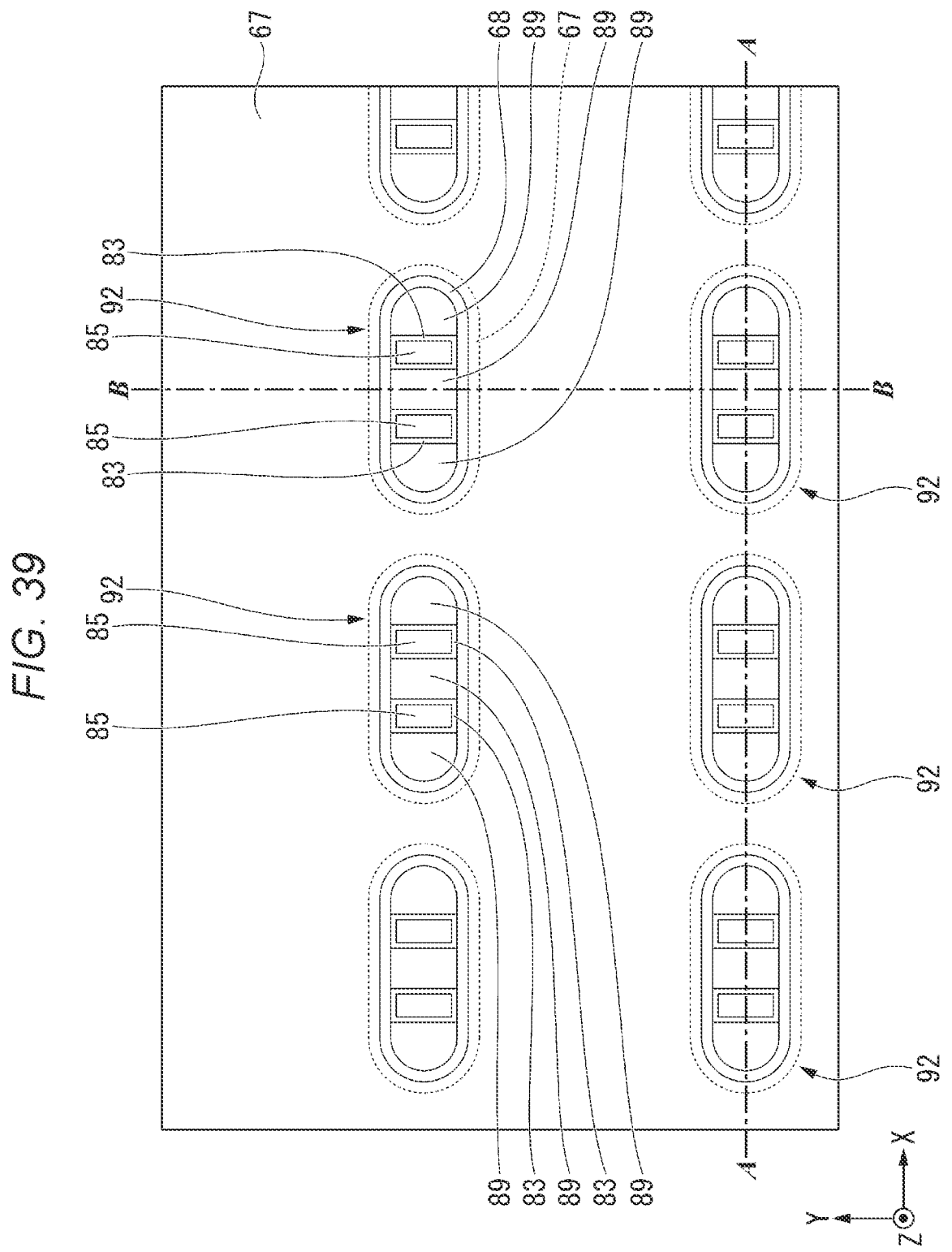
FIG. 39 is a plan view illustrating the manufacturing method of the cell array according to the first embodiment.

FIG. 39 illustrates a plan view of the configuration illustrated in FIG. 37 and FIG. 38 collectively illustrates a part of a cross section (A-A cross section) along the line A-A in FIG. 39 and a cross section along the line B-B (BB cross section) in FIG. 39. The cross section along the line A-A in FIG. 39 is a cross section along an XZ plane and a cross section along the line B-B is a cross section along a YZ plane.

As illustrated in FIG. 37, since the hole inner-insulating film 89 and the conductive contact 90 are in in the memory hole MH, the filled body 86 that has a racetrack shape in a plan view, as described above, is replaced with a filled body 92 that has a racetrack shape in a plan view.

Figure 40:
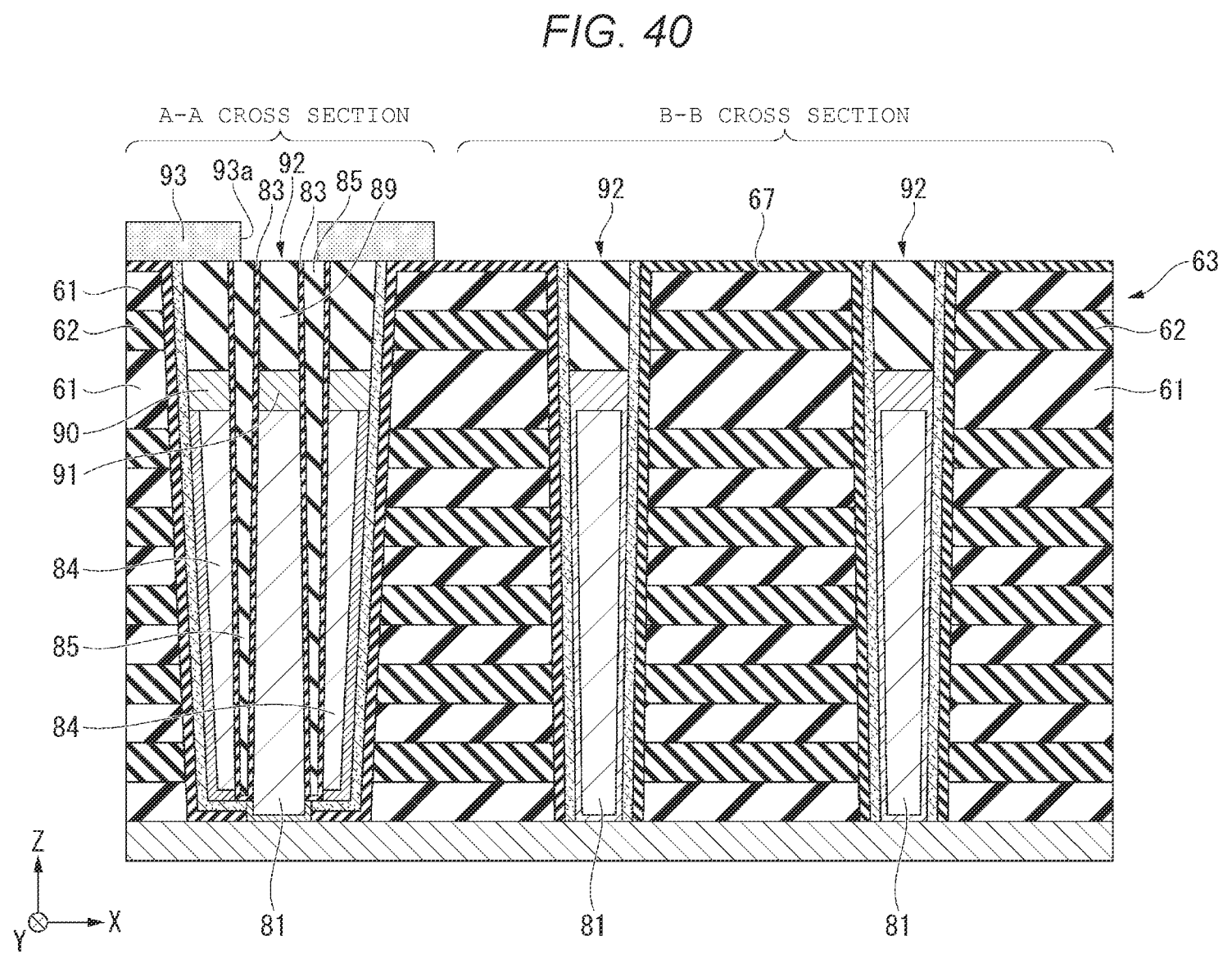
Figure 41:
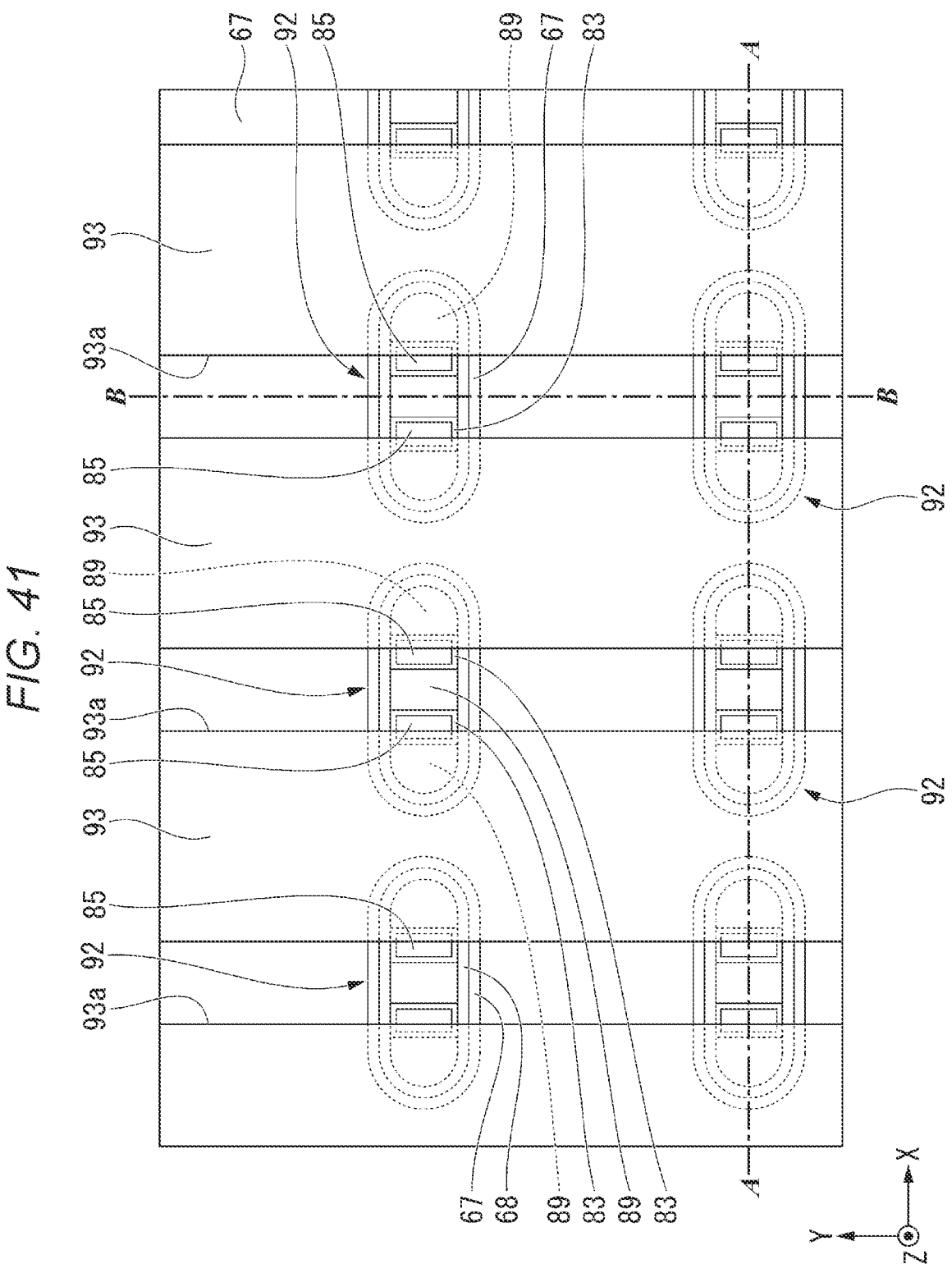
FIG. 41 is a plan view illustrating the manufacturing method of the cell array according to the first embodiment.

As illustrated in FIGS. 40 and 41, a processing fourth mask 93 is formed on the stacked body 63. In the fourth mask 93, a plurality of slit-shaped through-holes 93a including a middle portion of each filled body 92 in the X direction are formed in a plan view of the filled body 92 exposed to the surface of the stacked body 63. Each through-hole 93a is located in the Y direction to be intermittent in the X direction. A width of each through-hole 93a in the X direction is a width including the hole inner-insulating film 89, the liner film 83 on both sides of the hole inner-insulating film 89 in the X direction, and a part of the hole inner-insulating film 85. A width of each through-hole 93a is a width including about over half the width in the X direction with respect to the hole inner-insulating films 85 located on both sides of the hole inner-insulating film 89 in the X direction.

Subsequently, a portion of the through-hole 93a located on the −Z side in the memory hole MH is removed to a position reaching the conductive contact 90 by performing a method such as reactive ion etching. A process of re-filling the removed portion with a hole inner-insulating film 95 formed of a silicon oxide or the like is performed. A cross section after the re-filling process is illustrated in FIG. 42.

Figure 42:
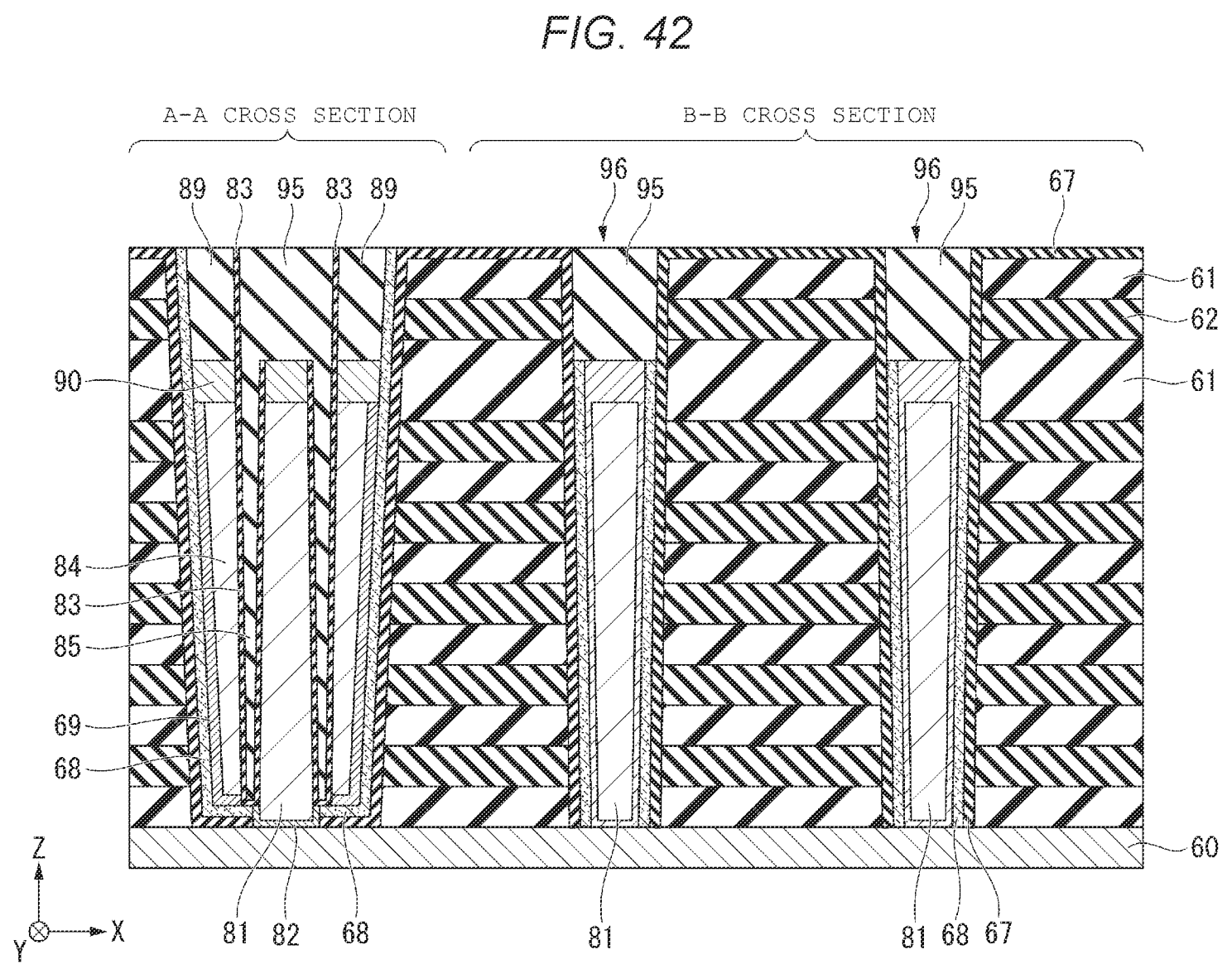

As illustrated in FIG. 42, the hole inner-insulating film 95 is formed in a region interposed between the right and left hole inner-insulating films 89 in the X direction. The liner films 83 formed in regions interposed between the right and left hole inner-insulating films 89 (see FIGS. 40 and 41) in the X direction and the hole inner-insulating film 89 formed between the liner films 83 are removed to form the hole inner-insulating film 95 instead.

Figure 43:
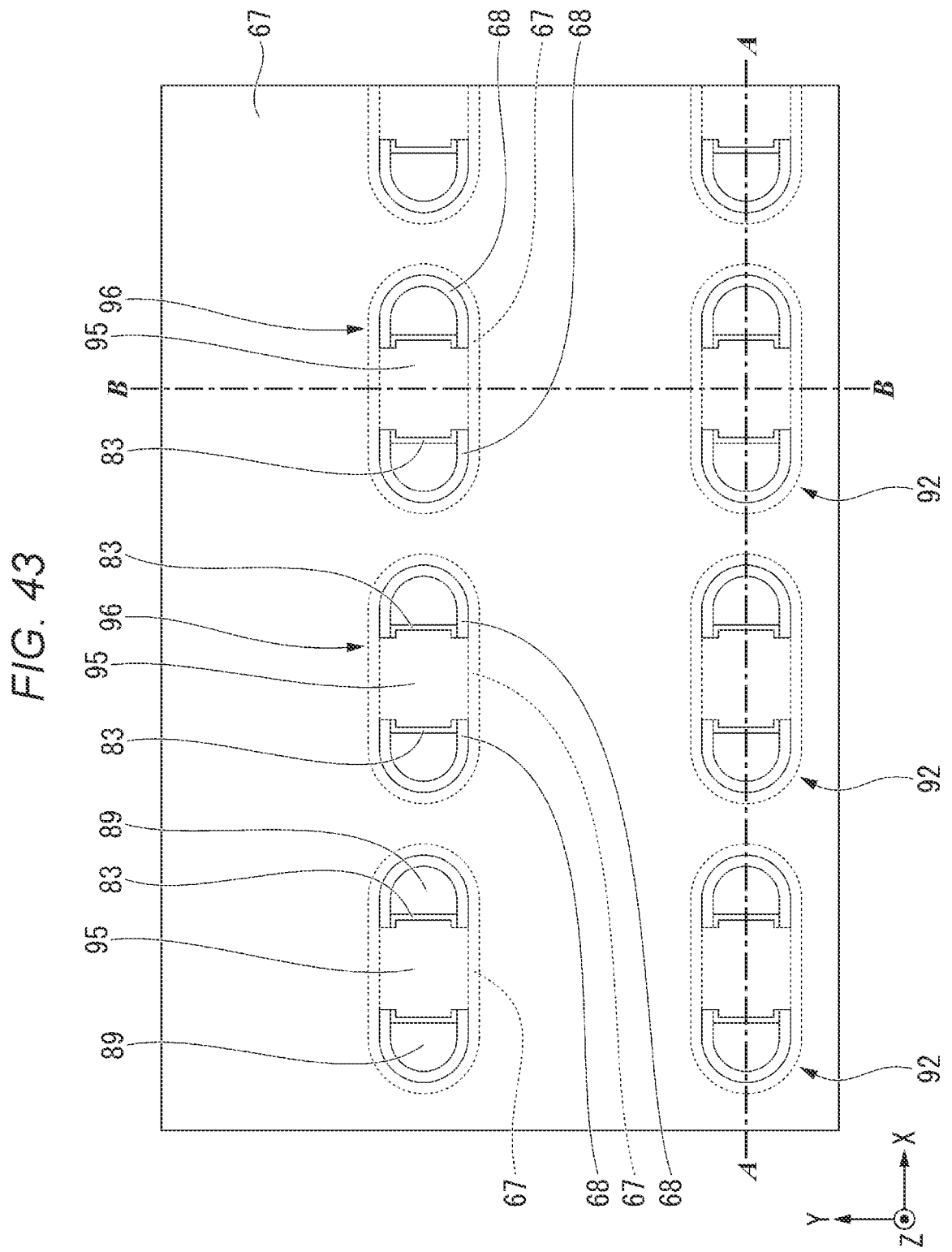
FIG. 43 is a plan view illustrating the manufacturing method of the cell array according to the first embodiment.

FIG. 43 illustrates a shape of the stacked body 63 in a plan view after the hole inner-insulating film 95 is formed. By replacing the hole inner-insulating film 89 in the memory hole MH with the hole inner-insulating film 95, the filled body 92 illustrated in the previous drawing is replaced with a filled body 96.

Figure 44:
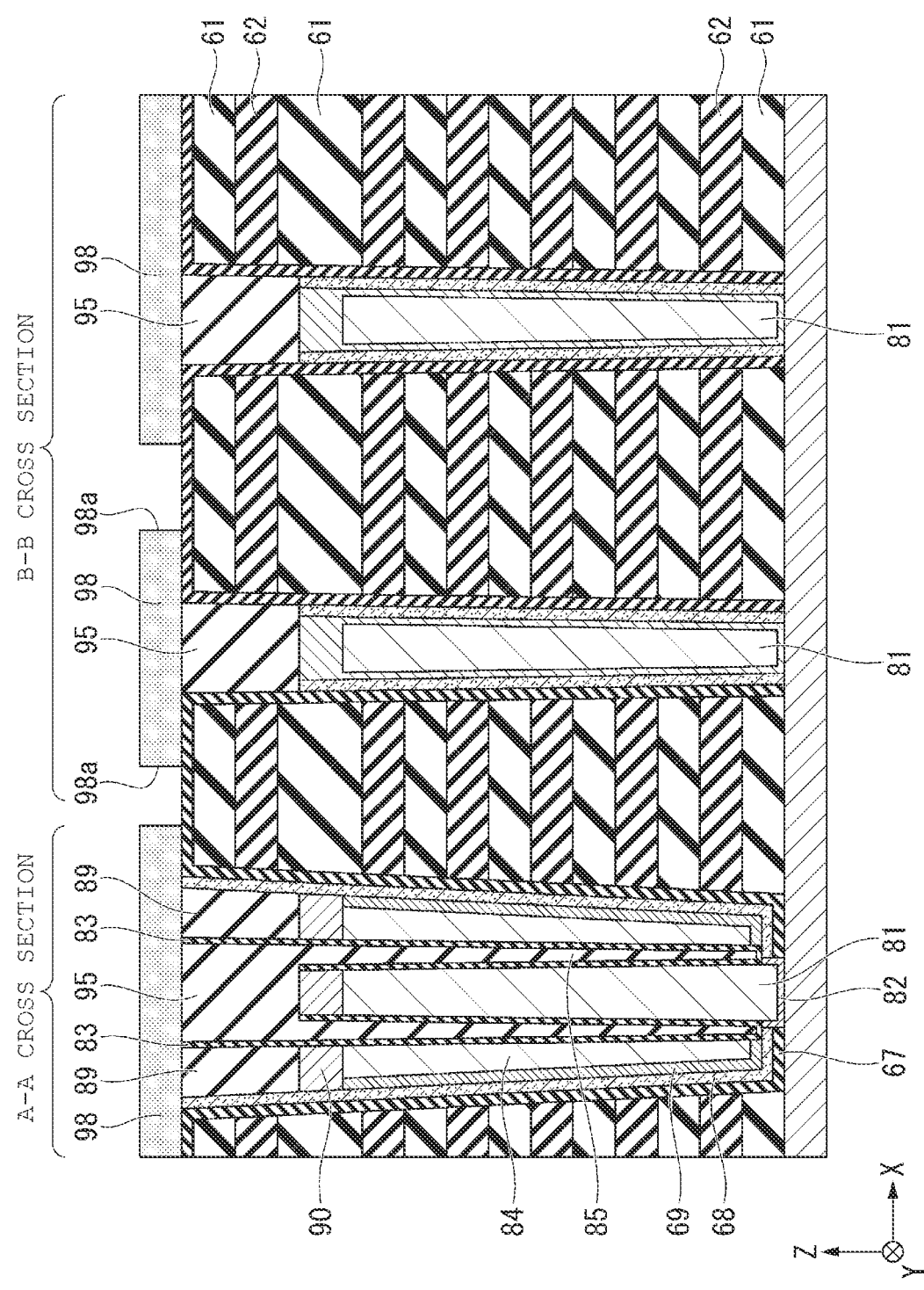
FIG. 44 is a cross-sectional view illustrating the A-A cross section region and the B-B cross section region in the manufacturing method of the cell array according to the first embodiment.
Figure 45:
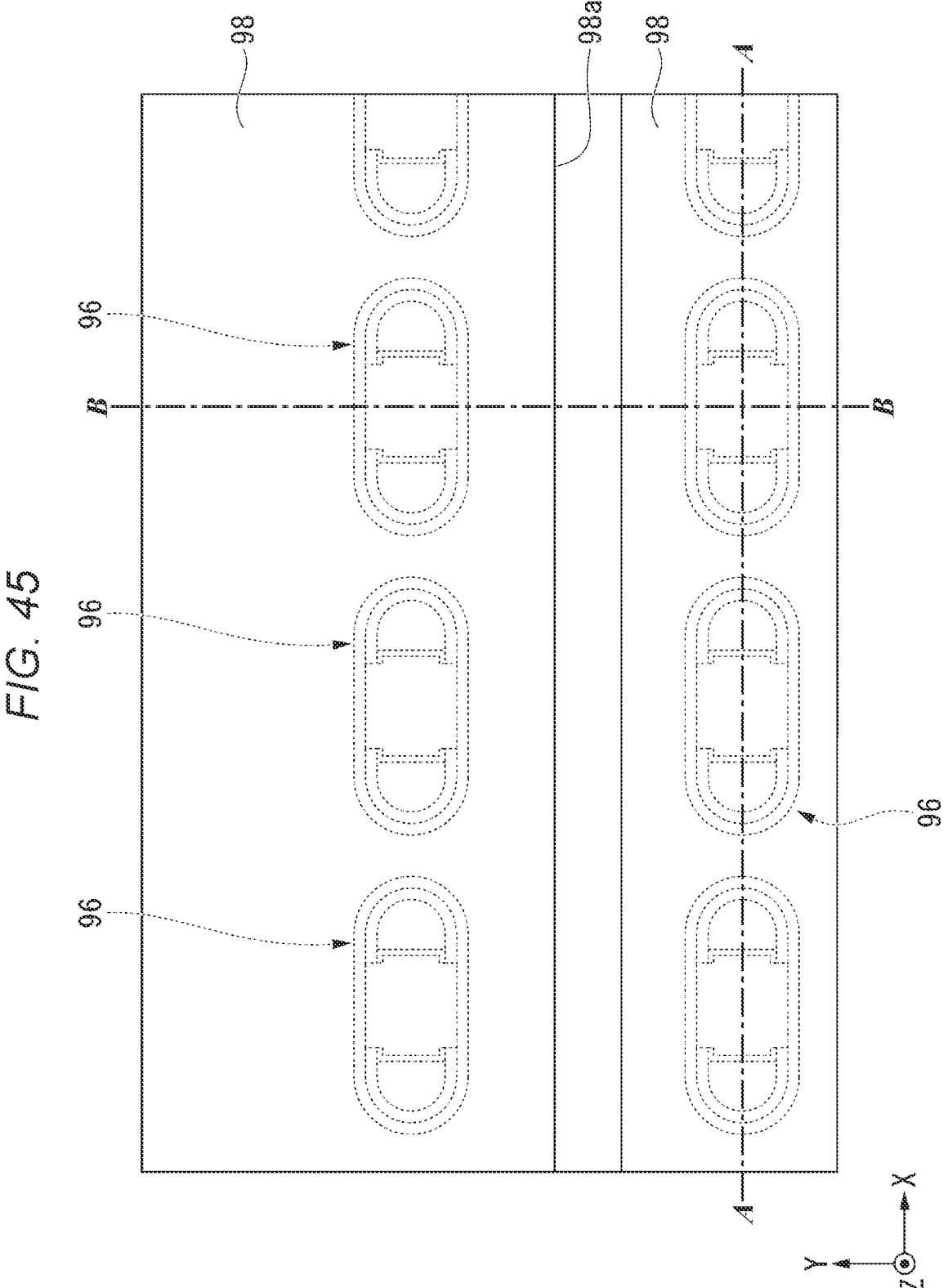
FIG. 45 is a plan view illustrating the manufacturing method of the cell array according to the first embodiment.

As illustrated in FIGS. 44 and 45, a separation film forming fifth mask 98 is formed on the stacked body 63. In the fifth mask 98, slit-shaped through-holes 98a are formed at between two rows of the filled bodies 96 in a plan view. The through-hole 98a extends in the X direction between the two rows of the filled bodies 96.

Figure 46:
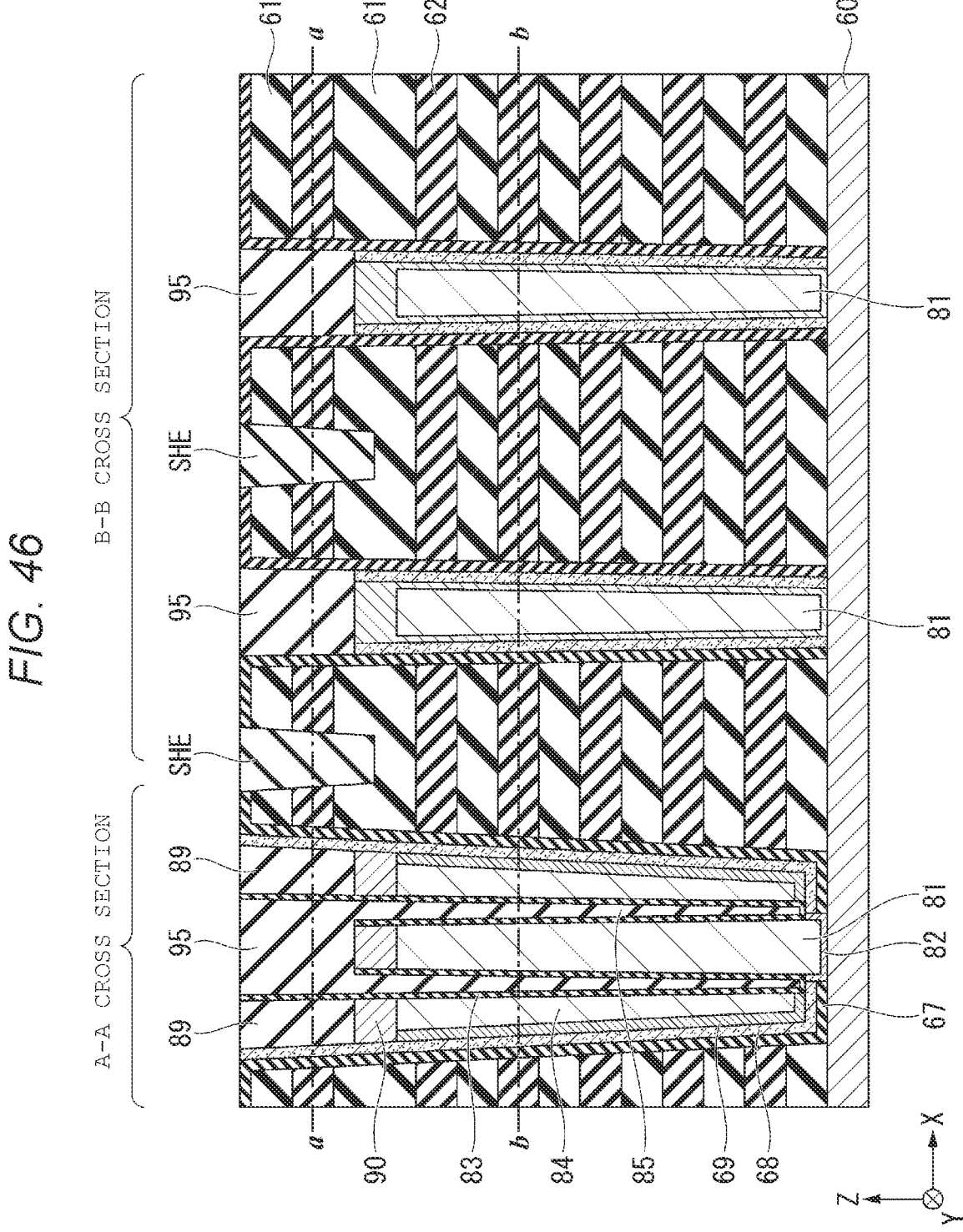
FIG. 46 is a cross-sectional view illustrating the A-A cross section region and the B-B cross section region in the manufacturing method of the cell array according to the first embodiment.
Figure 49:
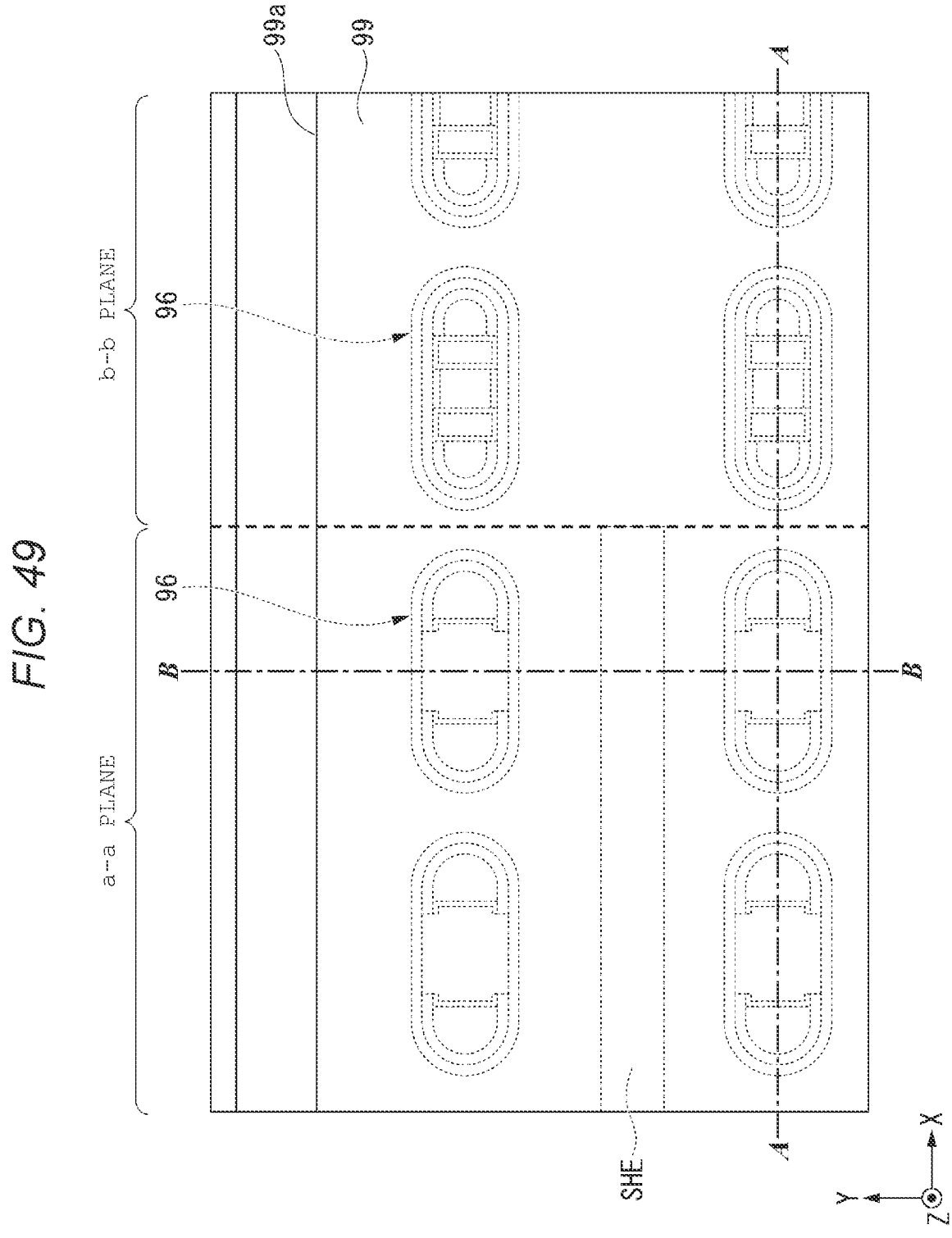
FIG. 49 is a plan view illustrating the manufacturing method of the cell array according to the first embodiment.

By forming a groove extending into the gate insulating film 67, the uppermost insulating film 61, the uppermost sacrificial film 62, and into the next insulating film 61 at through-hole 98a, then filling the groove with an insulating material, the separation films SHE illustrated in FIG. 46 are formed. The groove can be formed by a method such as reactive ion etching. The separation film SHE may be formed of an insulating material such as a silicon oxide.

Figure 47:
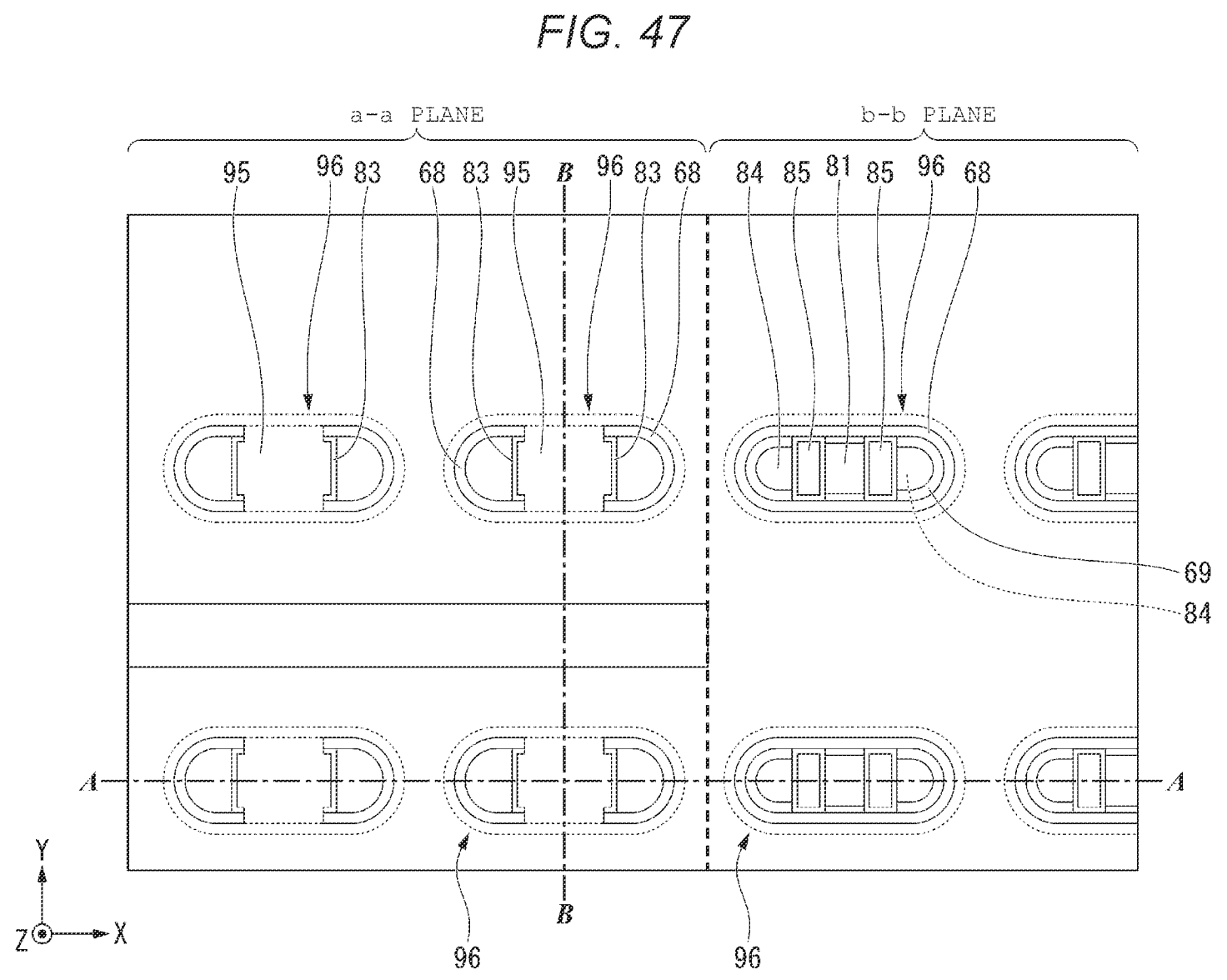

FIG. 47 illustrates a plane (a-a plane) taken along the line a-a of FIG. 46 and a plane (b-b plane) taken along the line b-b of FIG. 46.

Figure 48:
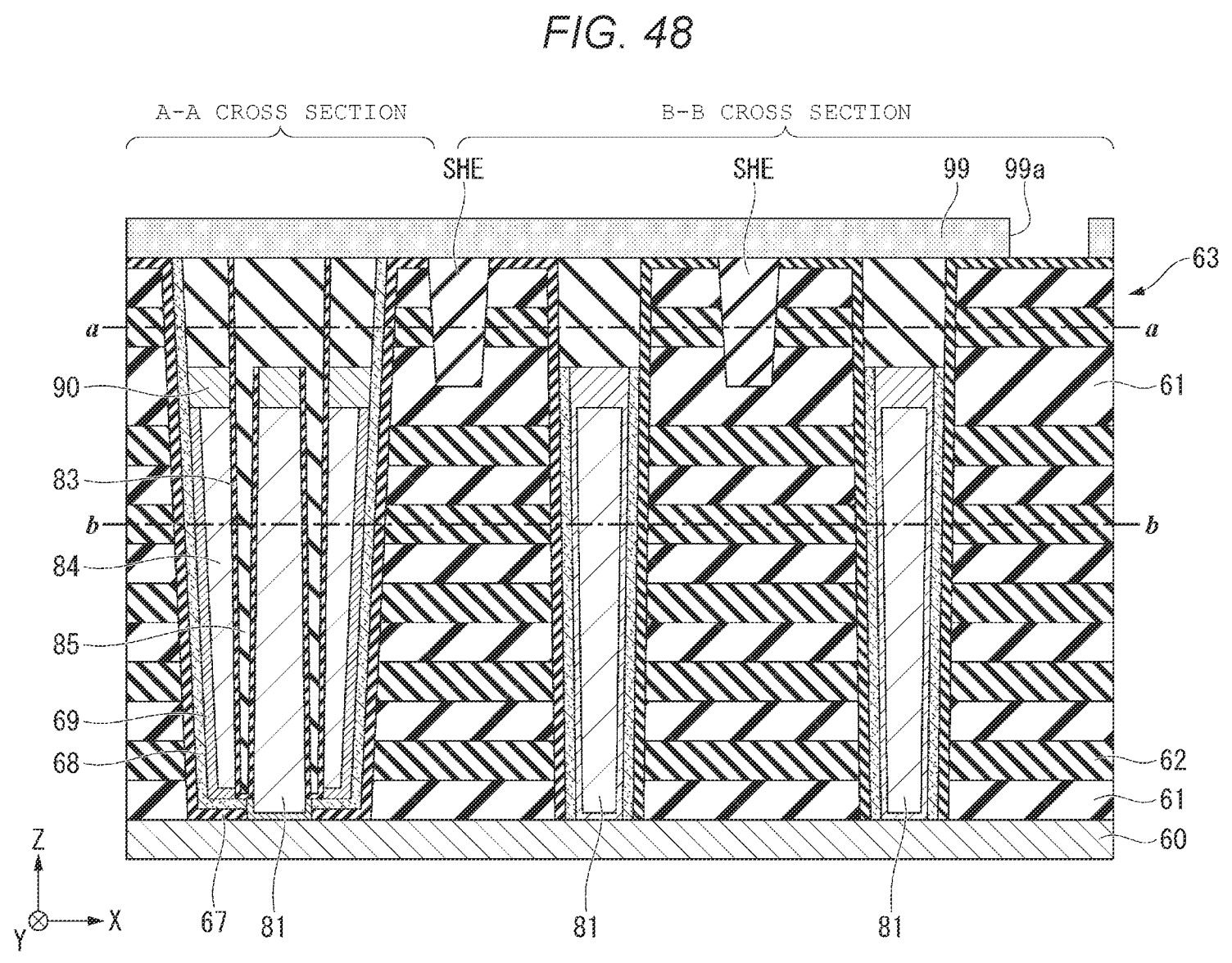

As illustrated in FIG. 48, a sixth mask 99 for a replacement slit is formed on the stacked body 63. In the sixth mask 99, slit-shaped through-holes 99a are formed in the X direction at positions on the +Y side of two rows of the filled body 96 in a plan view.

Figure 50:
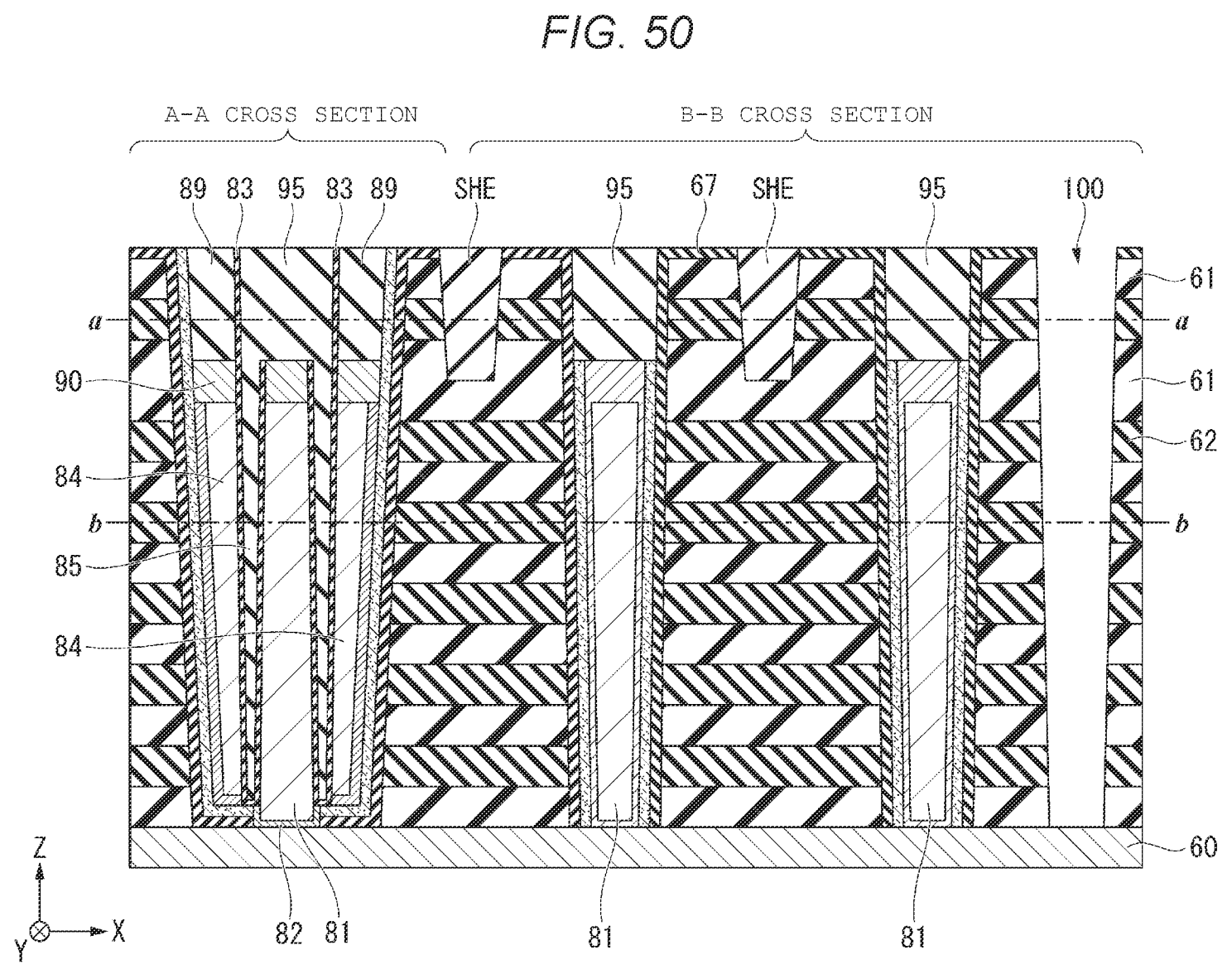

A replacement slit 100 illustrated in FIG. 50 is formed by reactive ion etching using the sixth mask 99. The replacement slit 100 penetrates the stacked body 63 from the gate insulating film 67 as the uppermost layer of the stacked body 63 and reaches the source line 60.

Figure 51:
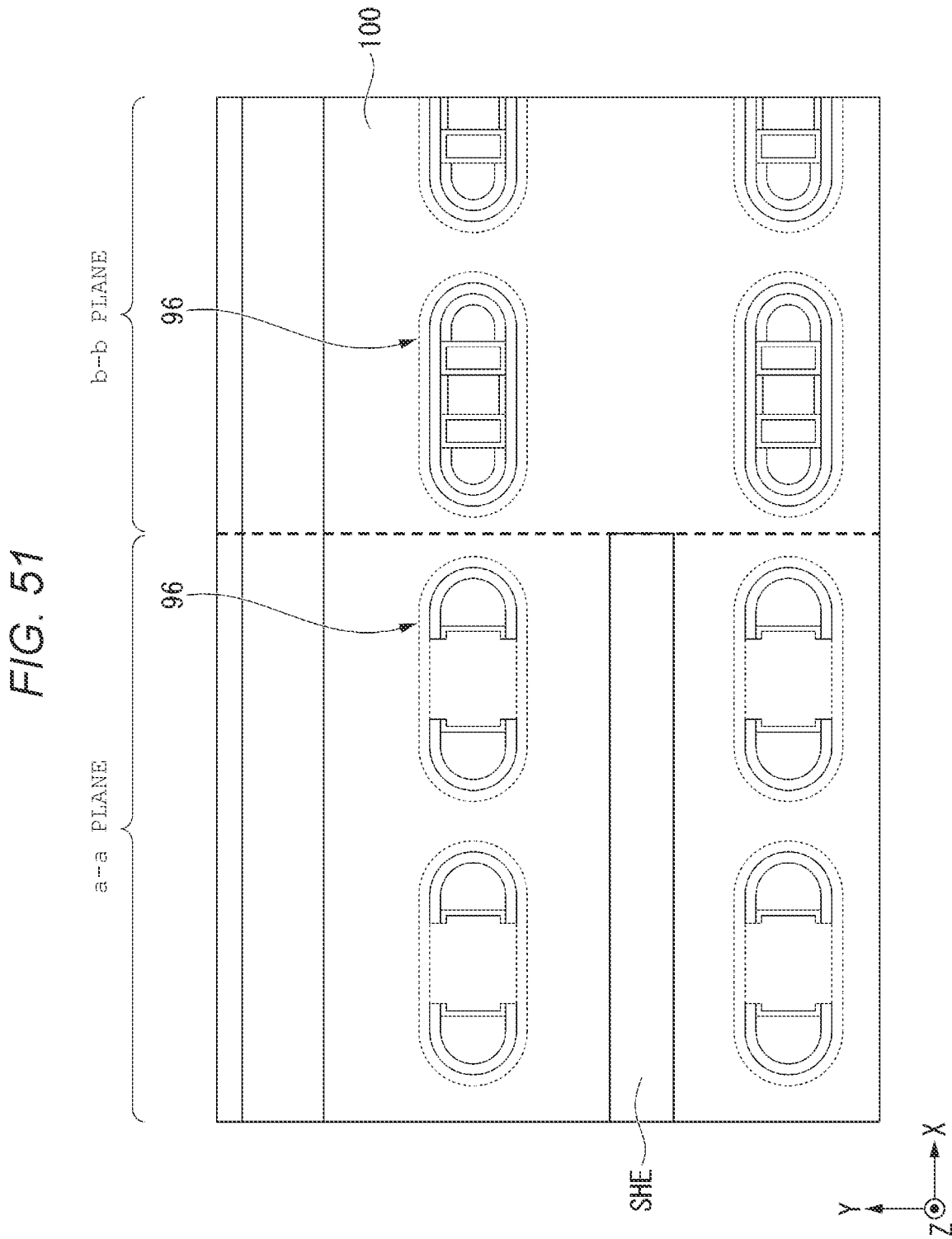
FIG. 51 is a plan view illustrating the manufacturing method of the cell array according to the first embodiment.

An a-a plane in a plan view of a cross section along the line a-a illustrated in FIG. 50 and a b-b plane in a plan view of a cross section along the line b-b illustrated in FIG. 50 are collectively illustrated in FIG. 51.

Figure 52:
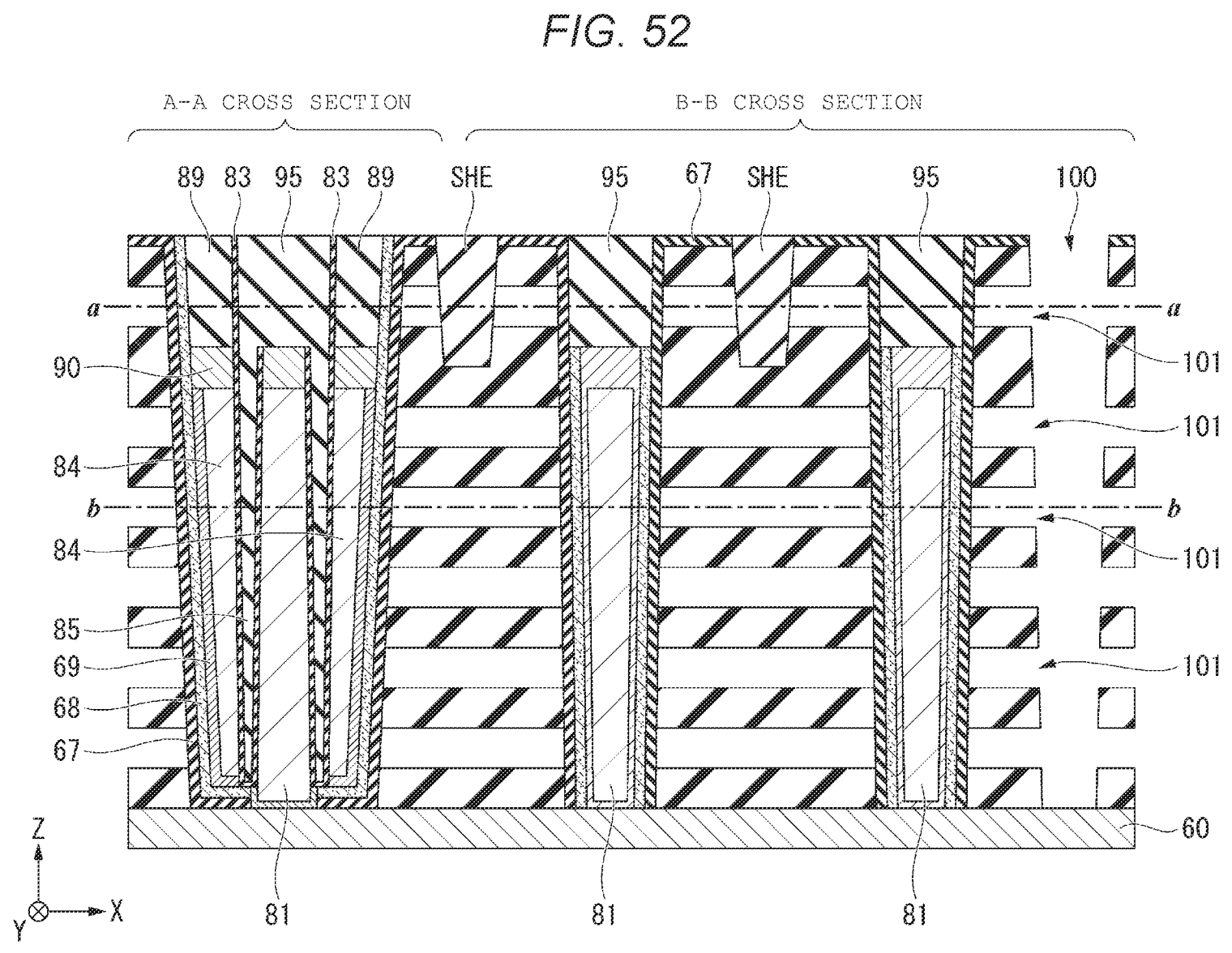

Eventually, all the sacrificial films 62 of the stacked body 63 are removed by etching via the replacement slit 100 to form cavities 101 as illustrated in FIG. 52.

Figure 53:
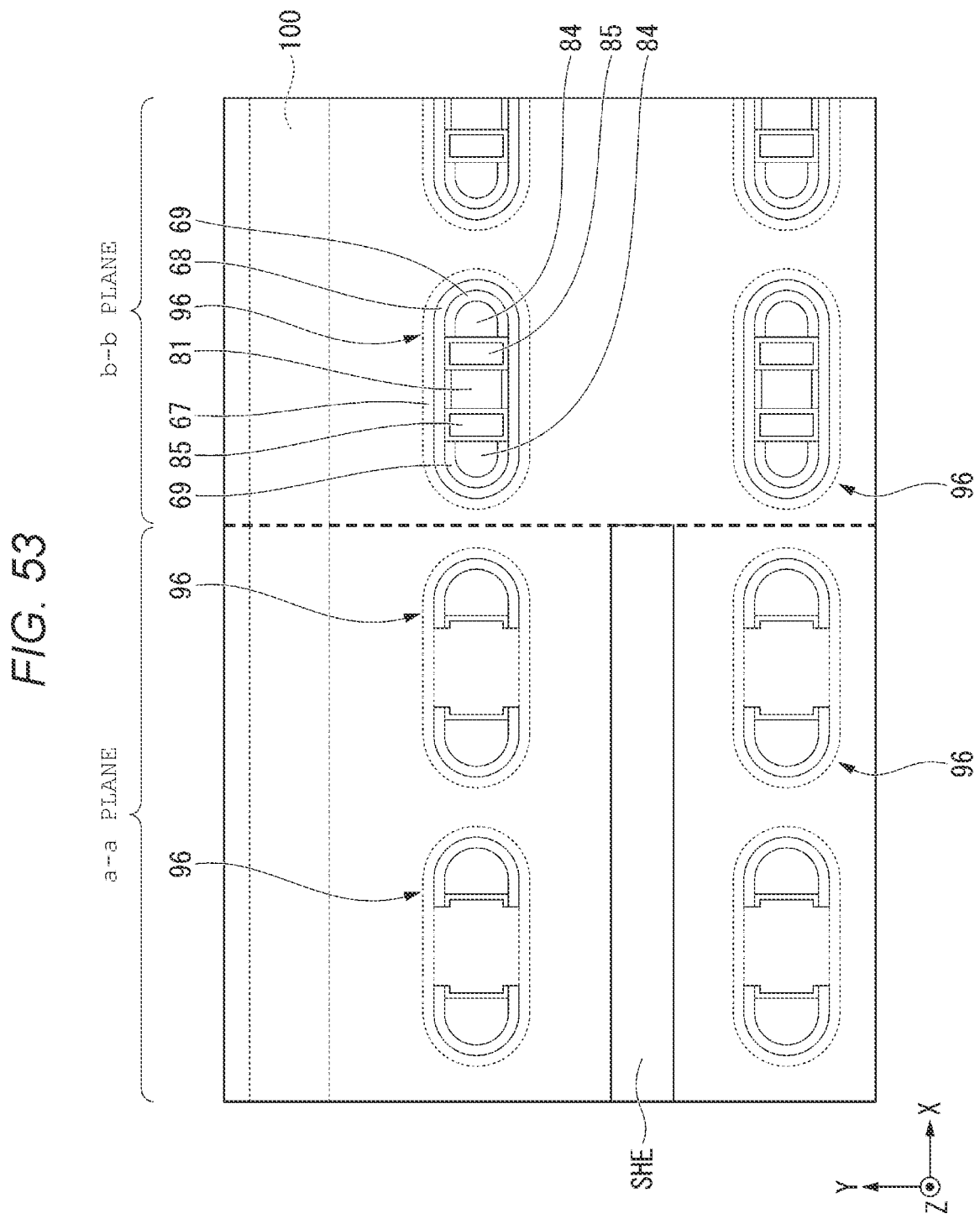
FIG. 53 is a plan view illustrating the manufacturing method of the cell array according to the first embodiment.

An a-a plane in a plan view of a cross section along the line a-a illustrated in FIG. 52 and a b-b plane in a plan view along the line b-b illustrated in FIG. 52 are collectively illustrated in FIG. 53.

Figure 54:
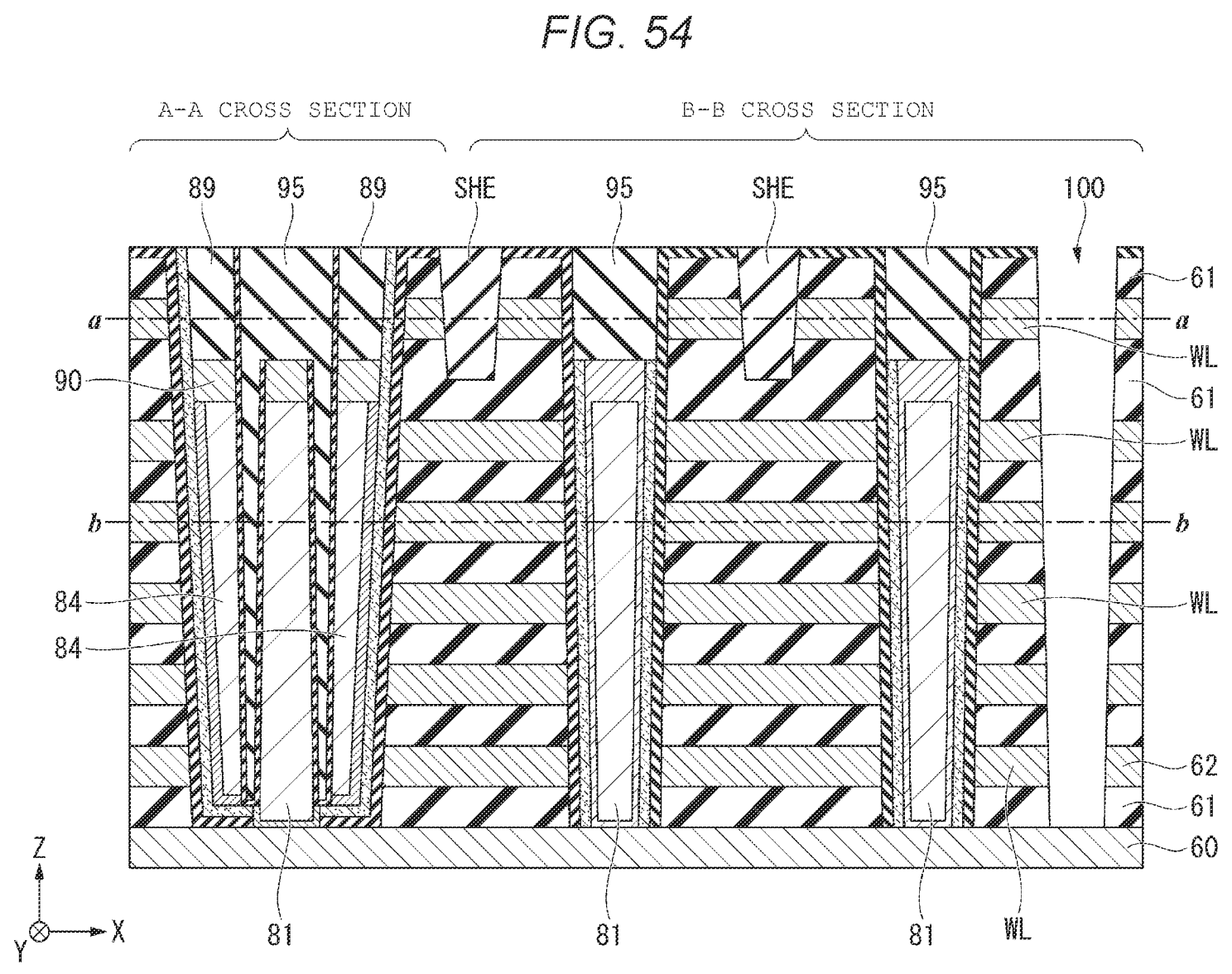

The cavities 101 illustrated in FIG. 52 are subsequently filled with, for example, an electrode material by a chemical vapor deposition (CVD) method to form plate-shaped word lines WL as illustrated in FIG. 54.

Figure 55:
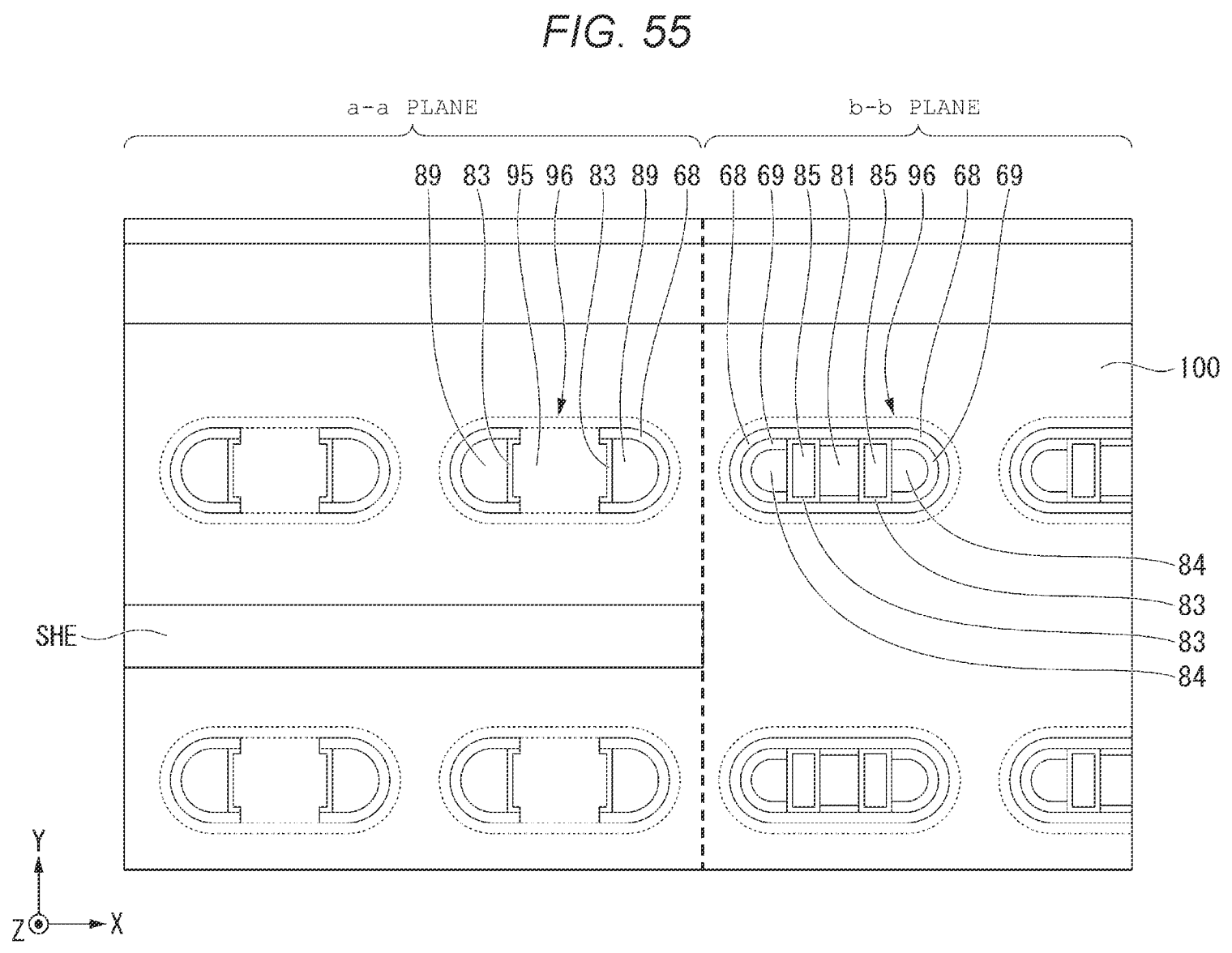

An a-a plane in a plan view of a cross section along the line a-a illustrated in FIG. 54 and a b-b plane in a plan view of a cross section along the line b-b illustrated in FIG. 54 are collectively illustrated in FIG. 55.

Figure 56:
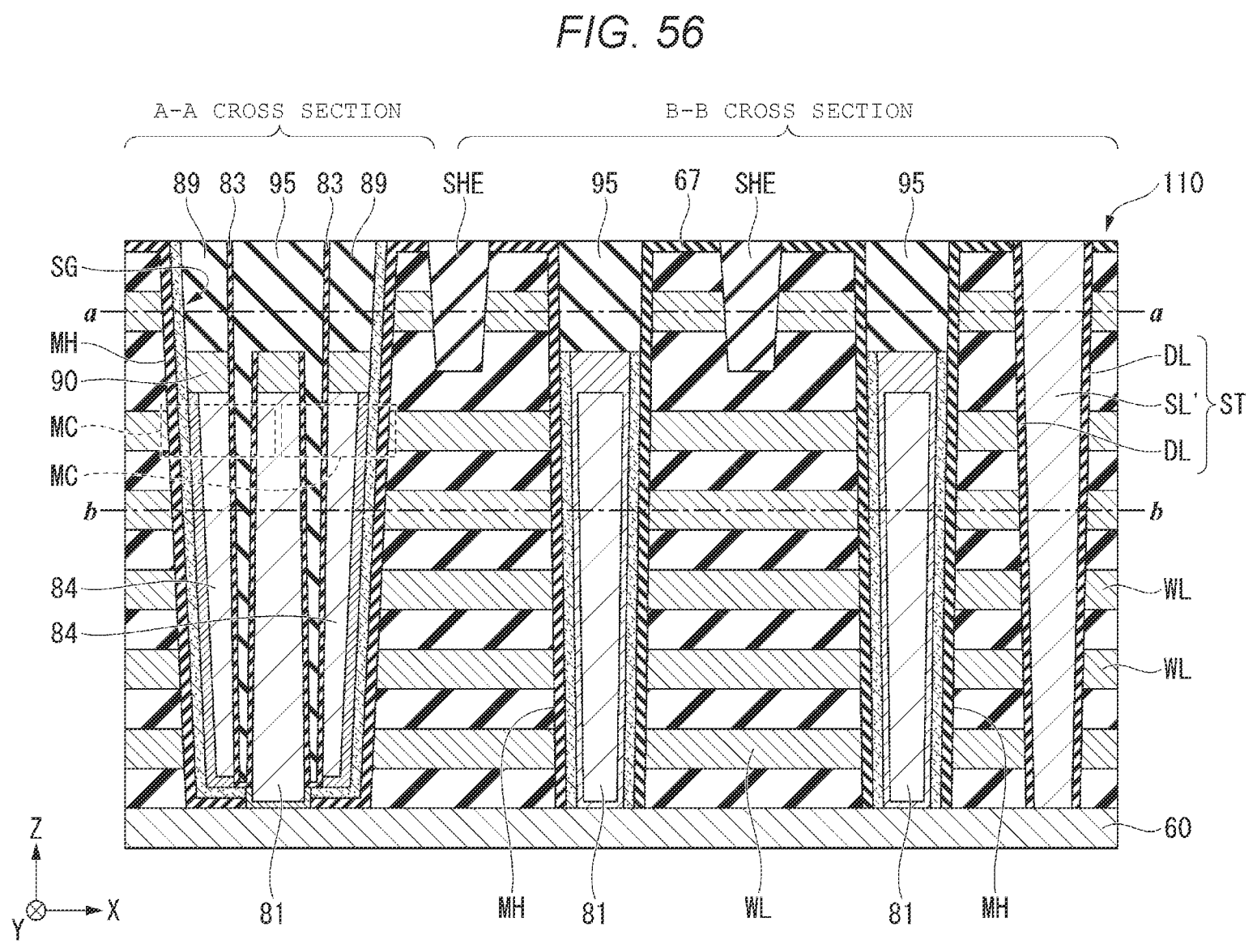

As illustrated in FIG. 56, after insulating portions DL of a silicon oxide are formed to cover the inner surface (side-walls) of the replacement slit 100 the still remaining unfilled inside of the replacement slit 100 is then filled with an electrode material formed of a metal such as tungsten to form an electrode portion SL' as illustrated in FIG. 56.

An a-a plane in a plan view of a cross section along the line a-a illustrated in FIG. 56 and a b-b plane in a plan view of a cross section along the line b-b illustrated in FIG. 56 are collectively illustrated in FIG. 55.

According to the above-described manufacturing method, a nonvolatile semiconductor storage device 110 with the same structure as the nonvolatile semiconductor storage device of the first embodiment as described above with reference to FIGS. 2 to 9 can be manufactured.

The nonvolatile semiconductor storage device 110 includes, in each memory hole MH, the gate insulating film 67 formed along the inner circumferential surface of the memory hole MH and the semiconductor film 68 extending in the extension direction of the memory hole MH in a state in which the outer circumference is partially surrounded by the gate insulating film 67.

The nonvolatile semiconductor storage device 110 includes the resistance change film 69 extending in the extension direction of the memory hole MH in a state in which the outer circumference is partially surrounded by the semiconductor film 68. The nonvolatile semiconductor storage device 110 also includes the local bit line 84 extending in the extension direction of the memory hole MH in a state in which the outer circumference is surrounded by the resistance change film 69. Inside the memory hole MH, a cell block CB in which the local source line 81, the resistance change film 69, and the local bit line 84 is formed.

The nonvolatile semiconductor storage device 110 has a configuration similar to that of the nonvolatile semiconductor storage device 1 according to the first embodiment, and thus it is possible to obtain the operational effects similar to those of the nonvolatile semiconductor storage device 1 according to the first embodiment.

Manufacturing Method According to Second Embodiment

In the manufacturing method according to the first embodiment, after the contact hole 87 is formed as illustrated in FIG. 33, the conductive material layer 88 is formed as illustrated in FIG. 35. In the second embodiment, the inside of the contact hole 87 is not entirely filled with the conductive material layer 88. A conductive material film may be formed as a conformal layer so as to be in contact only a bottom and an inner circumferential wall of the contact hole 87 and the conductive material does fill in the middle portion (interior) of the contact hole 87.

When a conductive material layer 88 is formed as conformal film only at the bottom and the inner circumferential wall of the contact hole 87, it is possible to manufacture the nonvolatile semiconductor storage device including the conductive contact CDC2 according to the second embodiment, as illustrated in FIG. 10.

The base portion 50 of the conductive contact CDC2 can be formed from a conductive material film that is in contact with the bottom of the contact hole 87. The extension portion 51 of the conductive contact CDC2 can be formed from a conductive material film that is in contact with the inner surface of the contact hole 87.

By performing the other processes, as described above, it is possible to manufacture the nonvolatile semiconductor storage device according to the second embodiment (FIG. 10).

Manufacturing Method According to Third Embodiment

In the manufacturing method according to the first embodiment, after the contact hole 87 is formed in the stacked body 63, as illustrated in FIG. 33, the conductive material layer 88 is formed, as illustrated in FIG. 35.

However, in the third embodiment, the bottom of the contact hole 87 is formed to extend down to a position of the insulating film 61 located one the sacrificial film 62 at the uppermost layer of the stacked body 63 in the memory hole MH.

After the conductive material layer is formed, the inside of the contact hole 87 is not entirely filled with the conductive material layer 88, rather a conductive material film is formed only the bottom and the inner circumferential wall of the contact hole 87. The conductive material is not formed in the middle portion (interior) of the contact hole 87. When the conductive material layer is formed on the inner circumferential wall of the contact hole 87, the conductive material film is formed up only to a position reaching a level inside of the sacrificial film 62 at the uppermost layer of the stacked body 63.

When the conductive material film is formed only at the bottom and the inner circumferential wall of the contact hole 87 in this manner, it is possible to manufacture the nonvolatile semiconductor storage device including the conductive contact CDC3 according to the third embodiment, as illustrated in FIG. 11.

The base portion 50 of the conductive contact CDC3 can be formed from a conductive material film that is in contact with the bottom of the contact hole 87. The extension portion 51 of the conductive contact CDC3 can be formed from a conductive material film that is in contact with the inner surface of the contact hole 87.

By performing the other processes, as described above, it is possible to manufacture the nonvolatile semiconductor storage device according to the third embodiment, as illustrated in FIG. 11.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A nonvolatile semiconductor storage device, comprising:
   a plurality of bit lines, each extending in a first direction and spaced from each other in a second direction intersecting the first direction;
   a stacked body including a plurality of word line layers stacked one on the other in a third direction intersecting the first and second directions; and
   a plurality of cell blocks arrayed in the first and second directions within the stacked body as columnar structures extending in the third direction, each cell block being in a columnar structure with another cell block adjacent in the second direction and having one end connected to a bit line, the adjacent cell block in the columnar structure having one end connected to another bit line, wherein
   each cell block includes:
      a plurality of memory cells connected in parallel between a local source line and a local bit line in the columnar structure, and
      a select transistor connected between the local bit line and the respective bit line of the cell block,
   each memory cell includes:
      a cell transistor with a gate connected to a respective word line layer within the stacked body, and
      a resistance change element that is connected in series with the cell transistor between the local source line and the local bit line, and
   the select transistor and the local bit line are connected to one another via a conductive contact formed of a material different than the local bit line.

2. The nonvolatile semiconductor storage device according to claim 1, wherein the conductive contact comprises a metal nitride.

3. The nonvolatile semiconductor storage device according to claim 1, wherein the conductive contact comprises a metal.

4. The nonvolatile semiconductor storage device according to claim 3, wherein the conductive contact is a film having a first portion directly contacting an end of the local bit line and a second portion on an outer perimeter of the first portion and extending in the third direction from the first portion to the select transistor.

5. The nonvolatile semiconductor storage device according to claim 4, wherein the second portion has a U-shape in a cross-section orthogonal to the third direction.

6. The nonvolatile semiconductor storage device according to claim 4, wherein the first portion entirely covers the end of the local bit line.

7. The nonvolatile semiconductor storage device according to claim 1, wherein the conductive contact directly contacts an end of the local bit line and a part of a channel region directly under a gate electrode of the select transistor.

8. The nonvolatile semiconductor storage device according to claim 1, wherein the conductive contact has a first portion directly contacting an end of the local bit line and a second portion on an outer perimeter of the first portion and extending in the third direction from the first portion to the select transistor.

9. The nonvolatile semiconductor storage device according to claim 8, wherein the second portion has a U-shape in a cross-section orthogonal to the third direction.

10. The nonvolatile semiconductor storage device according to claim 1, wherein each resistance change element includes:

a resistance change film extending in the third direction on an outer periphery of the local bit line of the respective cell block of the resistance change element.

11. The nonvolatile semiconductor storage device according to claim 1, wherein each columnar structure is an elongated oval shape with one of the respective cell blocks of the columnar structure being at one end of the elongated oval shape and the other of the respective cell blocks being at the other end of the elongated oval shape spaced from the other cell block in a direction orthogonal to the third direction.

12. The nonvolatile semiconductor storage device according to claim 11, wherein the local source line is in a middle region of the elongated oval shape between the two ends of the elongated oval shape.

13. The nonvolatile semiconductor storage device according to claim 12, wherein the local bit lines of the columnar structure and the local source line are separated from one another by an insulating film including a liner layer.

14. The nonvolatile semiconductor storage device according to claim 1, wherein one end of the resistance change element is connected to the local bit line and the other end of the resistance change element is connected to the cell transistor.

* * * * *